United States Patent
Hong et al.

(10) Patent No.: US 12,085,499 B2
(45) Date of Patent: Sep. 10, 2024

(54) FLOW CELLS

(71) Applicant: ILLUMINA, INC., San Diego, CA (US)

(72) Inventors: Sahngki Hong, San Diego, CA (US); M. Shane Bowen, Encinitas, CA (US); Lewis J. Kraft, San Diego, CA (US); Sharis Minassian, San Marcos, CA (US)

(73) Assignee: Illumina, Inc., San Diego, CA (US)

( * ) Notice: Subject to any disclaimer, the term of this patent is extended or adjusted under 35 U.S.C. 154(b) by 781 days.

(21) Appl. No.: 17/126,548

(22) Filed: Dec. 18, 2020

(65) Prior Publication Data

US 2021/0190675 A1 Jun. 24, 2021

Related U.S. Application Data

(60) Provisional application No. 62/951,780, filed on Dec. 20, 2019.

(51) Int. Cl.
| | |
|---|---|
| *G01N 21/05* | (2006.01) |
| *G03F 7/00* | (2006.01) |
| *G03F 7/09* | (2006.01) |
| *H01L 21/02* | (2006.01) |
| *H01L 21/311* | (2006.01) |
| *H01L 31/08* | (2006.01) |

(52) U.S. Cl.
CPC ............ *G01N 21/05* (2013.01); *G03F 7/0002* (2013.01); *G03F 7/094* (2013.01); *H01L 21/02505* (2013.01); *H01L 21/31116* (2013.01); *H01L 31/08* (2013.01); *G01N 2021/056* (2013.01)

(58) Field of Classification Search
CPC .................. G01N 21/05; G01N 2021/056
See application file for complete search history.

(56) References Cited

U.S. PATENT DOCUMENTS

| | | | | |
|---|---|---|---|---|
| 5,688,642 | A | * 11/1997 | Chrisey | ............. B82Y 5/00 435/5 |
| 6,133,436 | A | 10/2000 | Koster et al. | |
| 6,858,394 | B1 | 2/2005 | Chee et al. | |
| RE41,005 | E | 11/2009 | Koster et al. | |
| 7,790,350 | B2 | 9/2010 | Breyta et al. | |

(Continued)

FOREIGN PATENT DOCUMENTS

| | | | | |
|---|---|---|---|---|
| CA | 3031303 A1 | * 2/2018 | ............. C12Q 1/68 |
| KR | 2007113557 A | * 11/2007 | |

(Continued)

OTHER PUBLICATIONS

Cummins, C., et al., "Self-Assembled Nanofeatures in Complex Three-Dimensional Topographies via Nanoimprint and Block Copolymer Lithography Methods", ACS Omega, 2, Aug. 10, 2017, pp. 4417-4423.

*Primary Examiner* — Martin J Angebrannadt
(74) *Attorney, Agent, or Firm* — Dierker & Kavanaugh, P.C.

(57) ABSTRACT

One example of a flow cell includes a base support and a multi-layer stack positioned over the base support. The multi-layer stack includes a resin layer positioned over the base support; and a hydrophobic layer positioned over the resin layer. A depression is defined in the multi-layer stack through the hydrophobic material and through a portion of the resin.

36 Claims, 14 Drawing Sheets

Specification includes a Sequence Listing.

(56) References Cited

U.S. PATENT DOCUMENTS

| | | | |
|---|---|---|---|
| 7,842,649 | B2 | 11/2010 | Seul et al. |
| 8,993,088 | B2 | 3/2015 | Millward et al. |
| 9,586,346 | B2 | 3/2017 | Nicolau et al. |
| 9,982,294 | B2 | 5/2018 | Fabani et al. |
| 10,329,610 | B2 | 6/2019 | Nashtaali et al. |
| 10,338,056 | B2 | 7/2019 | Hyde et al. |
| 11,680,292 | B2 * | 6/2023 | Fisher .................. G03F 7/165 536/24.3 |
| 2005/0046943 | A1 * | 3/2005 | Suganuma ........... G02B 5/3058 359/487.03 |
| 2006/0057707 | A1 * | 3/2006 | Cunningham ....... G02B 5/1852 435/287.1 |
| 2006/0261518 | A1 * | 11/2006 | Willson ............ H01L 21/76817 264/293 |
| 2007/0003967 | A1 * | 1/2007 | Shim ............... H01L 21/823828 436/180 |
| 2008/0166871 | A1 * | 7/2008 | Allen ................ H01L 21/02216 522/111 |
| 2010/0101956 | A1 | 4/2010 | Choi et al. |
| 2012/0015358 | A1 | 1/2012 | Scarr et al. |
| 2012/0202017 | A1 | 8/2012 | Nealey et al. |
| 2012/0316086 | A1 | 12/2012 | Lin et al. |
| 2013/0116153 | A1 | 5/2013 | Bowen et al. |
| 2015/0111256 | A1 | 4/2015 | Church et al. |
| 2015/0155179 | A1 * | 6/2015 | Jans .................. H01L 21/32051 257/618 |
| 2015/0240300 | A1 | 8/2015 | Ansari et al. |
| 2016/0139012 | A1 | 5/2016 | D'Silva et al. |
| 2017/0051340 | A1 | 2/2017 | Gunderson et al. |
| 2017/0342406 | A1 | 11/2017 | Rigatti et al. |
| 2018/0030529 | A1 | 2/2018 | Nashtaali et al. |
| 2018/0179575 | A1 * | 6/2018 | George ................. C09D 133/26 |
| 2018/0274026 | A1 | 9/2018 | Brown et al. |
| 2018/0371535 | A1 | 12/2018 | Bowen et al. |
| 2020/0308640 | A1 | 10/2020 | Almogy et al. |
| 2022/0097048 | A1 * | 3/2022 | Kodira Cariappa .. G03F 7/2004 |
| 2022/0100091 | A1 * | 3/2022 | Hong ........................ G03F 7/38 |
| 2022/0187710 | A1 * | 6/2022 | Brahma ................ G03F 7/2022 |
| 2022/0379305 | A1 * | 12/2022 | Kodira Cariappa .... G03F 7/039 |
| 2022/0382147 | A1 * | 12/2022 | Kodira Cariappa .. G03F 7/0382 |
| 2023/0137978 | A1 * | 5/2023 | Fisher .................... G03F 7/039 430/323 |
| 2023/0139821 | A1 * | 5/2023 | Fisher .................... G03F 7/038 430/323 |

FOREIGN PATENT DOCUMENTS

| | | | |
|---|---|---|---|
| KR | 101716851 B1 | | 3/2017 |
| RU | 2539038 C1 | | 1/2015 |
| WO | WO0033084 | * | 6/2000 |
| WO | 2012/170936 A2 | | 12/2012 |
| WO | 2013063382 A2 | | 5/2013 |
| WO | 2014/108810 A2 | | 7/2014 |
| WO | 2014/133905 A1 | | 9/2014 |
| WO | 2015002813 A1 | | 1/2015 |
| WO | 2015/031849 | | 3/2015 |
| WO | 2016/075204 A1 | | 5/2016 |
| WO | 2017015018 A1 | | 1/2017 |
| WO | WO 2017/007753 | | 1/2017 |
| WO | 2017/201198 A1 | | 11/2017 |
| WO | WO 2018/119101 | | 6/2018 |
| WO | WO-2020005503 A1 * | 1/2020 | ............ C08F 212/10 |

* cited by examiner

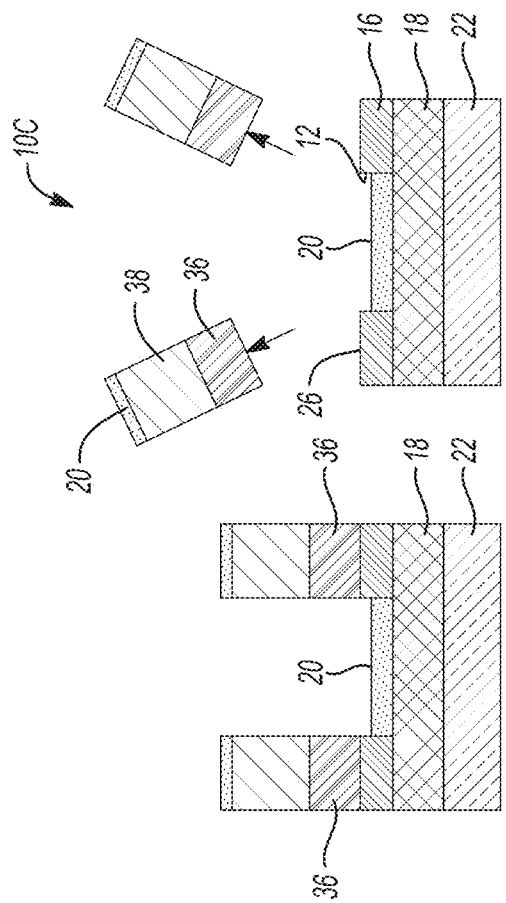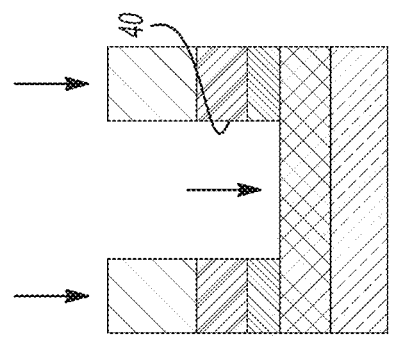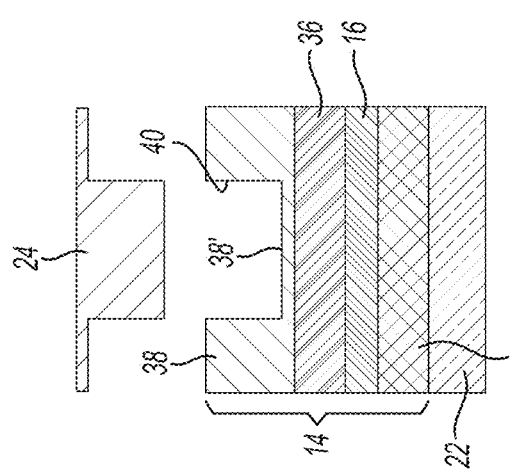

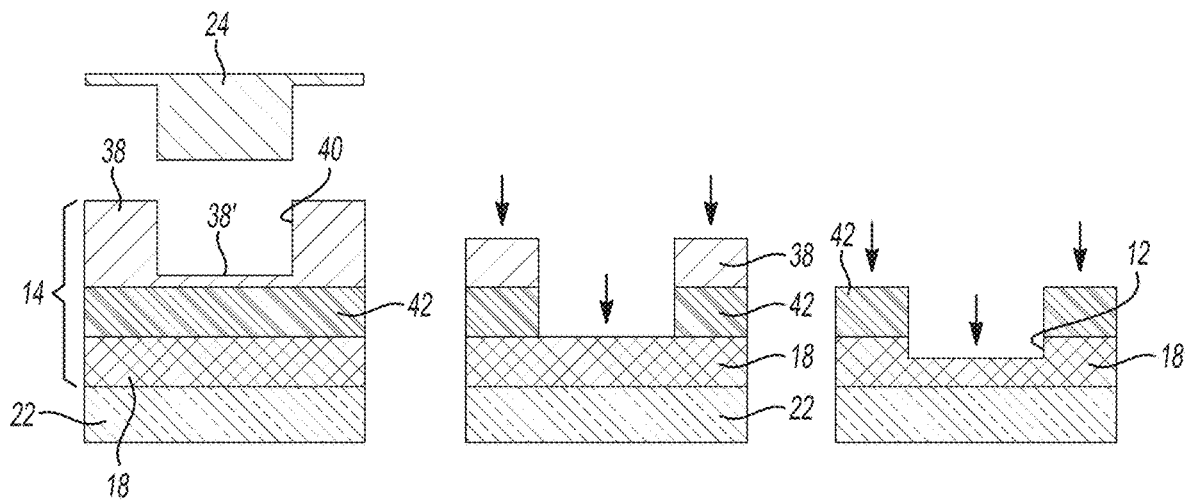
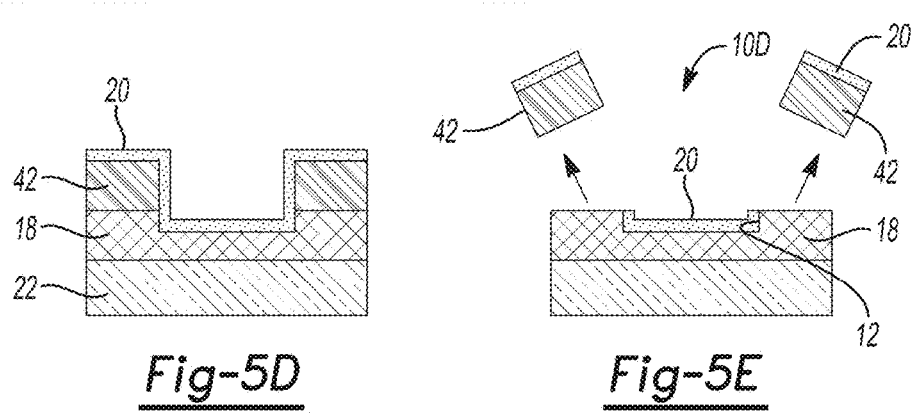
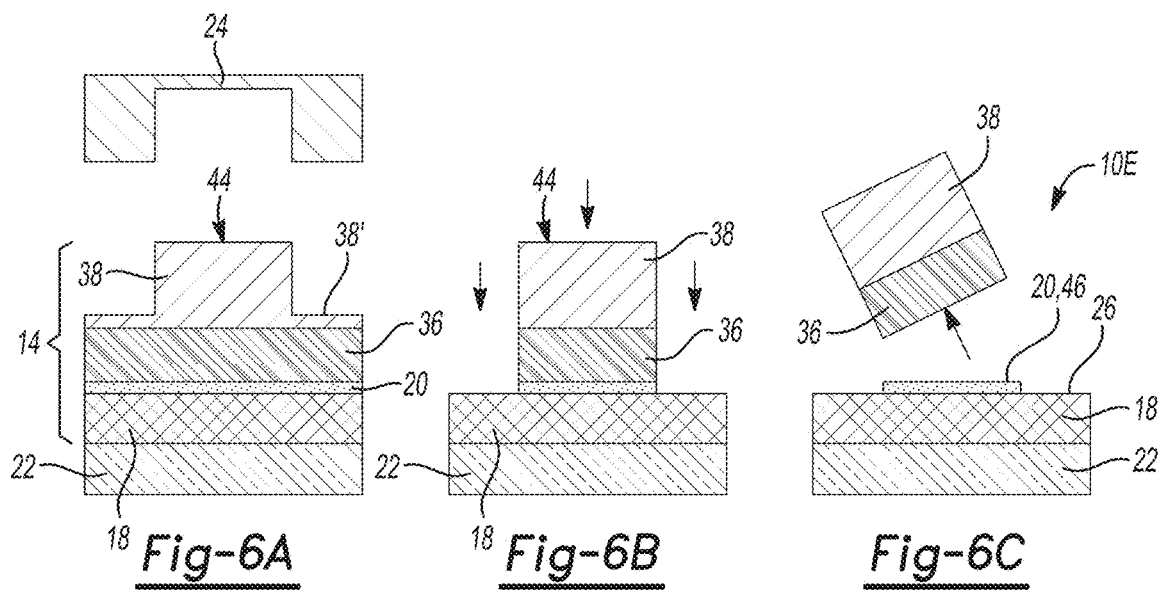

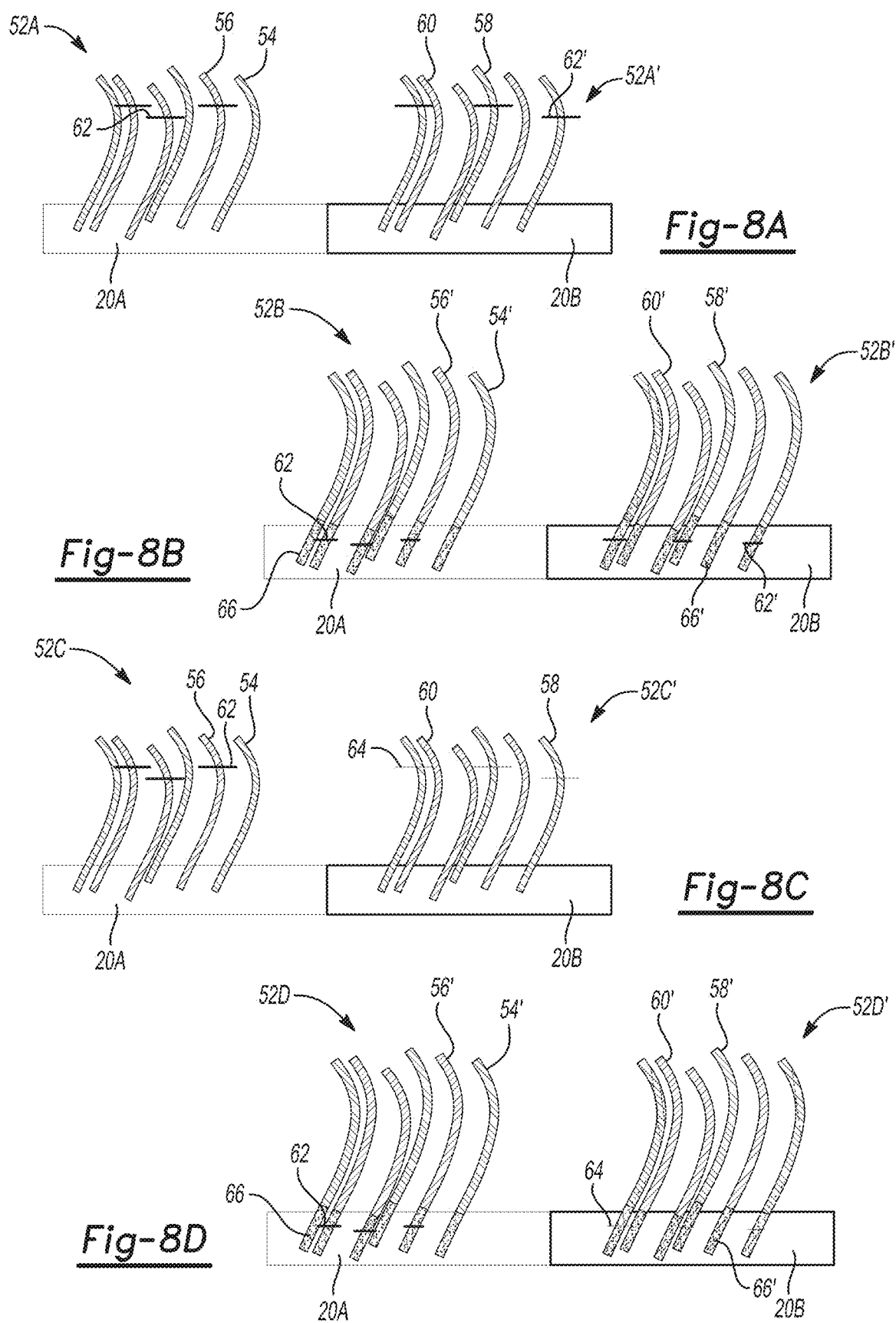

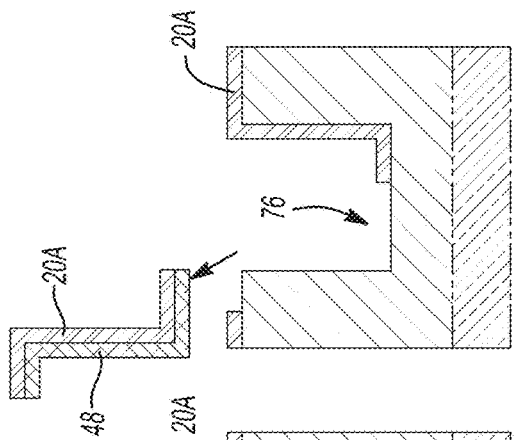
*Fig-9A* *Fig-9B* *Fig-9C* *Fig-9D*
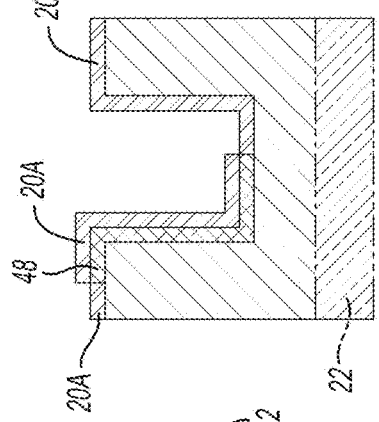
*Fig-9E* *Fig-9F*
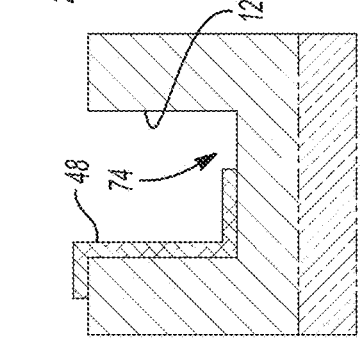
*Fig-10*
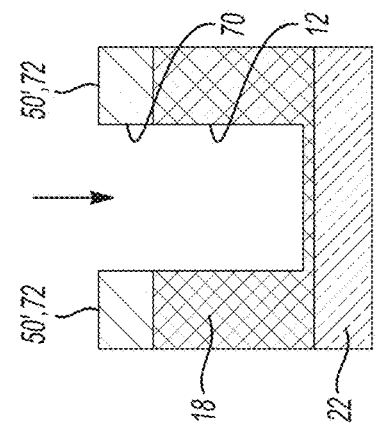
*Fig-11*

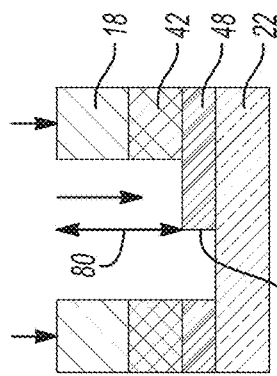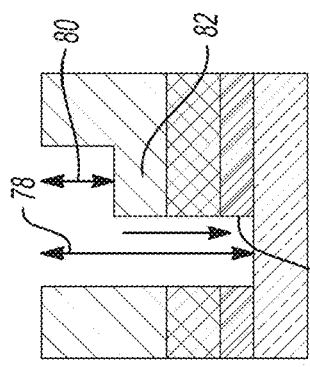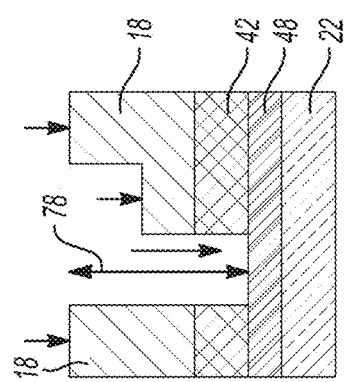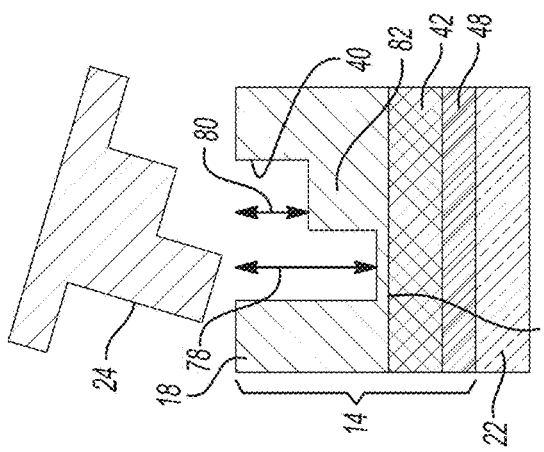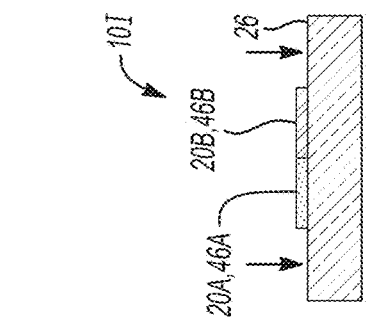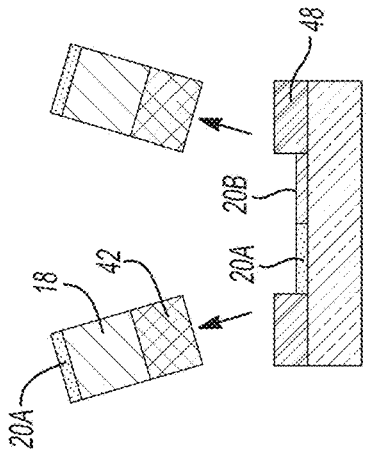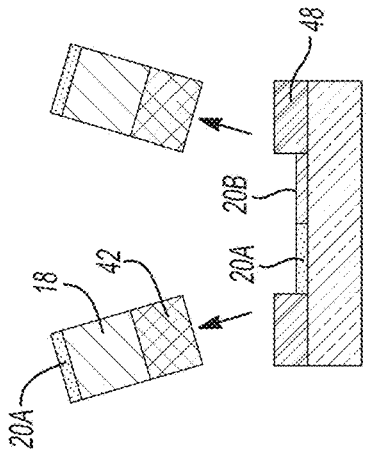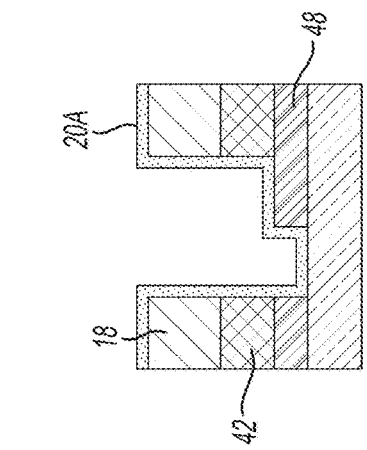

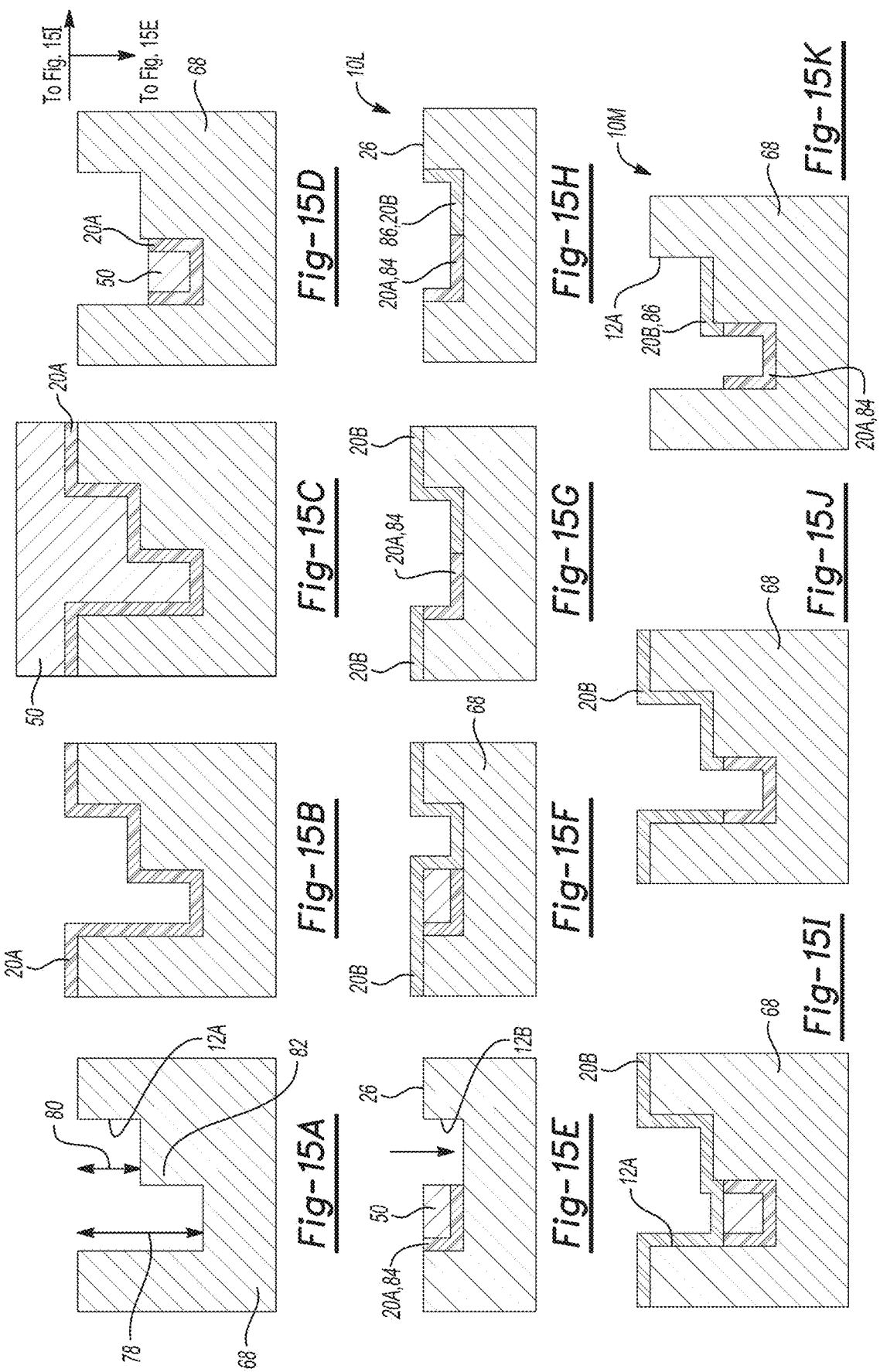

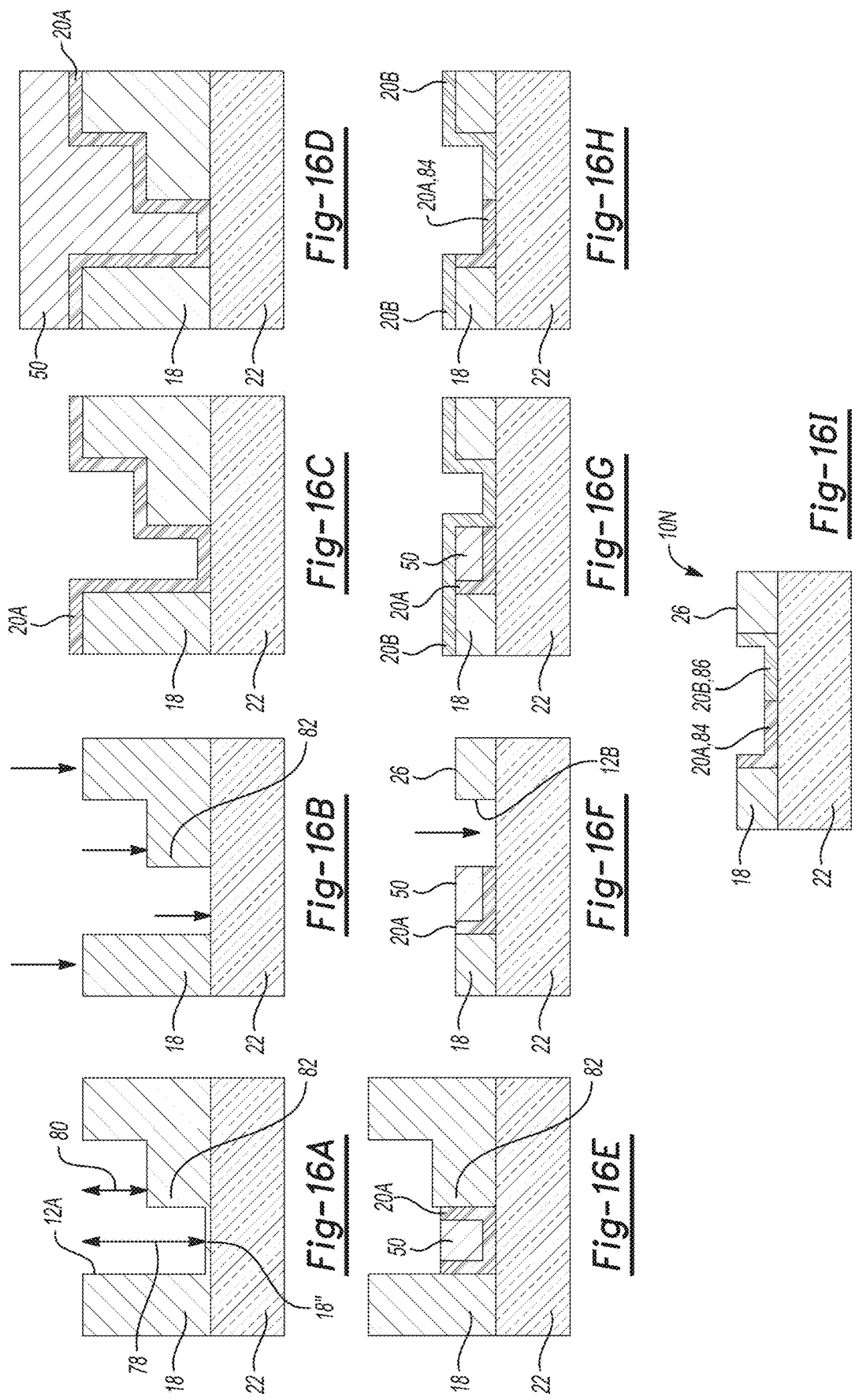

FLOW CELLS

CROSS-REFERENCE TO RELATED APPLICATION

This application claims the benefit of U.S. Provisional Application Ser. No. 62/951,780, filed Dec. 20, 2019, the contents of which is incorporated by reference herein in its entirety.

REFERENCE TO SEQUENCE LISTING

The Sequence Listing submitted herewith via EFS-Web is hereby incorporated by reference in its entirety. The name of the file is ILI188B_IP-1910-US_Sequence_Listing_ST25.txt, the size of the file is 525 bytes, and the date of creation of the file is Dec. 10, 2020.

BACKGROUND

Some available platforms for sequencing nucleic acids utilize a sequencing-by-synthesis approach. With this approach, a nascent strand is synthesized, and the addition of each monomer (e.g., nucleotide) to the growing strand is detected optically and/or electronically. Because a template strand directs synthesis of the nascent strand, one can infer the sequence of the template DNA from the series of nucleotide monomers that were added to the growing strand during the synthesis. In some examples, sequential paired-end sequencing may be used, where forward strands are sequenced and removed, and then reverse strands are constructed and sequenced. In other examples, simultaneous paired-end sequencing may be used, where forward strands and reverse strands are sequenced at the same time.

SUMMARY

Some examples and aspects of the methods disclosed herein generate flow cells for sequential paired-end reads. Other examples and aspects of the methods disclosed herein generate flow cells for simultaneous paired-end reads. The methods provide simplified patterning techniques for generating a variety of flow cell surfaces.

A first aspect disclosed herein is flow cell comprising a base support; a multi-layer stack positioned over the base support, the multi-layer stack including: a resin layer positioned over the base support and a hydrophobic layer positioned over the resin layer; and a depression defined in the multi-layer stack through the hydrophobic material and through a portion of the resin.

An example of the first aspect further comprises a polymeric hydrogel positioned in the depression. This example may further comprise primers attached to the polymeric hydrogel.

In an example of the first aspect, a first region of the depression includes: a first polymeric hydrogel and a first primer set attached to the first polymeric hydrogel; and a second region of the depression includes: a second polymeric hydrogel and a second primer set attached to the second polymeric hydrogel, wherein the first primer set is different than the second primer set.

It is to be understood that any features of the first aspect disclosed herein may be combined together in any desirable manner and/or configuration to achieve the benefits as described in this disclosure, including, for example, a depression surrounded by a hydrophobic region.

A second aspect disclosed herein is a method comprising defining a depression in a multi-layer stack including a hydrophobic layer over a resin layer by: i) etching through a depth of the hydrophobic layer; or ii) imprinting and etching the hydrophobic layer through a depth of the hydrophobic layer; or iii) imprinting through a depth of the hydrophobic layer and through a portion of a depth of the resin layer; and applying a functionalized layer in at least one region of the depression.

In an example of the second aspect, defining the depression involves ii) imprinting and etching the hydrophobic layer through the depth of the hydrophobic layer, and the imprinting and etching of the hydrophobic layer involves: imprinting through a portion of the depth of the hydrophobic layer; and etching a remaining portion of the depth of the hydrophobic layer, whereby the resin layer acts as an etch stop.

In an example of the second aspect, defining the depression involves i) etching through the depth of the hydrophobic layer, and prior to etching through the depth of the hydrophobic layer, the method further comprises: applying a lift-off resist and an additional resin layer over the hydrophobic layer; imprinting the additional resin layer to form a concave region therein; and extending the concave region to a surface of the hydrophobic layer by selectively etching portions of the additional resin layer and the lift-off resist, whereby other portions of the additional resin layer and the lift-off resist that are adjacent to the concave region remain intact. In this example, after the functionalized layer is applied, the method may further comprise lifting off the other portions of the lift-off resist.

In an example of the second aspect: prior to applying the functionalized layer, the method further comprises applying a sacrificial layer over a first portion of the depression, whereby a second portion of the depression is exposed; wherein the functionalized layer is applied over the sacrificial layer and the second portion of the depression; and subsequent to applying the functionalized layer, the method further comprises: removing the sacrificial layer to expose the first portion of the depression, and applying a second functionalized layer over the first portion of the depression.

It is to be understood that any features of the second aspect may be combined together in any desirable manner. Moreover, it is to be understood that any combination of features of the first aspect and/or of the second aspect may be used together, and/or may be combined with any of the examples disclosed herein to achieve the benefits as described in this disclosure, including, for example, simplified methods for patterning a variety of flow cell surfaces.

A third aspect disclosed herein is a method comprising applying a sacrificial layer over a first portion of a depression defined in a substrate, whereby a second portion of the depression remains exposed; applying a first functionalized layer over the sacrificial layer and over the second portion of the depression; removing the sacrificial layer and the first functionalized layer applied thereon, thereby exposing the first portion of the depression; applying a second functionalized layer over the second portion of the depression; and attaching respective primers sets to the first and second functionalized layers.

In an example of the third aspect, the substrate includes a resin layer over a base support; and the depression is defined through a portion of the resin layer.

In an example of the third aspect, prior to applying the sacrificial layer over the first portion, the method further comprises forming the depression in the resin layer using nanoimprint lithography.

In an example of the third aspect, prior to applying the sacrificial layer over the first portion, the method further comprises forming the depression in the resin layer by: applying a photoresist to the resin layer; developing the photoresist to define a depression pattern where soluble photoresist is removed and an interstitial pattern where insoluble photoresist remains over the resin layer; etching the resin layer at the depression pattern; and removing the insoluble photoresist.

It is to be understood that any features of the third aspect may be combined together in any desirable manner. Moreover, it is to be understood that any combination of features of the first aspect and/or of the second aspect and/or of the third aspect may be used together, and/or may be combined with any of the examples disclosed herein to achieve the benefits as described in this disclosure, including, for example, simplified methods for patterning a variety of flow cell surfaces.

A fourth aspect disclosed herein is a method comprising imprinting a resin layer to form a concave region including a deep portion, and a shallow portion defined by a step portion, wherein the resin layer is positioned over a multi-layer stack including at least two layers having differential etching rates, which is positioned over a base support; selectively etching the resin layer and the at least two layers to form a depression adjacent to the deep portion; applying a first functionalized layer to the depression; selectively etching the resin layer, the at least two layers, or combinations thereof to expose a region underlying the step portion; and applying a second functionalized layer to the exposed region.

In an example of the fourth aspect, the at least two layers include a sacrificial layer that is positioned over an additional resin layer. In this example, the selectively etching to form the depression involves: etching a first portion of the resin layer underlying the deep portion; etching a portion of the sacrificial layer underlying the deep portion, thereby exposing a portion of the additional resin layer; and etching i) a second portion of the resin layer to expose another portion of the sacrificial layer and ii) the exposed portion of the additional resin layer. In this example, the selectively etching to expose a region underlying the step portion involves etching a second portion of the sacrificial layer to expose a second portion of the additional resin layer. In this example, the second functionalized layer is applied to the second portion of the additional resin layer and the method further comprising etching a remaining portion of the sacrificial layer.

In an example of the fourth aspect, the at least two layers include a poly(methyl methacrylate) lift-off layer that is positioned over a sacrificial layer. In this example, the selectively etching to form the depression involves: etching a first portion of the resin layer underlying the deep portion; etching a portion of the poly(methyl methacrylate) lift-off layer underlying the deep portion; and etching a portion of the sacrificial layer underlying the deep portion, thereby forming the depression in the sacrificial layer. In this example, the region underlying the step portion is a portion of the base support, and wherein selectively etching to expose the region underlying the step portion involves: etching the step portion of the resin layer; etching a second portion of the poly(methyl methacrylate) lift-off layer underlying the step portion; and etching a second portion of the sacrificial layer underlying the step portion. In this example, the second functionalized layer is applied to the portion of the base support, and wherein the method further comprises: lifting off a remaining portion of the poly(methyl methacrylate) lift-off layer; and etching a remaining portion of the sacrificial layer.

In an example of the fourth aspect, the at least two layers include a poly(methyl methacrylate) lift-off layer that is positioned over a sacrificial layer that is positioned over an additional resin layer. In this example, the selectively etching to form the depression involves: etching a first portion of the resin layer underlying the deep portion; etching a portion of the poly(methyl methacrylate) lift-off layer underlying the deep portion; and etching a portion of the sacrificial layer underlying the deep portion, thereby forming the depression in the sacrificial layer. In this example, prior to etching the portion of the sacrificial layer underlying the deep portion, the method further comprises etching the resin layer to remove the step portion and expose a second portion of the poly(methyl methacrylate) lift-off layer. In this example, the region underlying the step portion is a portion of the additional resin layer, and wherein selectively etching to expose the region underlying the step portion involves: etching the second portion of the poly(methyl methacrylate) lift-off layer; and etching a second portion of the sacrificial layer underlying the second portion of the poly(methyl methacrylate) lift-off layer. In this example, the second functionalized layer is applied to the portion of the additional resin layer, and wherein the method further comprises: lifting off a remaining portion of the poly(methyl methacrylate) lift-off layer; and etching a remaining portion of the sacrificial layer.

It is to be understood that any features of the fourth aspect may be combined together in any desirable manner. Moreover, it is to be understood that any combination of features of the first aspect and/or of the second aspect and/or of the third aspect and/or of the fourth aspect may be used together, and/or may be combined with any of the examples disclosed herein to achieve the benefits as described in this disclosure, including, for example, simplified methods for patterning a variety of flow cell surfaces.

A fifth aspect disclosed herein is a method comprising applying a first functionalized layer over a substrate including a concave region having a deep portion, and a shallow portion defined by a step portion; patterning the first functionalized layer, thereby forming a first functionalized region covered by a photoresist in the deep portion adjacent to the step portion; and applying a second functionalized layer over the substrate and the photoresist.

An example of the fifth aspect further comprises dry etching the substrate to remove the step portion and form a depression adjacent to the first functionalized region. In some of these examples, after the second functionalized layer is applied, the method further comprises lifting off the photoresist and the second functionalized layer thereon; and removing a portion of the second functionalized layer, thereby forming a second functionalized region adjacent to the first functionalized region. In some of these examples, patterning the first functionalized layer involves: applying the photoresist over the first functionalized layer; and dry etching the photoresist and the first functionalized layer until the step portion is exposed. In this example, the dry etching of the substrate or the dry etching of the photoresist involves reactive ion etching.

As mentioned an example of the fifth aspect further comprises dry etching the substrate to remove the step portion and form a depression adjacent to the first functionalized region. In some of these examples, the substrate is a multi-layer stack including a resin layer over a base support; prior to applying the first functionalized layer, the method further comprises imprinting the resin layer to form the concave region and selectively etching the resin layer to expose the base support at the deep portion; drying etching of the substrate involves dry etching the resin layer; and the base support functions as an etch step during the dry etching. In some of these examples, after the second functionalized layer is applied, the method further comprises lifting off the photoresist and the second functionalized layer thereon; and removing a portion of the second functionalized layer, thereby forming a second functionalized region adjacent to the first functionalized region. In some of these examples, patterning the first functionalized layer involves: applying the photoresist over the first functionalized layer; and dry etching the photoresist and the first functionalized layer until the step portion is exposed.

It is to be understood that any features of the fifth aspect may be combined together in any desirable manner. Moreover, it is to be understood that any combination of features of the first aspect and/or of the second aspect and/or of the third aspect and/or of the fourth aspect and/or of the fifth aspect may be used together, and/or may be combined with any of the examples disclosed herein to achieve the benefits as described in this disclosure, including, for example, simplified methods for patterning a variety of flow cell surfaces.

A sixth aspect disclosed herein is a method comprising imprinting an additional resin layer to form a concave region therein, wherein the additional resin layer is positioned over a poly(methyl methacrylate) lift-off layer that is positioned over a first resin layer; exposing a portion of the first resin layer underlying the concave region by etching a first portion of the additional resin layer and a first portion of the poly(methyl methacrylate) lift-off layer; etching i) the additional resin layer to expose a second portion of the poly (methyl methacrylate) lift-off layer and ii) the exposed portion of the first resin layer to form a depression in the first resin layer; applying a functionalized layer over the depression and the second portion of the poly(methyl methacrylate) lift-off layer; and removing the second portion of the poly(methyl methacrylate) lift-off layer and the functionalized layer thereon.

It is to be understood that any features of the sixth aspect may be combined together in any desirable manner. Moreover, it is to be understood that any combination of features of the first aspect and/or of the second aspect and/or of the third aspect and/or of the fourth aspect and/or of the fifth aspect and/or of the sixth aspect may be used together, and/or may be combined with any of the examples disclosed herein to achieve the benefits as described in this disclosure, including, for example, simplified methods for patterning a variety of flow cell surfaces.

A seventh aspect disclosed herein is a method comprising imprinting a resin layer to form a convex region, wherein the resin layer is positioned over a multi-layer stack including a lift-off resist over a functionalized layer over a substrate; selectively etching portions of the resin layer, the lift-off resist, and the functionalized layer to expose portions of the substrate, whereby other portions of the lift-off resist and the functionalized layer that are adjacent to the convex region remain intact; and lifting off the other portion of the lift-off resist.

In an example of the seventh aspect, the substrate includes a base support and an additional resin layer over the base support.

It is to be understood that any features of the seventh aspect may be combined together in any desirable manner. Moreover, it is to be understood that any combination of features of the first aspect and/or of the second aspect and/or of the third aspect and/or of the fourth aspect and/or of the fifth aspect and/or of the sixth aspect and/or of the seventh aspect may be used together, and/or may be combined with any of the examples disclosed herein to achieve the benefits as described in this disclosure, including, for example, simplified methods for patterning a variety of flow cell surfaces.

An eighth aspect disclosed herein is a method comprising imprinting a resin to form a convex region, wherein the resin is positioned over a multi-layer stack including a sacrificial layer over a substrate; selectively etching portions of the resin and the sacrificial layer around the convex region to expose a portion of the substrate; patterning a photoresist to cover the exposed portion of the substrate; exposing a second portion of the substrate underlying the sacrificial layer; applying a functionalized layer over the exposed second portion of the substrate; and lifting off the photoresist.

In an example of the eighth aspect, the substrate includes an additional resin layer over a base support. In this example, the selectively etching further involves selectively etching through a portion of a depth of the additional resin layer to form a protrusion in the additional resin layer having a shape of the convex region. In this example, the selectively etching exposes a surface of the additional resin layer.

It is to be understood that any features of the eighth aspect may be combined together in any desirable manner. Moreover, it is to be understood that any combination of features of the first aspect and/or of the second aspect and/or of the third aspect and/or of the fourth aspect and/or of the fifth aspect and/or of the sixth aspect and/or of the seventh aspect and/or of the eighth aspect may be used together, and/or may be combined with any of the examples disclosed herein to achieve the benefits as described in this disclosure, including, for example, simplified methods for patterning a variety of flow cell surfaces.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 4A through FIG. 4D are schematic views that together illustrate yet another example of the method disclosed herein;

FIG. 5A through FIG. 5E are schematic views that together illustrate still another example of the method disclosed herein;

FIG. 6A through FIG. 6C are schematic views that together illustrate a further example of the method disclosed herein;

FIG. 8A through FIG. 8D are schematic views of different examples of first and second primer sets attached to first and second functionalized layers over a substrate;

FIG. 9A through FIG. 9F are schematic views that together illustrate another example of the method disclosed herein;

FIG. 10 is a schematic view depicting one example for forming a depression in a resin layer;

FIG. 11 is a schematic view depicting another example for forming a depression in a resin layer;

FIG. 12A through FIG. 12H are schematic views that together illustrate yet another example of the method disclosed herein;

FIG. 15A through FIG. 15K are schematic views that together illustrate two additional examples of the method disclosed herein;

FIG. 16A through FIG. 16I are schematic views that together illustrate still another example of the method disclosed herein.

DETAILED DESCRIPTION

Figures 1A, 1B, 1C:
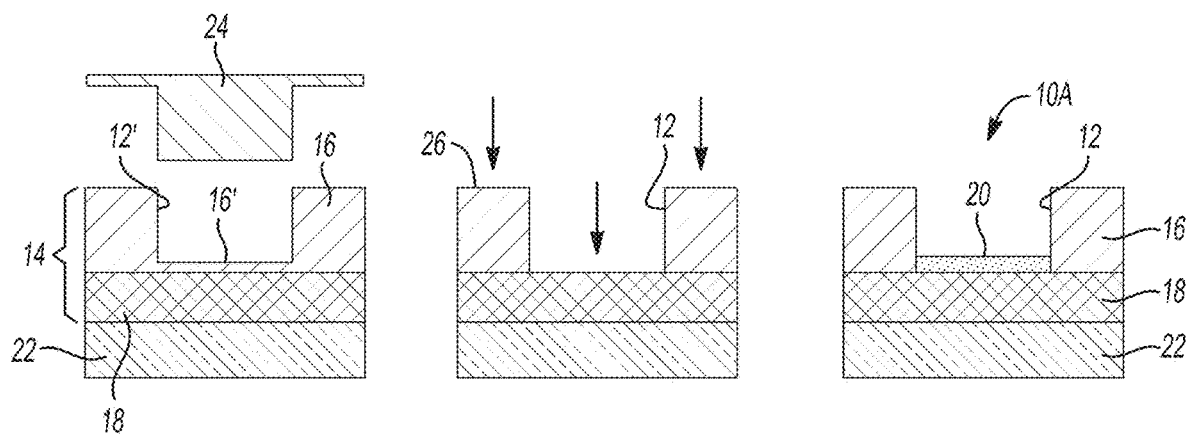
FIG. 1A through FIG. 1C are schematic views that together illustrate one example of the method disclosed.

Examples of the flow cells disclosed herein may be used for nucleic acid sequencing.

Some of the flow cells include different primer sets attached to different regions of the flow cell substrate. In these examples, the primer sets may be controlled so that the cleaving (linearization) chemistry is orthogonal in the different regions. Orthogonal cleaving chemistry may be realized through identical cleavage sites that are attached to different primers in the different sets, or through different cleavage sites that are attached to different primers in the different sets. This enables a cluster of forward strands to be generated in one region of the substrate and a cluster of reverse strands to be generated in another region of the substrate. In an example, the regions are directly adjacent to one another. In another example, any space between the regions is small enough that clustering can span the two regions. With some of the flow cell configurations disclosed herein, the forward and reverse strands are spatially separate, which separates the fluorescence signals from both reads while allowing for simultaneous base calling of each read. As such, some examples of the flow cells disclosed herein enable simultaneous paired-end reads to be obtained. Several example methods are described to generate these flow cells.

Other of the flow cells include the same primer set attached to different regions of the flow cell substrate. In these examples, the primer sets include two different primers in each region. This provides at least the benefits of i) a cluster of forward strands to be generated in each region of the substrate, sequenced, and removed; and ii) a cluster of reverse strands to be generated in each region of the substrate, sequenced, and removed. As such, other examples of the flow cells disclosed herein enable sequential paired-end reads to be obtained. Several example methods are described to generate these flow cells.

Definitions

It is to be understood that terms used herein will take on their ordinary meaning in the relevant art unless specified otherwise. Several terms used herein and their meanings are set forth below.

The singular forms "a", "an", and "the" include plural referents unless the context clearly dictates otherwise.

The terms comprising, including, containing and various forms of these terms are synonymous with each other and are meant to be equally broad.

The terms top, bottom, lower, upper, on, etc. are used herein to describe the flow cell and/or the various components of the flow cell. It is to be understood that these directional terms are not meant to imply a specific orientation, but are used to designate relative orientation between components. The use of directional terms should not be interpreted to limit the examples disclosed herein to any specific orientation(s).

The terms first, second, etc. also are not meant to imply a specific orientation or order, but rather are used to distinguish one component from another.

It is to be understood that the ranges provided herein include the stated range and any value or sub-range within the stated range, as if such values or sub-ranges were explicitly recited. For example, a range of about 400 nm to about 1 μm (1000 nm), should be interpreted to include not only the explicitly recited limits of about 400 nm to about 1 μm, but also to include individual values, such as about 708 nm, about 945.5 nm, etc., and sub-ranges, such as from about 425 nm to about 825 nm, from about 550 nm to about 940 nm, etc. Furthermore, when "about" and/or "substantially" are/is utilized to describe a value, they are meant to encompass minor variations (up to +/−10%) from the stated value.

An "acrylamide monomer" is a monomer with the structure

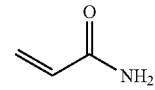

or a monomer including an acrylamide group. Examples of the monomer including an acrylamide group include azido acetamido pentyl acrylamide:

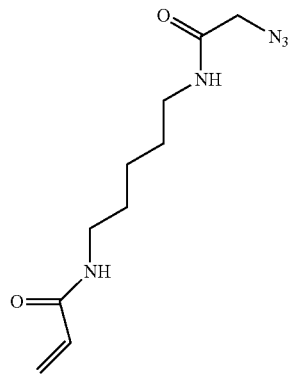 [SMILES: C=CC(=O)NCCCCCNC(=O)CN=[N+]=[N-]]

and N-isopropylacrylamide:

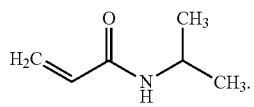

Other acrylamide monomers may be used.

An aldehyde, as used herein, is an organic compound containing a functional group with the structure —CHO, which includes a carbonyl center (i.e., a carbon double-bonded to oxygen) with the carbon atom also bonded to hydrogen and an R group, such as an alkyl or other side chain. The general structure of an aldehyde is:

As used herein, "alkyl" refers to a straight or branched hydrocarbon chain that is fully saturated (i.e., contains no double or triple bonds). The alkyl group may have 1 to 20 carbon atoms. Example alkyl groups include methyl, ethyl, propyl, isopropyl, butyl, isobutyl, tertiary butyl, pentyl, hexyl, and the like. As an example, the designation "C1-4 alkyl" indicates that there are one to four carbon atoms in the alkyl chain, i.e., the alkyl chain is selected from the group consisting of methyl, ethyl, propyl, iso-propyl, n-butyl, isobutyl, sec-butyl, and t-butyl.

As used herein, "alkenyl" refers to a straight or branched hydrocarbon chain containing one or more double bonds. The alkenyl group may have 2 to 20 carbon atoms. Example alkenyl groups include ethenyl, propenyl, butenyl, pentenyl, hexenyl, and the like.

As used herein, "alkyne" or "alkynyl" refers to a straight or branched hydrocarbon chain containing one or more triple bonds. The alkynyl group may have 2 to 20 carbon atoms.

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 6 to 18 carbon atoms. Examples of aryl groups include phenyl, naphthyl, azulenyl, and anthracenyl.

An "amino" functional group refers to an —NR$_a$R$_b$ group, where R$_a$ and R$_b$ are each independently selected from hydrogen (e.g.,

C1-6 alkyl, C2-6 alkenyl, C2-6 alkynyl, C3-7 carbocycle, C6-10 aryl, 5-10 membered heteroaryl, and 5-10 membered heterocycle, as defined herein.

As used herein, the term "attached" refers to the state of two things being joined, fastened, adhered, connected or bound to each other, either directly or indirectly. For example, a nucleic acid can be attached to a functionalized polymer by a covalent or non-covalent bond. A covalent bond is characterized by the sharing of pairs of electrons between atoms. A non-covalent bond is a physical bond that does not involve the sharing of pairs of electrons and can include, for example, hydrogen bonds, ionic bonds, van der Waals forces, hydrophilic interactions and hydrophobic interactions.

An "azide" or "azido" functional group refers to —N$_3$.

As used herein, a "bonding region" refers to an area of a substrate that is to be bonded to another material, which may be, as examples, a spacer layer, a lid, another substrate, etc., or combinations thereof (e.g., a spacer layer and a lid, or a spacer layer and another substrate). The bond that is formed at the bonding region may be a chemical bond (as described above), or a mechanical bond (e.g., using a fastener, etc.).

As used herein, "carbocycle" means a non-aromatic cyclic ring or ring system containing only carbon atoms in the ring system backbone. When the carbocycle is a ring system, two or more rings may be joined together in a fused, bridged or spiro-connected fashion. Carbocycles may have any degree of saturation, provided that at least one ring in a ring system is not aromatic. Thus, carbocycles include cycloalkyls, cycloalkenyls, and cycloalkynyls. The carbocycle group may have 3 to 20 carbon atoms. Examples of carbocycle rings include cyclopropyl, cyclobutyl, cyclopentyl, cyclohexyl, cyclohexenyl, 2,3-dihydro-indene, bicyclo[2.2.2]octanyl, adamantyl, and spiro[4.4]nonanyl.

As used herein, the term "carboxylic acid" or "carboxyl" as used herein refers to —COOH.

As used herein, "cycloalkylene" means a fully saturated carbocycle ring or ring system that is attached to the rest of the molecule via two points of attachment.

As used herein, "cycloalkenyl" or "cycloalkene" means a carbocycle ring or ring system having at least one double bond, wherein no ring in the ring system is aromatic. Examples include cyclohexenyl or cyclohexene and norbornenyl or norbornene. Also as used herein, "heterocycloalkenyl" or "heterocycloalkene" means a carbocycle ring or ring system with at least one heteroatom in ring backbone, having at least one double bond, wherein no ring in the ring system is aromatic.

As used herein, "cycloalkynyl" or "cycloalkyne" means a carbocycle ring or ring system having at least one triple bond, wherein no ring in the ring system is aromatic. An example is cyclooctyne. Another example is bicyclononyne. Also as used herein, "heterocycloalkynyl" or "heterocycloalkyne" means a carbocycle ring or ring system with at least one heteroatom in ring backbone, having at least one triple bond, wherein no ring in the ring system is aromatic.

The term "depositing," as used herein, refers to any suitable application technique, which may be manual or automated, and, in some instances, results in modification of the surface properties. Generally, depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the term "depression" refers to a discrete concave feature in a substrate having a surface opening that is at least partially surrounded by interstitial region(s) of the substrate. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc. As examples, the depression can be a well or two interconnected wells. The depression may also have more complex architectures, such as ridges, step features, etc.

The term "each," when used in reference to a collection of items, is intended to identify an individual item in the collection, but does not necessarily refer to every item in the collection. Exceptions can occur if explicit disclosure or context clearly dictates otherwise.

The term "epoxy" (also referred to as a glycidyl or oxirane group) as used herein refers to

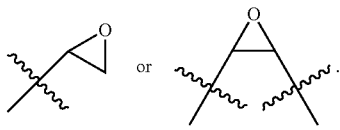

As used herein, the term "flow cell" is intended to mean a vessel having a flow channel where a reaction can be carried out, an inlet for delivering reagent(s) to the flow channel, and an outlet for removing reagent(s) from the flow channel. In some examples, the flow cell accommodates the detection of the reaction that occurs in the flow cell. For example, the flow cell can include one or more transparent surfaces allowing for the optical detection of arrays, optically labeled molecules, or the like.

As used herein, a "flow channel" may be an area defined between two bonded components, which can selectively receive a liquid sample. In some examples, the flow channel may be defined between a patterned resin of a substrate and a lid, and thus may be in fluid communication with one or more depressions defined in the patterned resin. In other examples, the flow channel may be defined between two substrates (each of which has sequencing chemistry thereon).

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen, oxygen and sulfur, in the ring backbone. When the heteroaryl is a ring system, every ring in the system is aromatic. The heteroaryl group may have 5-18 ring members.

As used herein, "heterocycle" means a non-aromatic cyclic ring or ring system containing at least one heteroatom in the ring backbone. Heterocycles may be joined together in a fused, bridged or spiro-connected fashion. Heterocycles may have any degree of saturation provided that at least one ring in the ring system is not aromatic. In the ring system, the heteroatom(s) may be present in either a non-aromatic or aromatic ring. The heterocycle group may have 3 to 20 ring members (i.e., the number of atoms making up the ring backbone, including carbon atoms and heteroatoms). In some examples, the heteroatom(s) are O, N, or S.

The term "hydrazine" or "hydrazinyl" as used herein refers to a —NHNH$_2$ group.

As used herein, the term "hydrazone" or "hydrazonyl" as used herein refers to a

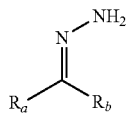

group in which R$_a$ and R$_b$ are each independently selected from hydrogen, C1-6 alkyl, C2-6 alkenyl, C2-6 alkynyl, C3-7 carbocycle, C6-10 aryl, 5-10 membered heteroaryl, and 5-10 membered heterocycle, as defined herein.

As used herein, "hydroxy" or "hydroxyl" refers to an —OH group.

As used herein, the term "interstitial region" refers to an area, e.g., of a substrate, patterned resin, or other support that separates depressions or protrusions. For example, an interstitial region can separate one depression of an array from another depression of the array. The two depressions or protrusions that are separated from each other can be discrete, i.e., lacking physical contact with each other. In many examples, the interstitial region is continuous whereas the depressions or protrusions are discrete, for example, as is the case for a plurality of depressions or protrusions defined in an otherwise continuous surface. In other examples, the interstitial regions and the features are discrete, for example, as is the case for a plurality of depressions in the shape of trenches, which are separated by respective interstitial regions. The separation provided by an interstitial region can be partial or full separation. Interstitial regions may have a surface material that differs from the surface material of the depressions or the protrusions. For example, depressions can have a polymer and a first primer set therein, and the interstitial regions can have a polymer and a second primer set thereon. For another example, depressions of an array can have beads therein while the interstitial regions do not have beads thereon.

As used herein, a "negative photoresist" refers to a light-sensitive material in which a portion that is exposed to light of particular wavelength(s) becomes insoluble to a developer. In these examples, the insoluble negative photoresist has less than 5% solubility in the developer. With the negative photoresist, the light exposure changes the chemical structure so that the exposed portions of the material becomes less soluble (than non-exposed portions) in the developer. While not soluble in the developer, the insoluble negative photoresist may be at least 95% soluble in a remover that is different from the developer. The remover may be a solvent or solvent mixture used, e.g., in a lift-off process.

In contrast to the insoluble negative photoresist, any portion of the negative photoresist that is not exposed to light is at least 95% soluble in the developer. In some examples, the portion of the negative photoresist not exposed to light is at least 98%, e.g., 99%, 99.5%, 100%, soluble in the developer.

"Nitrile oxide," as used herein, means a "R$_a$C≡N$^+$O$^-$" group in which R$_a$ is defined herein. Examples of preparing nitrile oxide include in situ generation from aldoximes by treatment with chloramide-T or through action of base on imidoyl chlorides [RC(Cl)=NOH] or from the reaction between hydroxylamine and an aldehyde.

"Nitrone," as used herein, means a

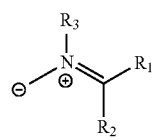

group in which R$_1$, R$_2$, and R$_3$ may be any of the R$_a$ and R$_b$ groups defined herein.

As used herein, a "nucleotide" includes a nitrogen containing heterocyclic base, a sugar, and one or more phosphate groups. Nucleotides are monomeric units of a nucleic acid sequence. In RNA, the sugar is a ribose, and in DNA, the sugar is a deoxyribose, i.e. a sugar lacking a hydroxyl group that is present at the 2' position in ribose. The nitrogen containing heterocyclic base (i.e., nucleobase) can be a purine base or a pyrimidine base. Purine bases include adenine (A) and guanine (G), and modified derivatives or analogs thereof. Pyrimidine bases include cytosine (C), thymine (T), and uracil (U), and modified derivatives or analogs thereof. The C-1 atom of deoxyribose is bonded to N-1 of a pyrimidine or N-9 of a purine. A nucleic acid analog may have any of the phosphate backbone, the sugar, or the nucleobase altered. Examples of nucleic acid analogs include, for example, universal bases or phosphate-sugar backbone analogs, such as peptide nucleic acid (PNA).

In some examples, the term "over" may mean that one component or material is positioned directly on another component or material. When one is directly on another, the two are in contact with each other. In FIG. 1A, the resin layer 18 is applied over the base substrate 22 so that it is directly on and in contact with the base substrate 22.

In other examples, the term "over" may mean that one component or material is positioned indirectly on another component or material. By indirectly on, it is meant that a gap or an additional component or material may be positioned between the two components or materials. In FIG. 1A, the hydrophobic layer 16 is positioned over the base substrate 22 such that the two are in indirect contact. More specifically, the hydrophobic layer 16 is indirectly on the base substrate 22 because the resin layer 18 is positioned between the two components 16 and 22.

A "patterned resin" refers to any polymer that can have depressions and/or protrusions defined therein. Specific examples of resins and techniques for patterning the resins will be described further below.

As used herein, a "positive photoresist" refers to a light-sensitive material in which a portion that is exposed to light of particular wavelength(s) becomes soluble to a developer. In these examples, any portion of the positive photoresist exposed to light is at least 95% soluble in the developer. In some examples, the portion of the positive photoresist exposed to light is at least 98%, e.g., 99%, 99.5%, 100%, soluble in the developer. With the positive photoresist, the light exposure changes the chemical structure so that the exposed portions of the material become more soluble (than non-exposed portions) in the developer.

In contrast to the soluble positive photoresist, any portion of the positive photoresist not exposed to light is insoluble (less than 5% soluble) in the developer. While not soluble in the developer, the insoluble positive photoresist may be at least 95% soluble in a remover that is different from the developer. In some examples, insoluble positive photoresist is at least 98%, e.g., 99%, 99.5%, 100%, soluble in the remover. The remover may be a solvent or solvent mixture used in a lift-off process.

As used herein, the "primer" is defined as a single stranded nucleic acid sequence (e.g., single strand DNA or single strand RNA). Some primers, referred to herein as amplification primers, serve as a starting point for template amplification and cluster generation. Other primers, referred to herein as sequencing primers, serve as a starting point for DNA or RNA synthesis. The 5' terminus of the primer may be modified to allow a coupling reaction with a functional group of a polymer. The primer length can be any number of bases long and can include a variety of non-natural nucleotides. In an example, the sequencing primer is a short strand, ranging from 10 to 60 bases, or from 20 to 40 bases.

A "spacer layer," as used herein refers to a material that bonds two components together. In some examples, the spacer layer can be a radiation-absorbing material that aids in bonding, or can be put into contact with a radiation-absorbing material that aids in bonding.

The term "substrate" refers to a structure upon which various components of the flow cell (e.g., a polymer, primer(s), etc.) may be added. The substrate may be a wafer, a panel, a rectangular sheet, a die, or any other suitable configuration. The substrate is generally rigid and is insoluble in an aqueous liquid. The substrate may be inert to a chemistry that is used to modify the depressions or that is present in the depressions. For example, a substrate can be inert to chemistry used to form the polymer, to attach the primer(s), etc. The substrate may be a single layer structure (e.g., a base support), or a multi-layered structure (e.g., including a base support and one or more layers over the base support). Examples of suitable substrates will be described further below.

A "thiol" functional group refers to —SH.

As used herein, the terms "tetrazine" and "tetrazinyl" refer to six-membered heteroaryl group comprising four nitrogen atoms. Tetrazine can be optionally substituted.

"Tetrazole," as used herein, refer to five-membered heterocyclic group including four nitrogen atoms. Tetrazole can be optionally substituted.

The term "transparent," when referencing a base support or layer, refers to a material, e.g., in the form of a substrate or layer, that is transparent to a particular wavelength or range of wavelengths. For example, the material may be transparent to wavelength(s) that are used to chemically change a positive or negative photoresist. Transparency may be quantified using transmittance, i.e., the ratio of light energy falling on a body to that transmitted through the body. The transmittance of a transparent base support or a transparent layer will depend upon the thickness of the base support or layer and the wavelength of light. In the examples disclosed herein, the transmittance of the transparent base support or the transparent layer may range from 0.25 (25%) to 1 (100%). The material of the base support or layer may be a pure material, a material with some impurities, or a mixture of materials, as long as the resulting base support or layer is capable of the desired transmittance. Additionally, depending upon the transmittance of the base support or layer, the time for light exposure and/or the output power of the light source may be increased or decreased to deliver a suitable dose of light energy through the transparent base support and/or layer to achieve the desired effect (e.g., generating a soluble or insoluble photoresist).

Methods and Flow Cells for Sequential Paired-End Sequencing

An example of the flow cell for sequential paired-end sequencing generally includes a substrate; a functionalized layer over at least a portion of the substrate; and a primer set attached to the functionalized layer. The configuration of the various components of the flow cell may vary, depending in part upon the method used to generate the flow cell. Several example methods will now be described.

FIG. 1A through FIG. 1C together illustrate one example of a method for making a flow cell 10A. This example method includes defining a depression 12 in a multi-layer stack 14 including a hydrophobic layer 16 over a resin layer 18 by imprinting and etching the hydrophobic layer 16, and applying a functionalized layer 20 in at least one region of the depression 12.

In the example shown in FIG. 1A, the multi-layer stack 14 is positioned over a base support 22. Examples of suitable base support materials include epoxy siloxane, glass and modified or functionalized glass, plastics (including acrylics, polystyrene and copolymers of styrene and other materials, polypropylene, polyethylene, polybutylene, polyurethanes, polytetrafluoroethylene (such as TEFLON® from Chemours), cyclic olefins/cyclo-olefin polymers (COP) (such as ZEONOR® from Zeon), polyimides, etc.), nylon, ceramics/ceramic oxides, silica, fused silica, or silica-based materials, aluminum silicate, silicon and modified silicon (e.g., boron doped p+ silicon), silicon nitride ($Si_3N_4$), silicon oxide ($SiO_2$), tantalum pentoxide ($Ta_2O_5$) or other tantalum oxide(s) ($TaO_x$), hafnium oxide ($HfO_2$), carbon, metals, inorganic glasses, or the like. The base support 22 may also be a multi-layered structure. Some examples of the multi-layered structure include glass or silicon, with a coating layer of tantalum oxide or another ceramic oxide at the surface. Still other examples of the multi-layered structure may include a silicon-on-insulator (SOI) substrate.

In an example, the base support 22 may have a diameter ranging from about 2 mm to about 300 mm, or a rectangular sheet or panel having its largest dimension up to about 10 feet (~3 meters). In an example, the base support 22 is a wafer having a diameter ranging from about 200 mm to about 300 mm. In another example, the substrate is a die having a width ranging from about 0.1 mm to about 10 mm. While example dimensions have been provided, it is to be understood that a base support 22 with any suitable dimensions may be used. For another example, a panel may be used that is a rectangular support, which has a greater surface area than a 300 mm round wafer.

The resin layer 18 may be deposited over the base support 22 using any suitable deposition technique, including the examples disclosed herein, and cured using conditions suitable for the resin. Some examples of suitable resins are selected from the group consisting of a polyhedral oligomeric silsesquioxane resin (POSS)-based resin, an epoxy resin, a poly(ethylene glycol) resin, a polyether resin, an acrylic resin, an acrylate resin, a methacrylate resin, and combinations thereof. While several examples have been provided, it is believed that any resin that can be cured may be used.

As used herein, the term "polyhedral oligomeric silsesquioxane" (commercially available as FOSS® from Hybrid Plastics) refers to a chemical composition that is a hybrid intermediate (e.g., $RSiO_{1.5}$) between that of silica ($SiO_2$) and silicone ($R_2SiO$). An example of polyhedral oligomeric silsesquioxane can be that described in Kehagias et al., Microelectronic Engineering 86 (2009), pp. 776-778, which is incorporated by reference in its entirety. In an example, the composition is an organosilicon compound with the chemical formula $[RSiO_{3/2}]_n$, where the R groups can be the same or different. Example R groups for polyhedral oligomeric silsesquioxane include epoxy, azide/azido, a thiol, a poly(ethylene glycol), a norbornene, a tetrazine, acrylates, and/or methacrylates, or further, for example, alkyl, aryl, alkoxy, and/or haloalkyl groups. The resin composition disclosed herein may comprise one or more different cage or core structures as monomeric units. The polyhedral structure may be a $T_8$ structure, such as:

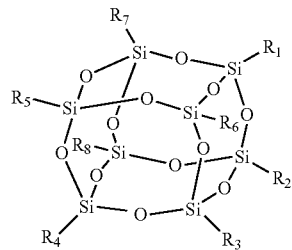

and represented by:

$T_8$

This monomeric unit typically has eight arms of functional groups $R_1$ through $R_8$.

The monomeric unit may have a cage structure with 10 silicon atoms and 10 R groups, referred to as $T_{10}$, such as:

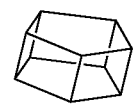

$T_{10}$ or may have a cage structure with 12 silicon atoms and 12 R groups, referred to as $T_{12}$, such as:

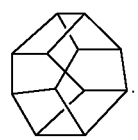

$T_{12}$

The polyhedral oligomeric silsesquioxane-based material may alternatively include $T_6$, $T_{14}$, or $T_{16}$ cage structures. The average cage content can be adjusted during the synthesis, and/or controlled by purification methods, and a distribution of cage sizes of the monomeric unit(s) may be used in the examples disclosed herein.

In some of the examples disclosed herein, at least one of $R_1$ through $R_8$ or $R_{10}$ or $R_{12}$ comprises an epoxy. $R_1$ through $R_8$ or $R_{10}$ or $R_{12}$ may or may not be the same, and in some examples at least one of $R_1$ through $R_8$ or $R_{10}$ or $R_{12}$ comprises epoxy and at least one other of $R_1$ through $R_8$ or $R_{10}$ or $R_{12}$ is a non-epoxy functional group. The non-epoxy functional group may be (a) a reactive group that is orthogonally reactive to an epoxy group (i.e., reacts under different conditions than an epoxy group), that serves as a handle for coupling the resin to an amplification primer, a polymer, or a polymerization agent; or (b) a group that adjusts the mechanical or functional properties of the resin, e.g., surface energy adjustments. In some examples, the non-epoxy functional group is selected from the group consisting of an azide/azido, a thiol, a poly(ethylene glycol), a norbornene, a tetrazine, an amino, a hydroxyl, an alkynyl, a ketone, an aldehyde, an ester group, an alkyl, an aryl, an alkoxy, and a haloalkyl.

Depending upon the resin layer 18 that is used, the resin layer 18 may be activated using silanization or plasma ashing to generate surface groups that can react with the functionalized layer 20 subsequently deposited thereon (see FIG. 10).

Silanization may be accomplished using any silane or silane derivative. The selection of the silane or silane derivative may depend, in part, upon the functionalized layer 20 that is to be formed, as it may be desirable to form a covalent bond between the silane or silane derivative and the functionalized layer 20. Some example silane derivatives include a cycloalkene unsaturated moiety, such as norbornene, a norbornene derivative (e.g., a (hetero)norbornene including an oxygen or nitrogen in place of one of the carbon atoms), transcyclooctene, transcyclooctene derivatives, transcyclopentene, transcycloheptene, trans-cyclononene, bicyclo[3.3.1]non-1-ene, bicyclo[4.3.1]dec-1 (9)-ene, bicyclo[4.2.1]non-1(8)-ene, and bicyclo[4.2.1]non-1-ene. Any of these cycloalkenes can be substituted, for example, with an R group, such as hydrogen, alkyl, alkenyl, alkynyl, cycloalkyl, cycloalkenyl, cycloalkynyl, aryl, heteroaryl, heteroalicycle, aralkyl, or (heteroalicycle)alkyl. An example of the norbornene derivative includes [(5-bicyclo[2.2.1]hept-2-enyl)ethyl]trimethoxysilane. Other example silane derivatives include a cycloalkyne unsaturated moiety, such as cyclooctyne, a cyclooctyne derivative, or bicyclononynes (e.g., bicyclo[6.1.0]non-4-yne or derivatives thereof, bicyclo[6.1.0]non-2-yne, or bicyclo[6.1.0]non-3-yne). These cycloalkynes can be substituted with any of the R groups described herein.

The method used to attach the silane or silane derivative may vary depending upon the silane or silane derivative that is being used. Examples of suitable silanization methods include vapor deposition (e.g., a YES method), spin coating, or other deposition methods.

In other examples, plasma ashing rather than silanization may be used to activate the resin layer 18. Plasma ashing may generate surface-activating agent(s) (e.g., hydroxyl (C—OH or Si—OH) and/or carboxyl groups) that can adhere the subsequently deposited functionalized layer 20 to the exposed resin layer 18 in the depressions 12. In these examples, the functionalized layer 20 is selected so that it reacts with the surface groups generated by plasma ashing.

The hydrophobic layer 16 may be deposited over the resin layer 18 using any suitable deposition technique, including the examples disclosed herein.

Examples of the hydrophobic layer 16 may be selected from the group consisting of a fluorinated polymer, a perfluorinated polymer, a silicon polymer, and a mixture thereof. As examples, the hydrophobic layer 16 may include an amorphous fluoropolymer (commercially available examples of which include those in the CYTOP® series from AGC Chemicals, which have one of the following terminal functional groups: A type: —COOH, M type: —CONH—Si(OR)$_n$ or S type: —CF$_3$), a polytetrafluoroethylene (a commercially available example of which is TEFLON® from Chemours), parylen, a fluorinated hydrocarbon, a fluoroacrylic copolymer (a commercially available example of which includes as FLUOROPEL® from Cytonix).

The hydrophobic layer 16 is then imprinted (FIG. 1A) and etched (FIG. 1B) to form the depression 12. As such, in this example, the depression 12 is defined in the hydrophobic layer 16. As shown in FIG. 1B, the bottom of the depression 12 is defined by the resin layer 18 and the walls of the depression 12 are defined by the hydrophobic layer 16. While a single depression 12 is shown in FIG. 1A through FIG. 1C, it is to be understood that several depressions 12 may be formed, where each depression 12 is isolated from each other depression 12 by interstitial regions 26 of the hydrophobic layer 16 (see FIG. 2B).

In this example method, imprinting is performed through a portion of the depth of the hydrophobic layer 16; and etching removes a remaining portion of the depth of the hydrophobic layer 16, where the resin layer 18 acts as an etch stop.

The hydrophobic layer 16 may be imprinted using nanoimprint lithography. A nanoimprint lithography mold or working stamp 24 (FIG. 1A) is pressed into the hydrophobic layer 16 while it is soft, which creates an imprint of the working stamp features in the hydrophobic layer 16. The hydrophobic layer 16 may then be cured with the working stamp 24 in place. Curing may be accomplished by exposure to actinic radiation, such as visible light radiation or ultraviolet (UV) radiation, when a radiation-curable hydrophobic material is used; or by exposure to heat when a thermal-curable hydrophobic material is used. Curing may promote polymerization and/or cross-linking. As an example, curing may include multiple stages, including a softbake (e.g., to drive off solvent(s)) and a hardbake. The softbake may take place at a lower temperature, ranging from about 50° C. to about 150° C. The duration of the hardbake may last from about 5 seconds to about 10 minutes at a temperature ranging from about 100° C. to about 300° C. Examples of devices that can be used for softbaking and/or hardbaking include a hot plate, oven, etc.

After curing, the working stamp 24 is released. This creates topographic features in the hydrophobic layer 16. In this example method, the working stamp 24 does not extend through the entire depth of the hydrophobic layer 16, and thus a partial depression 12' is formed after the imprinting process. As shown in FIG. 1A, a hydrophobic layer portion 16' remains in the partial depression 12'.

The hydrophobic layer 16 may then be etched to remove the remaining hydrophobic layer portion 16' from the partial depression 12'. Any exposed areas of the hydrophobic layer 16 may be etched during this process, as indicated by the downward arrows in FIG. 1B. As such, the areas of the hydrophobic layer 16 that define the interstitial regions 26 may be etched in addition to the hydrophobic layer portion 16'. However, the hydrophobic layer 16 and the resin layer 18 have different etch rates, and thus the resin layer 18 acts as an etch stop in the partial depression 12' when the hydrophobic layer portion 16' is removed. Etching can be stopped when the resin layer 18 is exposed. This forms the depression 12. For this etching process, plasma etching with air or oxygen ($O_2$) gas may be used. In another example, dry etching with oxygen ($O_2$) gas may be used.

Figure 2A:
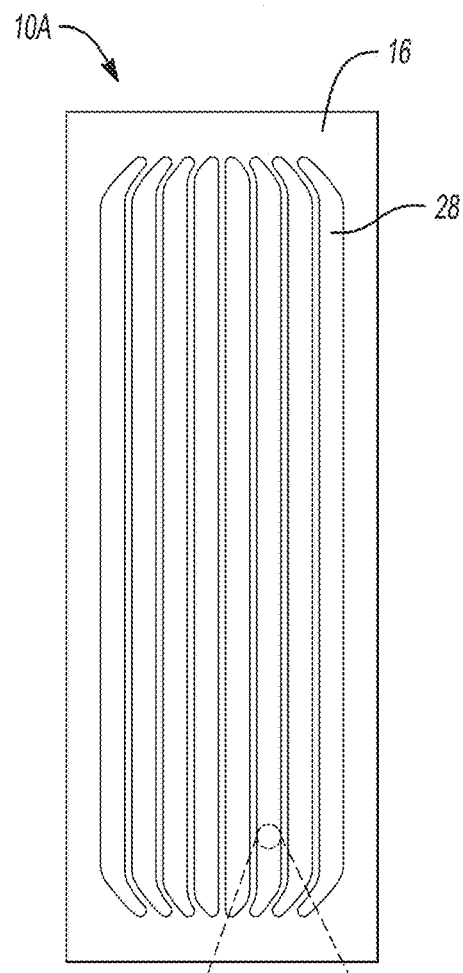
FIG. 2A is a top view of an example of a flow cell.
Figure 2B:
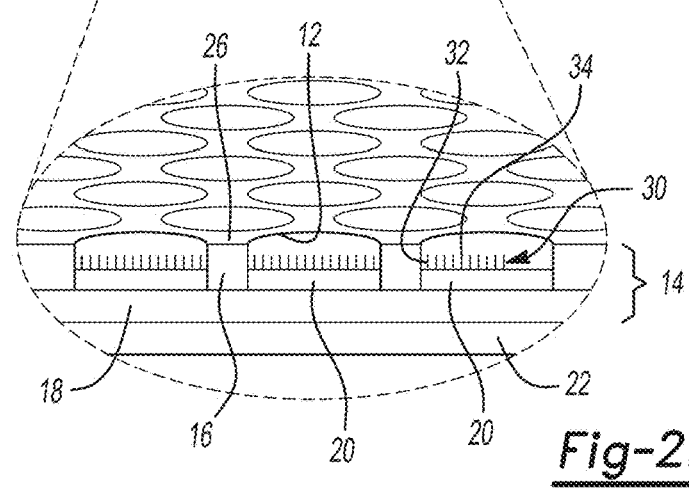
FIG. 2B is an enlarged, and partially cutaway view of an example of a lane of the flow cell including an array of depressions.

While FIG. 1A through FIG. 1C illustrate the formation of a single depression 12, it is to be understood that an array of depressions 12 may be formed, e.g., along a lane of a flow cell 10A. FIG. 2A depicts a top view of the flow cell 10A, e.g., without a lid or other substrate bonded thereto, which includes eight lanes 28. FIG. 2B depicts a cross-sectional and perspective view of the array of depressions 12 formed in one lane 28.

Many different layouts for an array of depressions 12 may be envisaged, including regular, repeating, and non-regular patterns. In an example, the depressions 12 are disposed in a hexagonal grid for close packing and improved density. Other layouts may include, for example, rectilinear (rectangular) layouts, triangular layouts, and so forth. In some examples, the layout or pattern can be an x-y format of depressions 12 that are in rows and columns. In some other examples, the layout or pattern can be a repeating arrangement of depressions 12 and/or interstitial regions 26. In still other examples, the layout or pattern can be a random arrangement of depressions 12 and/or interstitial regions 26. The pattern may include spots, stripes, swirls, lines, triangles, rectangles, circles, arcs, checks, plaids, diagonals, arrows, squares, and/or cross-hatches.

The layout or pattern of the depressions 12 may be characterized with respect to the density of the depressions 12 (number of depressions 12) in a defined area. For example, the depressions 12 may be present at a density of approximately 2 million per $mm^2$. The density may be tuned to different densities including, for example, a density of about 100 per $mm^2$, about 1,000 per $mm^2$, about 0.1 million per $mm^2$, about 1 million per $mm^2$, about 2 million per $mm^2$, about 5 million per $mm^2$, about 10 million per $mm^2$, about 50 million per $mm^2$, or more, or less. It is to be further understood that the density of depressions 12 in the hydrophobic layer 16 (or in other layers described herein) can be between one of the lower values and one of the upper values selected from the ranges above. As examples, a high density array may be characterized as having depressions 12 separated by less than about 100 nm, a medium density array may be characterized as having depressions 12 separated by about 400 nm to about 1 μm, and a low density array may be characterized as having depressions 12 separated by greater than about 1 μm. While example densities have been provided, it is to be understood that any suitable densities may be used. The density of the depressions 12 may depend, in part, on the depth of the depressions 12. In some instances, it may be desirable for the spacing between depressions 12 to be even greater than the examples listed herein.

The layout or pattern of the depressions 12 may also or alternatively be characterized in terms of the average pitch, or the spacing from the center of the depression 12 to the center of an adjacent depression 12 (center-to-center spacing) or from the left edge of one depression 12 to the right edge of an adjacent depression 12 (edge-to-edge spacing). The pattern can be regular, such that the coefficient of variation around the average pitch is small, or the pattern can be non-regular in which case the coefficient of variation can be relatively large. In either case, the average pitch can be, for example, about 50 nm, about 0.1 μm, about 0.5 μm, about 1 μm, about 5 μm, about 10 μm, about 100 μm, or more or less. The average pitch for a particular pattern of depressions 12 can be between one of the lower values and one of the upper values selected from the ranges above. In an example, the depressions 12 have a pitch (center-to-center spacing) of about 1.5 μm. While example average pitch values have been provided, it is to be understood that other average pitch values may be used.

The size of each depression 12 may be characterized by its volume, opening area, depth, and/or diameter.

Each depression 12 can have any volume that is capable of confining a fluid. The minimum or maximum volume can be selected, for example, to accommodate the throughput (e.g., multiplexity), resolution, labeled nucleotides, or analyte reactivity expected for downstream uses of the flow cell 10A. For example, the volume can be at least about $1\times10^{-3}$ $\mu m^3$, at least about $1\times10^{-2}$ $\mu m^3$, at least about 0.1 $\mu m^3$, at least about 1 $\mu m^3$, at least about 10 $\mu m^3$, at least about 100 $\mu m^3$, or more. Alternatively or additionally, the volume can be at most about $1\times10^4$ $\mu m^3$, at most about $1\times10^3$ $\mu m^3$, at most about 100 $\mu m^3$, at most about 10 $\mu m^3$, at most about 1 $\mu m^3$, at most about 0.1 $\mu m^3$, or less.

The area occupied by each depression opening can be selected based upon similar criteria as those set forth above for the volume. For example, the area for each depression opening can be at least about $1\times10^{-3}$ $\mu m^2$, at least about $1\times10^{-2}$ $\mu m^2$, at least about 0.1 $\mu m^2$, at least about 1 $\mu m^2$, at least about 10 $\mu m^2$, at least about 100 $\mu m^2$, or more. Alternatively or additionally, the area can be at most about $1\times10^3$ $\mu m^2$, at most about 100 $\mu m^2$, at most about 10 $\mu m^2$, at most about 1 $\mu m^2$, at most about 0.1 $\mu m^2$, at most about $1\times10^{-2}$ $\mu m^2$, or less. The area occupied by each depression opening can be greater than, less than or between the values specified above.

The depth of each depression 12 can large enough to house some of the functionalized layer 20. In an example, the depth may be at least about 0.1 μm, at least about 0.5 μm, at least about 1 μm, at least about 10 μm, at least about 100 μm, or more. Alternatively or additionally, the depth can be at most about $1\times10^3$ μm, at most about 100 μm, at most about 10 μm, or less. In some examples, the depth is about 0.4 μm. The depth of each depression 12 can be greater than, less than or between the values specified above.

In some instances, the diameter or length and width of each depression 12 can be at least about 50 nm, at least about 0.1 μm, at least about 0.5 μm, at least about 1 μm, at least about 10 μm, at least about 100 μm, or more. Alternatively or additionally, the diameter or length and width can be at most about $1\times10^3$ μm, at most about 100 μm, at most about 10 μm, at most about 1 μm, at most about 0.5 μm, at most about 0.1 μm, or less (e.g., about 50 nm). In some examples, the diameter is, or each of the length and width is about 0.4 μm. The diameter or length and width of each depression 12 can be greater than, less than or between the values specified above.

Referring back to FIG. 10, after the hydrophobic layer 16 is imprinted and etched to form the depression(s) 12, the functionalized layer 20 may be deposited.

The functionalized layer 20 may be any gel material that can swell when liquid is taken up and can contract when liquid is removed, e.g., by drying. In an example, the gel material is a polymeric hydrogel. In an example, the polymeric hydrogel includes an acrylamide copolymer, such as poly(N-(5-azidoacetamidylpentyl)acrylamide-co-acrylamide, PAZAM. PAZAM and some other forms of the acrylamide copolymer are represented by the following structure (I):

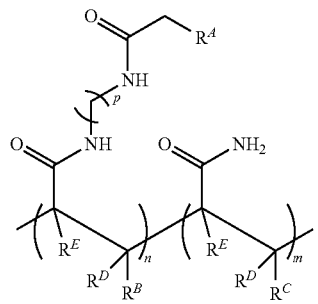

wherein:
  $R^A$ is selected from the group consisting of azido, optionally substituted amino, optionally substituted alkenyl, optionally substituted alkyne, halogen, optionally substituted hydrazone, optionally substituted hydrazine, carboxyl, hydroxy, optionally substituted tetrazole, optionally substituted tetrazine, nitrile oxide, nitrone, sulfate, and thiol;

$R^B$ is H or optionally substituted alkyl;

$R^C$, $R^D$, and $R^E$ are each independently selected from the group consisting of H and optionally substituted alkyl;

each of the —$(CH_2)_p$— can be optionally substituted;

p is an integer in the range of 1 to 50;

n is an integer in the range of 1 to 50,000; and m is an integer in the range of 1 to 100,000.

One of ordinary skill in the art will recognize that the arrangement of the recurring "n" and "m" features in structure (I) are representative, and the monomeric subunits may be present in any order in the polymer structure (e.g., random, block, patterned, or a combination thereof).

The molecular weight of PAZAM and other forms of the acrylamide copolymer may range from about 5 kDa to about 1500 kDa or from about 10 kDa to about 1000 kDa, or may be, in a specific example, about 312 kDa.

In some examples, PAZAM and other forms of the acrylamide copolymer are linear polymers. In some other examples, PAZAM and other forms of the acrylamide copolymer are a lightly cross-linked polymers.

In other examples, the initial polymeric hydrogel may be a variation of the structure (I). In one example, the acrylamide unit may be replaced with N,N-dimethylacrylamide

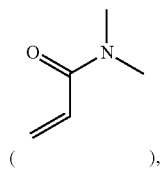

In this example, the acrylamide unit in structure (I) may be replaced with

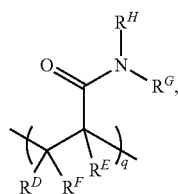

where $R^D$, $R^E$, and $R^F$ are each H or a C1-C6 alkyl, and $R^G$ and $R^H$ are each a C1-C6 alkyl (instead of H as is the case with the acrylamide). In this example, q may be an integer in the range of 1 to 100,000. In another example, the N,N-dimethylacrylamide may be used in addition to the acrylamide unit. In this example, structure (I) may include

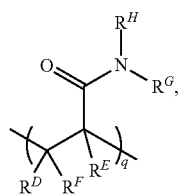

in addition to the recurring "n" and "m" features, where $R^D$, $R^E$, and $R^F$ are each H or a C1-C6 alkyl, and $R^G$ and $R^H$ are each a C1-C6 alkyl. In this example, q may be an integer in the range of 1 to 100,000.

As another example of the polymeric hydrogel, the recurring "n" feature in structure (I) may be replaced with a monomer including a heterocyclic azido group having structure (II):

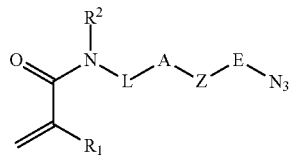

wherein $R^1$ is H or a C1-C6 alkyl; $R_2$ is H or a C1-C6 alkyl; L is a linker including a linear chain with 2 to 20 atoms selected from the group consisting of carbon, oxygen, and nitrogen and 10 optional substituents on the carbon and any nitrogen atoms in the chain; E is a linear chain including 1 to 4 atoms selected from the group consisting of carbon, oxygen and nitrogen, and optional substituents on the carbon and any nitrogen atoms in the chain; A is an N substituted amide with an H or a C1-C4 alkyl attached to the N; and Z is a nitrogen containing heterocycle. Examples of Z include 5 to 10 carbon-containing ring members present as a single cyclic structure or a fused structure. Some specific examples of Z include pyrrolidinyl, pyridinyl, or pyrimidinyl.

As still another example, the initial polymeric hydrogel may include a recurring unit of each of structure (III) and (IV):

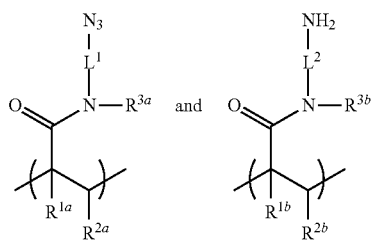

wherein each of $R^{1a}$, $R^{2a}$, $R^{1b}$ and $R^{2b}$ is independently selected from hydrogen, an optionally substituted alkyl or optionally substituted phenyl; each of $R^{3a}$ and $R^{3b}$ is independently selected from hydrogen, an optionally substituted alkyl, an optionally substituted phenyl, or an optionally substituted C7-C14 aralkyl; and each $L^1$ and $L^2$ is independently selected from an optionally substituted alkylene linker or an optionally substituted heteroalkylene linker.

It is to be understood that other molecules may be used to form the functionalized layer 20, as long as they are functionalized to graft oligonucleotide primers thereto. Other examples of suitable functionalized layers include those having a colloidal structure, such as agarose; or a polymer mesh structure, such as gelatin; or a cross-linked polymer structure, such as polyacrylamide polymers and copolymers, silane free acrylamide (SFA), or an azidolyzed version of SFA. Examples of suitable polyacrylamide polymers may be synthesized from acrylamide and an acrylic acid or an acrylic acid containing a vinyl group, or from monomers that form [2+2] photo-cycloaddition reactions. Still other examples of suitable initial polymeric hydrogels include mixed copolymers of acrylamides and acrylates. A variety of polymer architectures containing acrylic monomers (e.g., acrylamides, acrylates etc.) may be utilized in the examples disclosed herein, such as branched polymers, including star polymers, star-shaped or star-block polymers, dendrimers, and the like. For example, the monomers (e.g., acrylamide, acrylamide containing the catalyst, etc.) may be incorporated, either randomly or in block, into the branches (arms) of a star-shaped polymer.

The gel material of the functionalized layer 20 may be formed using any suitable copolymerization process. The functionalized layer 20 may also be deposited using any of the methods disclosed herein.

The attachment of the functionalized layer 20 to the activated (e.g., silanized or plasma ashed) surfaces of the resin layer 18 may be through covalent bonding. Covalent linking is helpful for maintaining the primer set 30 (FIG. 2B) in the depressions 12 throughout the lifetime of the formed flow cell 10A during a variety of uses. In contrast, the functionalized layer 20 does not attach (e.g., covalently bond) to the hydrophobic layer 16. Rather, the hydrophobic nature of the hydrophobic layer 16 repels the gel material of the functionalized layer 20, and thus does not deposit over the interstitial regions 26 or is loosely applied over the interstitial regions 26. Because of the different interactions in the depression 12 and at the interstitial regions 26, the functionalized layer 20 remains in the depression 12 and can be easily removed (e.g., via sonication, washing, wiping, etc.) from the interstitial regions 26.

In the example flow cell 10A, the primer set 30 is grafted to the functionalized layer 20 in each of the depressions 12. This example primer set 30 includes two different primers 32, 34. It is desirable for the primers 32, 34 to be immobilized to the functionalized layer 20. In some examples, immobilization may be by single point covalent attachment to the functionalized layer 20 at the 5' end of the respective primers 32, 34. Any suitable covalent attachment means known in the art may be used. In some examples, immobilization may be by strong non-covalent attachment.

Examples of terminated primers that may be used include an alkyne terminated primer, a tetrazine terminated primer, an azido terminated primer, an amino terminated primer, an epoxy or glycidyl terminated primer, a thiophosphate terminated primer, a thiol terminated primer, an aldehyde terminated primer, a hydrazine terminated primer, a phosphoramidite terminated primer, a triazolinedione terminated primer, and a biotin-terminated primer. In some specific examples, a succinimidyl (NHS) ester terminated primer may be reacted with an amine at a surface of the functionalized layer 20, an aldehyde terminated primer may be reacted with a hydrazine at a surface of the functionalized layer 20, or an alkyne terminated primer may be reacted with an azide at a surface of the functionalized layer 20, or an azide terminated primer may be reacted with an alkyne or DBCO (dibenzocyclooctyne) at a surface of the functionalized layer 20, or an amino terminated primer may be reacted with an activated carboxylate group or NHS ester at a surface of the functionalized layer 20, or a thiol terminated primer may be reacted with an alkylating reactant (e.g., iodoacetamine or maleimide) at a surface of the functionalized layer 20, a phosphoramidite terminated primer may be reacted with a thioether at a surface of the functionalized layer 20, or a biotin-modified primer may be reacted with streptavidin at a surface of the functionalized layer 20.

Each of the primers 32, 34 has a universal sequence for capture and/or amplification purposes. Examples of the primers 32, 34 include P5 and P7 primers, examples of which are used on the surface of commercial flow cells sold by Illumina Inc. for sequencing, for example, on HISEQ™, HISEQX™, MISEQ™, MISEQDX™, MINISEQ™, NEXTSEQ™, NEXTSEQDX™, NOVASEQ™, ISEQ™, GENOME ANALYZER™, and other instrument platforms. In an example, the P5 and P7 primers include the following:

```
P5: 5' → 3'
                                    (SEQ. ID. NO. 1)
    AATGATACGGCGACCACCGA

P7: 5' → 3'
                                    (SEQ. ID. NO. 2)
    CAAGCAGAAGACGGCATACGA
```

For sequential paired end sequencing, each of these primers 32, 34 may also include a cleavage site. The cleavage sites of the primers 32, 34 may be different from each other so that cleavage of the primers 32, 34 does not take place at the same time. Examples of suitable cleavage sites include enzymatically cleavable nucleobases or chemically cleavable nucleobases, modified nucleobases, or linkers (e.g., between nucleobases). The enzymatically cleavable nucleobase may be susceptible to cleavage by reaction with a glycosylase and an endonuclease, or with an exonuclease. One specific example of the cleavable nucleobase is deoxyuracil (dU), which can be targeted by the USER enzyme. In an example, the uracil base may be incorporated at the $7^{th}$ base position from the 3' end of the P5 primer (P5U) or of the P7 primer (P7U). Other abasic sites may also be used. Examples of the chemically cleavable nucleobases, modified nucleobases, or linkers include 8-oxoguanine, a vicinal diol, a disulfide, a silane, an azobenzene, a photocleavable group, allyl T (a thymine nucleotide analog having an allyl functionality), allyl ethers, or an azido functional ether.

The primer set 30 may be pre-grafted to the gel material (of the functionalized layer 20), and thus may be present in the depressions 12 once the functionalized layer 20 is applied.

In other examples, the primers 32, 34 are not pre-grafted to the functionalized layer 20. In these examples, the primers 32, 34 may be grafted after the functionalized layer 20 is applied. Grafting may be accomplished by flow through deposition (e.g., using a temporarily bound lid), dunk coating, spray coating, puddle dispensing, or by another suitable method that will attach the primer(s) 32, 34 to the functionalized layer 20. Each of these example techniques may utilize a primer solution or mixture, which may include the primer(s) 32, 34 water, a buffer, and a catalyst. With any of the grafting methods, the primers 32, 34 attach to the reactive groups of the functionalized layer 20, and have no affinity for the hydrophobic layer 16.

Figures 3A, 3B:
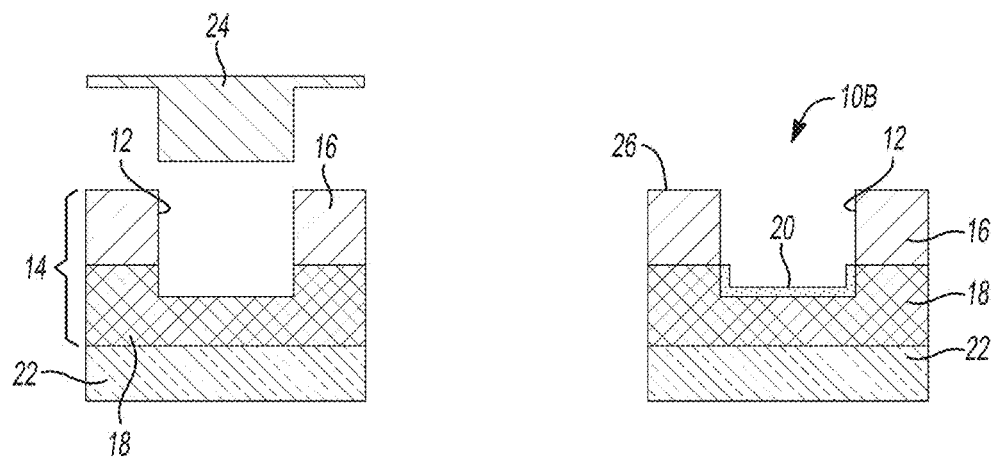
FIG. 3A and FIG. 3B are schematic views that together illustrate another example of the method disclosed herein.

Referring now to FIG. 3A and FIG. 3B, another example of a method for making a flow cell 10B is depicted. This example method includes defining a depression 12 in a multi-layer stack 14 including a hydrophobic layer 16 over a resin layer 18 by imprinting through a depth (or thickness) of the hydrophobic layer 16 and through a portion of a depth (or thickness) of the resin layer 18, and applying a functionalized layer 20 in at least one region of the depression 12.

In the example shown in FIG. 3A, the multi-layer stack 14 is positioned over a base support 22. Any example of the base support 22, the resin layer 18 and the hydrophobic layer 16 described herein may be used in this example.

The resin layer 18 may be deposited over the base support 22 using any suitable deposition technique, including the examples disclosed herein. Unlike the example in FIG. 1A through FIG. 10, however, the resin layer 18 is not yet cured.

Rather, the hydrophobic layer 16 is deposited over the resin layer 18 using any suitable deposition technique.

The hydrophobic layer 16 and the resin layer 18 are then imprinted to form the depression 12, as shown in FIG. 3A. In this example method, imprinting is performed through the entire depth (or thickness) of the hydrophobic layer 16 and through a portion of the depth (or thickness) of the resin layer 18. As shown in FIG. 3A, the working stamp 24 is pressed into the hydrophobic layer 16 and the resin layer 18 while they are soft, which creates an imprint of the working stamp features in the layers 16, 18. Imprinting displaces some of the hydrophobic material and the resin material, but the two materials do not mix. This ensures that the resin layer 18 will be at the bottom surface of the depression 12.

The hydrophobic and resin layers 16, 18 may then be cured with the working stamp 24 in place. Curing may be performed as described herein using suitable conditions for both the hydrophobic and resin layers 16, 18.

After curing, the working stamp 24 is released. This creates topographic features in the hydrophobic and resin layers 16, 18. More specifically, in this example, the depression 12 is defined in the hydrophobic layer 16 and in a portion of the resin layer 18. As shown in FIG. 3A, the bottom of the depression 12 is defined by the resin layer 18 and the walls of the depression 12 are defined by the hydrophobic layer 16 and the resin layer 18. While a single depression 12 is shown in FIG. 3A through FIG. 3C, it is to be understood that several depressions 12 may be formed, where each depression 12 is isolated from each other depression 12 by interstitial regions 26 of the hydrophobic layer 16 (similar to the example shown in FIG. 2B).

In this example method, the exposed resin layer 18 may then be activated using silanization or plasma ashing. It is desirable for the subsequently applied functionalized layer 20 to attach to the exposed resin layer 18 and not to the hydrophobic layer 16. As such, any plasma ashing used in this example method should activate the exposed resin layer 18 and not the hydrophobic layer 16.

The functionalized layer 20 and primer set 30 may then be applied using any of the examples described herein.

Referring now to FIG. 4A through FIG. 4D, another example of a method for making a flow cell 10C is depicted. This example method includes defining a depression 12 in a multi-layer stack 14 including an additional resin layer 38 over a lift-off resist 36, which is over a hydrophobic layer 16, which is over a (first) resin layer 18 by imprinting through a depth (or thickness) of the hydrophobic layer 16, and applying a functionalized layer 20 in at least one region of the depression 12.

Any example of the base support 22, the resin layer 18, and the hydrophobic layer 16 described herein may be used in the example shown in FIG. 4A.

In this example, the resin layer 18 may be deposited over the base support 22, cured, and activated (e.g., via silanization or plasma ashing) as described herein. The hydrophobic layer 16 may then be deposited over the resin layer 18 and cured.

The lift-off resist 36 may then be applied to the hydrophobic layer 16. Examples of suitable lift-off resists 36 include those that are commercially available from Kayaku Advanced Materials, Inc. (formerly MicroChem), which are based on a polymethylglutarimide platform. The lift-off resist 36 may be spun on or otherwise deposited, cured, and subsequently removed at a desirable time in the process (see FIG. 4D).

The additional resin layer 38 may then be applied to the lift-off resist 36. The additional resin layer 38 may be any example set forth herein for the resin layer 18. The additional resin layer 38 may also be deposited using any suitable deposition technique.

The additional resin layer 38 is then imprinted to form a concave region 40 in the additional resin layer 38. As shown in FIG. 4A, the working stamp 24 is pressed into the additional resin layer 38 while it is soft, which creates an imprint of the working stamp features in the additional resin layer 38. The additional resin layer 38 may then be cured with the working stamp 24 in place. Curing may be accomplished by exposure to actinic radiation or heat as described herein.

After curing, the working stamp 24 is released. This creates topographic features in the additional resin layer 38. In this example method, the working stamp 24 does not extend through the entire depth (or thickness) of the additional resin layer 38, and thus a portion 38' of the additional resin layer 38 forms the bottom of the concave region 40.

The concave region 40 is then extended down to a surface of the resin layer 18 by selectively etching the additional resin layer portion 38', a portion of the lift-off resist 36, and a portion of the hydrophobic layer 16. Each of these layers 38 and 36 is selected to have a different etching rate, and thus one layer can act as an etch stop when etching the layer applied directly thereon (e.g., lift-off resist 36 acts as an etch stop when etching the additional resin layer 38). The layers 36 and 16 may have the same etching rate and this may be etched using the same technique. The underlying resin layer 18 may act as an etch stop to the technique used to etch layer 36 and 16.

For the additional resin layer 38, etching may be performed with an anisotropic oxygen plasma or with a 90% $CF_4$ and 10% $O_2$. Any exposed areas of the additional resin layer 38 may be etched during this process, as indicated by the downward arrows in FIG. 4B. However, the lift-off resist 36 acts as an etch stop in the concave region 40 when the additional resin layer portion 38' is removed. This first etching process can be stopped when the lift-off resist 36 is exposed in the concave region 40.

For the portion of the lift-off resist 36 adjacent the concave region 40, 100% $O_2$ plasma etching may be used. Any areas of the lift-off resist 36 that are exposed in the concave region may be etched during this process, as indicated by the downward arrows in FIG. 4B. This etching process will also remove the portion of the hydrophobic layer 16 adjacent the concave region 40. Alternatively, plasma etching with air or dry etching with oxygen ($O_2$) gas may be used to remove the portion of the hydrophobic layer 16. Any areas of the hydrophobic layer 16 that are exposed in the concave region may be etched during this process, as indicated by the central downward arrow in FIG. 4B. The resin layer 18 acts as an etch stop in the concave region 40 when the hydrophobic layer portion is removed.

As depicted in FIG. 4B, other portions of the additional resin layer 38, the lift-off resist 36, and the hydrophobic layer 16 that are adjacent to the concave region 40 remain intact after the various etching processes are performed.

The functionalized layer 20 may then be applied using any of the examples described herein, as shown in FIG. 4C. In this example, the functionalized layer 20 is deposited over the resin layer 18 in the concave region 40 and over the remaining additional resin layer 38.

Lift-off of the remaining lift-off resin 36 may then be performed. As shown in FIG. 4D, the lift-off process removes, e.g., at least 99% of the additional resin layer 38 and the functionalized layer 20 that overlies the remaining lift-off resin 36. This lift-off process may be performed in dimethylsulfoxide (DMSO) using sonication, or in acetone, or with an NMP (N-methyl-2-pyrrolidone) based stripper. The remaining hydrophobic layer 16 is then exposed, and the depression 12 is formed. The functionalized layer 20 remains intact in the depression 12.

While not shown in FIG. 4A through FIG. 4D, it is to be understood that in this example, the primer set 30 (FIG. 2B) may be pre-grafted to the functionalized layer 20, or may be grafted after the application of the functionalized layer (FIG. 4C), or may be grafted after lift-off and formation of the depression 12 (FIG. 4D). If applied after lift-off, it is to be understood that the primers 32, 34 (FIG. 2B) of the primer set 30 have no affinity for the hydrophobic layer 16, and thus selectively graft to the functionalized layer 20 in the depression 12.

While FIG. 4A through FIG. 4D illustrate the formation of a single depression 12, it is to be understood that an array of depressions 12 may be formed, e.g., where each depression 12 is isolated from each other depression 12 by interstitial regions 26 of the hydrophobic layer 16 (similar to the example shown in FIG. 2B).

Referring now to FIG. 5A through FIG. 5E, another example of a method for making a flow cell 10D is depicted. This example method utilizes a multi-layer stack 14 over the base support 22, where the multi-layer stack 14 includes the resin layer 18, a poly(methyl methacrylate) lift-off layer 42, and the additional resin layer 38.

Any example of the base support 22 and the resin layer 18 described herein may be used in the example shown in FIG. 5A.

In this example, the resin layer 18 may be deposited over the base support 22, cured, and activated (e.g., via silanization or plasma ashing) as described herein.

The poly(methyl methacrylate) lift-off layer 42 may then be deposited over the resin layer 18 using any suitable technique, and cured using heat. The poly(methyl methacrylate) lift-off layer 42 is layer of poly(methyl methacrylate). While this example method is described with a poly(methyl methacrylate) lift-off layer 42, it is to be understood that this layer may be another type of lift-off resist. Any of the example lift-off resists for layer 36 may be used instead of the poly(methyl methacrylate) lift-off layer 42.

The additional resin layer 38 may then be applied to the poly(methyl methacrylate) lift-off layer 42. The additional resin layer 38 may be any example set forth herein for the resin layer 18. The additional resin layer 38 may also be deposited using any suitable deposition technique.

The additional resin layer 38 is then imprinted to form a concave region 40 in the additional resin layer 38. As shown in FIG. 5A, the working stamp 24 is pressed into the additional resin layer 38 while it is soft, which creates an imprint of the working stamp features in the additional resin layer 38. The additional resin layer 38 may then be cured with the working stamp 24 in place. Curing may be accomplished by exposure to actinic radiation or heat as described herein.

After curing, the working stamp 24 is released. This creates topographic features in the additional resin layer 38. In this example method, the working stamp 24 does not extend through the entire depth (or thickness) of the additional resin layer 38, and thus a portion 38' of the additional resin layer 38 forms the bottom of the concave region 40.

The concave region 40 is then extended down to a surface of the resin layer 18 by selectively etching the additional resin layer portion 38' and a portion of the poly(methyl methacrylate) lift-off layer 42. Each of these layers 38 and 42 is selected to have a different etching rate, and thus the poly(methyl methacrylate) lift-off layer 42 acts as an etch stop when etching the additional resin layer 38.

For the additional resin layer 38, etching may be performed with an anisotropic oxygen plasma. Any exposed areas of the additional resin layer 38 may be etched during this process, as indicated by the downward arrows in FIG. 5B. As mentioned, the poly(methyl methacrylate) lift-off layer 42 acts as an etch stop in the concave region 40 when the additional resin layer portion 38' is removed. This first etching process can be stopped when the poly(methyl methacrylate) lift-off layer 42 is exposed in the concave region 40.

For the portion of the poly(methyl methacrylate) lift-off layer 42 adjacent the concave region 40, reactive ion etching (e.g., in $O_2$ or $O_2/CHF_3$) or $CF_4/O_2$ plasma etching or 100% $O_2$ plasma etching may be used. Any areas of the poly(methyl methacrylate) lift-off layer 42 that are exposed in the concave region 40 may be etched during this process, as indicated by the downward arrows in FIG. 5B. The resin layer 18 acts as an etch stop in the concave region 40 when the poly(methyl methacrylate) lift-off layer 42 is removed.

As depicted in FIG. 5B, other portions of the additional resin layer 38 and the poly(methyl methacrylate) lift-off layer 42 that are adjacent to the concave region 40 remain intact after the various etching processes are performed.

This example method then involves simultaneously etching the additional resin layer 38, and the resin layer 18 that is exposed in the concave region 40. As such, in this example, the additional resin layer 38 and the resin layer 18 may be the same material or different materials that have the same etch rate. The layers 38, 18 may be etched until the additional resin layer 38 is removed, as shown in FIG. 5C. The poly(methyl methacrylate) lift-off layer 42 functions as an etch stop for the etching process. As shown in FIG. 5C, a portion of the resin layer 18 will be removed, which forms the depression 12 in the resin layer 18. The resin layers 38, 18 may be etched with an anisotropic oxygen plasma or with a 90% $CF_4$ and 10% $O_2$.

In an alternate method, the additional resin layer 38 and the resin layer 18 may have different etch rates. In this example, the additional resin layer 38 may be etched to expose the underlying poly(methyl methacrylate) lift-off layer 42, and then the resin layer 18 may be etched to form the depression 12.

The functionalized layer 20 may then be applied using any of the examples described herein, as shown in FIG. 5D. In this example, the functionalized layer 20 is deposited over the resin layer 18 in the depression 12 and over the remaining poly(methyl methacrylate) lift-off layer 42.

Lift-off of the remaining poly(methyl methacrylate) lift-off layer 42 may then be performed. As shown in FIG. 5E, the lift-off process removes, e.g., at least 99% of the poly(methyl methacrylate) lift-off layer 42 and the functionalized layer 20 that overlies the remaining poly(methyl methacrylate) lift-off layer 42. This lift-off process may be performed in dimethylsulfoxide (DMSO) using sonication, or in acetone, or with an NMP (N-methyl-2-pyrrolidone) based stripper. The removal of the poly(methyl methacrylate) lift-off layer 42 exposes interstitial regions 26 of the resin layer 18 The functionalized layer 20 remains intact in the depression 12, in part because the functionalized layer is covalently attached to the resin 18.

While not shown in FIG. 5A through FIG. 5E, it is to be understood that in this example, the primer set 30 (FIG. 2B) may be pre-grafted to the functionalized layer 20, or may be grafted after the application of the functionalized layer 20 (FIG. 5D), or may be grafted after lift-off (FIG. 5E). If applied after lift-off, it is to be understood that the primers 32, 34 (FIG. 2B) of the primer set 30 have no affinity for the resin layer 18, and thus selectively graft to the functionalized layer 20 in the depression 12.

While FIG. 5A through FIG. 5E illustrate the formation of a single depression 12, it is to be understood that an array of depressions 12 may be formed, e.g., where each depression 12 is isolated from each other depression 12 by interstitial regions 26 of the resin layer 18 (similar to the example shown in FIG. 2B).

Referring now to FIG. 6A through FIG. 6C, another example of a method for making a flow cell 10E is depicted. This example method utilizes a multi-layer stack 14 over the base support 22, where the multi-layer stack 14 includes the additional resin layer 38 positioned over the lift-off resist 36, which is positioned over the functionalized layer 20, which is positioned over the resin layer 18.

Any example of the base support 22 and the resin layer 18 described herein may be used in the example shown in FIG. 6A.

In this example, the resin layer 18 may be deposited over the base support 22, cured, and activated (e.g., via silanization or plasma ashing) as described herein.

The functionalized layer 20 may then be applied using any of the examples described herein, as shown in FIG. 6A. In this example, the functionalized layer 20 is deposited on and attached to the resin layer 18.

The lift-off resist 36 may then be applied to the functionalized layer 20. Any of the lift-off resists disclosed herein may be used. The lift-off resist 36 may, for example, be spun on and cured.

The additional resin layer 38 may then be applied to the lift-off resist 36. The additional resin layer 38 may be any example set forth herein for the resin layer 18. The additional resin layer 38 may also be deposited using any suitable deposition technique.

As shown in FIG. 6A, the additional resin layer 38 is then imprinted to form a convex region 44 in the additional resin layer 38. As shown in FIG. 6A, the working stamp 24 is pressed into the additional resin layer 38 while it is soft, which creates an imprint of the working stamp features in the additional resin layer 38. The additional resin layer 38 may then be cured with the working stamp 24 in place. Curing may be accomplished by exposure to actinic radiation or heat as described herein.

After curing, the working stamp 24 is released. This creates topographic features in the additional resin layer 38. In this example method, the working stamp 24 does not extend through the entire depth (or thickness) of the additional resin layer 38, and thus a portion 38' of the additional resin layer 38 remains adjacent to the convex region 44.

Sequential etching processes are then performed to expose portions of the resin layer 18 that underlie the portion 38' of the additional resin layer 38. The arrows in FIG. 6B generally illustrate areas that may be etched during these processes.

A first of the etching processes removes the portion 38' and some of the additional resin layer 38 in the convex region 44 (e.g., at the top surface of the convex region 44). The underlying lift-off resist 36 acts as an etch stop (e.g., when the portion 38' is removed), as its etch rate is different from the etch rate of the additional resin layer 38. Etching of the additional resin layer 38 may involve an anisotropic oxygen plasma.

The convex region 44 is then extended down to a surface of the resin layer 18 by selectively etching the lift-off resist 36 and the functionalized layer 20. The selective etching process removes portions of the lift-off resist 36 and the functionalized layer 20 that are not underlying the convex region 44.

For the portion of the lift-off resist 36 and the functionalized layer 20 that are removed, 100% $O_2$ plasma etching may be used. Any areas of the lift-off resist 36 and the functionalized layer 20 that are exposed, e.g., adjacent to the convex region 44 may be etched during this process. In this example, the resin layer 18 acts as an etch stop for the lift-off resist etching process. This leaves a portion of the functionalized layer 20 intact beneath the convex region 44 (FIG. 6B).

Lift-off of the remaining lift-off resist 36 may then be performed. As shown in FIG. 6C, the lift-off process removes, e.g., at least 99% of the remaining lift-off resist 36, and the additional resin layer 38 that overlies the remaining lift-off resist 36. This lift-off process may be performed in dimethylsulfoxide (DMSO) using sonication, or in acetone, or with an NMP (N-methyl-2-pyrrolidone) based stripper. The removal of the lift-off resist 36 exposes interstitial regions 26 of the resin layer 18. The functionalized layer 20 (which had been beneath the convex region 44) remains intact over the surface of the resin layer 18.

This example of the flow cell 10E does not include depressions 12. Rather, the functionalized layer 20 forms patches or pads 46 that are isolated by the adjacent interstitial regions 26.

While not shown in FIG. 6A through FIG. 6C, it is to be understood that in this example, the primer set 30 (FIG. 2B) may be pre-grafted to the functionalized layer 20, or may be grafted after the application of the functionalized layer 20 (e.g., prior to the application of the lift-off resist 36), or may be grafted after lift-off (FIG. 6C). If applied after lift-off, it is to be understood that the primers 32, 34 (FIG. 2B) of the primer set 30 have no affinity for the resin layer 18, and thus selectively graft to the functionalized layer 20.

While FIG. 6A through FIG. 6C illustrate the formation of a single functionalized layer 20, it is to be understood that an array of patches or pads 46 may be formed, e.g., where each patch or pad 46 is isolated from each other patch or pad 46 by interstitial regions 26 of the resin layer 18.

Figure 7A:
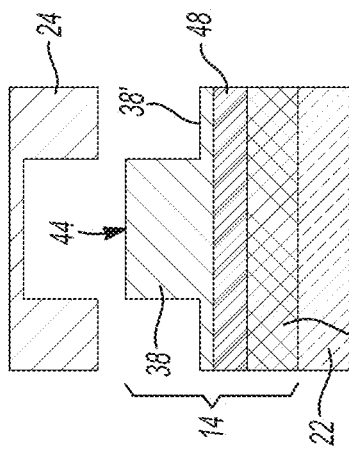
FIG. 7A through FIG. 7N are schematic views that illustrate two additional examples of the method disclosed herein.
Figure 7B:
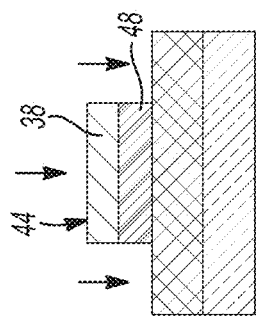
Figure 7C:
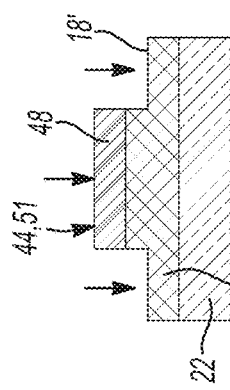
Figure 7D:
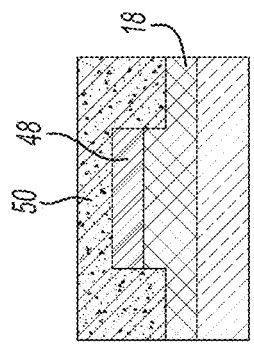
Figure 7E:
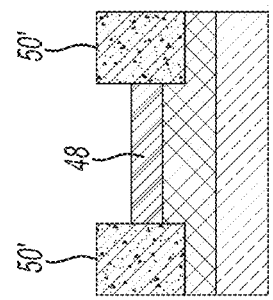
Figure 7F:
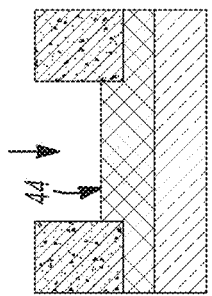
Figure 7G:
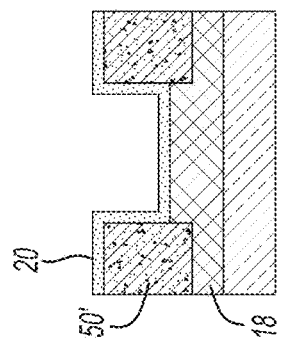
Figure 7H:
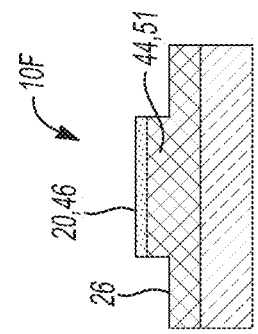
Figures 7I, 7J, 7K, 7L, 7M, 7N:
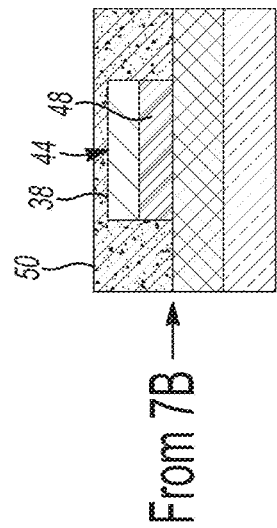

Two other examples of the method for forming examples of the flow cell 10F (FIG. 7H) and 10G (FIG. 7N) are shown in FIG. 7A through 7N. One example method is shown in FIG. 7A through 7H, and the other example method is shown in FIG. 7A, FIG. 7B and FIG. 7I through FIG. 7A. These example methods utilizes a multi-layer stack 14 over the base support 22, where the multi-layer stack 14 includes the additional resin layer 38 positioned over a sacrificial layer 48, which is positioned over the resin layer 18.

Any example of the base support 22 and the resin layer 18 described herein may be used in the example shown in FIG. 7A. In this example, the resin layer 18 may be deposited over the base support 22, cured, and activated (e.g., via silanization or plasma ashing) as described herein.

The sacrificial layer 48 may then be applied. Examples of suitable materials for the sacrificial layer 48 include semi-metals, such as silicon, or metals, such as aluminum, copper, titanium, gold, silver, etc., or negative or positive photoresists. In some examples, the semi-metal or metal may be at least substantially pure (<99% pure). In other examples, molecules or compounds of the listed elements may be used, as they provide the desired etch stop or other function in a particular method. For example, oxides of any of the listed semi-metals (e.g., silicon dioxide) or metals (e.g., aluminum oxide) may be used, alone or in combination with the listed semi-metal or metal. These materials may be deposited using any suitable technique disclosed herein.

The additional resin layer 38 may then be applied to the sacrificial layer 48. The additional resin layer 38 may be any example set forth herein for the resin layer 18. The additional resin layer 38 may also be deposited using any suitable deposition technique.

As shown in FIG. 7A, the additional resin layer 38 is then imprinted to form a convex region 44 in the additional resin layer 38. As shown in FIG. 7A, the working stamp 24 is pressed into the additional resin layer 38 while it is soft, which creates an imprint of the working stamp features in the additional resin layer 38. The additional resin layer 38 may then be cured with the working stamp 24 in place. Curing may be accomplished by exposure to actinic radiation or heat as described herein.

After curing, the working stamp 24 is released. This creates topographic features in the additional resin layer 38. In this example method, the working stamp 24 does not extend through the entire depth (or thickness) of the additional resin layer 38, and thus a portion 38' of the additional resin layer 38 remains adjacent to the convex region 44.

Sequential etching processes are then performed to expose portions of the resin layer 18 that underlie the portion 38' of the additional resin layer 38. The arrows in FIG. 7B generally illustrate areas that may be etched during these processes.

A first of the etching processes removes the portion 38' and some of the additional resin layer 38 in the convex region 44 (e.g., at the top surface of the convex region 44). The underlying sacrificial layer 48 acts as an etch stop (e.g., when the portion 38' is removed), as its etch rate is different from the etch rate of the additional resin layer 38. Etching of the additional resin layer 38 may involve an anisotropic oxygen plasma.

The convex region 44 is then extended down to a surface of the resin layer 18 by selectively etching the exposed portions of the sacrificial layer 48. As examples, an aluminum sacrificial layer 48 can be removed in acidic or basic conditions, a copper sacrificial layer 48 can be removed using $FeCl_3$, a photoresist sacrificial layer 48 can be removed using organic solvents, such as acetone, or in basic (pH) conditions; and a silicon sacrificial layer 48 can be removed in basic (pH) conditions. In this example, the resin layer 18 acts as an etch stop for the sacrificial layer etching process.

One example of the method proceeds from FIG. 7B to FIG. 7C. This example method involves simultaneously etching the additional resin layer 38 (in the convex region 44), and some of the resin layer 18 that is exposed (e.g., around the convex region 44). The arrows in FIG. 7C generally illustrate areas that may be etched during this process.

In some examples, the additional resin layer 38 and the resin layer 18 may be the same material or different materials that have the same etch rate. The resin layers 38, 18 may be etched simultaneously with an anisotropic oxygen plasma or with a 90% $CF_4$ and 10% $O_2$. The layers 38, 18 may be etched until the additional resin layer 38 is removed, as shown in FIG. 7C. The sacrificial layer 48 functions as an etch stop for the etching process. This selective etching is performed through a portion of the depth (or thickness) of the resin layer 18, which forms a protrusion 51 having the shape of the convex region 44. As a result of this etching process, the convex region 44 is extended down into a portion of the resin layer 18, and other portions 18' of the resin layer 18 are exposed.

In an alternate method, the additional resin layer 38 and the resin layer 18 may have different etch rates. In this example, the additional resin layer 38 may be etched to expose the underlying sacrificial layer 48, and then the resin layer 18 may be etched to extend the convex region 44 down into a portion of the resin layer 18 and so that other portions 18' of the resin layer 18 are exposed.

A photoresist 50 may then be applied over the remaining portion of the sacrificial layer 48 and the exposed portions 18' of the resin layer 18. The photoresist 50 may be patterned so that insoluble regions 50' remain over the portions 18' of the resin layer 18, as shown in FIG. 7E. In one example, the photoresist 50 is a negative photoresist (exposed region is insoluble in the developer). An example of suitable negative photoresist includes the NR® series photoresist (available from Futurrex). Other suitable negative photoresists include the SU-8 Series and the KMPR® Series (both of which are available from Kayaku Advanced Materials, Inc.), or the UVN™ Series (available from DuPont). When the negative photoresist is used, it is selectively exposed to certain wavelengths of light to form an insoluble region 50', and is exposed to a developer solution to remove the soluble portions. In this example, light exposure may be through the base support 22 and the resin layer 18 (which are transparent to the light being used), where the sacrificial layer 48 blocks the light. In another example, the photoresist 50 is a positive photoresist (exposed region becomes soluble in the developer). Examples of suitable positive photoresists include the MICROPOSIT® S1800 series or the AZ® 1500 series, both of which are available from Kayaku Advanced Materials, Inc. Another example of a suitable positive photoresist is SPR™-220 (from DuPont). When the positive photoresist is used, it is selectively exposed to certain wavelengths of light to form a soluble region (e.g., which is at least 95% soluble in a developer), and is exposed to a developer solution to remove the soluble portions.

In the example shown in FIG. 7F, the remainder of the sacrificial layer 48 may be etched away. The sacrificial layer 48 may be etched as described herein. The insoluble region(s) 50' of the photoresist 50 may have a different etch rate than the sacrificial layer 48, and thus may remain intact when the sacrificial layer 48 is etched away. Moreover, the resin layer 18 may have a different etch rate than the sacrificial layer 48, and thus the portion of the resin layer 18 underlying the sacrificial layer 48 may act as an etch stop for the sacrificial layer etching process. As shown in FIG. 7F, the removal of the sacrificial layer 48 exposes the portion of the resin layer 18 that is part of the convex region 44.

The functionalized layer 20 may then be applied using any of the examples described herein, as shown in FIG. 7G. In this example, the functionalized layer 20 is deposited over the resin layer 18 in the convex region 44 and over the insoluble portions 50' of the photoresist 50.

Lift-off of the insoluble portions 50' of the photoresist 50 may then be performed. As shown in FIG. 7H, the lift-off process removes the functionalized layer 20 that overlies the insoluble portions 50'. This lift-off process may be performed in dimethylsulfoxide (DMSO) using sonication, or in acetone, or with an NMP (N-methyl-2-pyrrolidone) based stripper.

In this flow cell 10F, the functionalized layer 20 remains intact on a protrusion 51 (e.g., portion of the convex region 44 defined in the resin layer 18). In an array, it is to be understood that each protrusion 51 is isolated from each other protrusion 51 by interstitial regions 26. The interstitial regions 26 are also defined in the resin layer 18, but have a smaller height than the protrusion(s) 51.

While not shown in FIG. 7A through FIG. 7H, it is to be understood that in this example, the primer set 30 (FIG. 2B) may be pre-grafted to the functionalized layer 20, or may be grafted after the application of the functionalized layer (FIG. 7G), or may be grafted after lift-off and formation of the protrusion 51 (FIG. 7H). If applied after lift-off, it is to be understood that the primers 32, 34 (FIG. 2B) of the primer set 30 have no affinity for the interstitial regions 26, and thus selectively graft to the functionalized layer 20 over the protrusion 51.

Another example of the method proceeds from FIG. 7B to FIG. 7I. In this example method, the photoresist 50 may be applied over the exposed portions of the resin layer 18 and over the convex region 44. The photoresist 50 may be patterned so that insoluble regions 50' remain over the exposed portions of the resin layer 18 and so that the additional resin layer 38 in the convex region 44 is re-exposed. This is shown in FIG. 7J. When the negative photoresist is used in this example, light exposure may be through the base support 22 and the resin layer 18, where the sacrificial layer 48 blocks the light. The base support 22 and resin layer 18 are transparent to the wavelengths of light used.

In the example shown in FIG. 7K, the remainder of the additional resin layer 38 may be etched away. The additional resin layer 38 may be etched as described herein. The insoluble region(s) 50' of the photoresist 50 may have a different etch rate than the additional resin layer 38, and thus may remain intact when the additional resin layer 38 is etched away.

In the example shown in FIG. 7L, the remainder of the sacrificial layer 48 may then be etched away. The sacrificial layer 48 may be etched as described herein. The insoluble region(s) 50' of the photoresist 50 may have a different etch rate than the sacrificial layer 48, and thus may remain intact when the sacrificial layer 48 is etched away. Moreover, the resin layer 18 may have a different etch rate than the sacrificial layer 48, and thus the portion of the resin layer 18 underlying the sacrificial layer 48 may act as an etch stop for the sacrificial layer etching process. As shown in FIG. 7L, the removal of the sacrificial layer 48 exposes a portion of the resin layer 18 that has been underlying the convex region 44.

The functionalized layer 20 may then be applied using any of the examples described herein, as shown in FIG. 7M. In this example, the functionalized layer 20 is deposited over the resin layer 18 that is not covered by the insoluble portions 50' of the photoresist 50.

Lift-off of the insoluble portions 50' of the photoresist 50 may then be performed. As shown in FIG. 7N, the lift-off process removes the functionalized layer 20 that overlies the insoluble portions 50'. This lift-off process may be performed in as described herein.

In this flow cell 10G, the functionalized layer 20 remains intact, and forms patches or pads 46 that are isolated by the adjacent interstitial regions 26. In an array, it is to be understood that each patch or pad 46 is isolated from each other patch or pad 46 by interstitial regions 26.

While not shown in FIG. 7A, FIG. 7B, and FIG. 7I through FIG. 7N, it is to be understood that in this example, the primer set 30 (FIG. 2B) may be pre-grafted to the functionalized layer 20, or may be grafted after the application of the functionalized layer (FIG. 7M), or may be grafted after lift-off and formation of the patch or pad 46 (FIG. 7N). If applied after lift-off, it is to be understood that the primers 32, 34 (FIG. 2B) of the primer set 30 have no affinity for the interstitial regions 26, and thus selectively graft to the functionalized layer 20 of the patch or pad 46.

Methods and Flow Cells for Simultaneous Paired-End Sequencing

An example of the flow cell for simultaneous paired-end sequencing generally includes a substrate; two functionalized layers over at least a portion of the substrate; and different primer sets attached to the two functionalized layers.

In an example, the first primer set includes an un-cleavable first primer and a cleavable second primer; and the second primer set including a cleavable first primer and an un-cleavable second primer. FIG. 8A through FIG. 8D depict different configurations of the primer sets 52A, 52A', 52B, 52B', 52C, 52C', and 52D, 52D' attached to the functionalized layers 20A, 20B.

Each of the first primer sets 52A, 52B, 52C, and 52D includes an un-cleavable first primer 54 or 54' and a cleavable second primer 56 or 56'; and each of the second primer sets 52A', 52B', 52C', and 52D' includes a cleavable first primer 58 or 58' and an un-cleavable second primer 60 or 60'.

The un-cleavable first primer 54 or 54' and the cleavable second primer 56 or 56' are oligo pairs, e.g., where the un-cleavable first primer 54 or 54' is a forward amplification primer and the cleavable second primer 56 or 56' is a reverse amplification primer or where the cleavable second primer 56 or 56' is the forward amplification primer and the un-cleavable first primer 54 or 54' is the reverse amplification primer. In each example of the first primer set 52A, 52B, 52C, and 52D, the cleavable second primer 56 or 56' includes a cleavage site 62, while the un-cleavable first primer 54 or 54' does not include a cleavage site 62.

The cleavable first primer 58 or 58' and the un-cleavable second primer 60 or 60' are also oligo pairs, e.g., where the cleavable first primer 58 or 58' is a forward amplification primer and un-cleavable second primer 60 or 60' is a reverse amplification primer or where the un-cleavable second primer 60 or 60' is the forward amplification primer and the cleavable first primer 58 or 58' is the reverse amplification primer. In each example of the second primer set 52A', 52B', 52C', and 52D', the cleavable first primer 58 or 58' includes a cleavage site 62' or 64, while the un-cleavable second primer 60 or 60' does not include a cleavage site 62' or 64.

It is to be understood that the un-cleavable first primer 54 or 54' of the first primer set 52A, 52B, 52C, 52D and the cleavable first primer 58 or 58' of the second primer set 52A', 52B', 52C', and 52D' have the same nucleotide sequence (e.g., both are forward amplification primers), except that the cleavable first primer 58 or 58' includes the cleavage site 62' or 64 integrated into the nucleotide sequence or into a linker 66' attached to the nucleotide sequence. Similarly, the cleavable second primer 56 or 56' of the first primer set 52A, 52B, 52C, 52D and the un-cleavable second primer 60 or 60' of the second primer set 52A', 52B', 52C', and 52D' have the same nucleotide sequence (e.g., both are reverse amplification primers), except that the cleavable second primer 56 or 56' includes the cleavage site 62 integrated into the nucleotide sequence or into a linker 66 attached to the nucleotide sequence.

It is to be understood that when the first primers 54 and 58 or 54' and 58' are forward amplification primers, the second primers 56 and 60 or 56' and 60' are reverse primers, and vice versa.

Examples of un-cleavable primers 54, 60 or 54', 60' include the P5 and P7 primers as described herein. In some examples, the P5 and P7 primers are un-cleavable primers 54, 60 or 54', 60' because they do not include a cleavage site 62, 62', 64. It is to be understood that any suitable universal sequence can be used as the un-cleavable primers 54, 60 or 54', 60'.

Examples of cleavable primers 56, 58 or 56', 58' include the P5 and P7 (or other universal sequence) primers with the respective cleavage sites 62, 62', 64 incorporated into the respective nucleic acid sequences (e.g., FIG. 8A and FIG. 8C), or into a linker 66', 66 that attaches the cleavable primers 56, 58 or 56', 58' to the respective functionalized layers 20A, 20B (FIG. 8B and FIG. 8D). Examples of suitable cleavage sites 62, 62', 64 include enzymatically cleavable nucleobases or chemically cleavable nucleobases, modified nucleobases, or linkers (e.g., between nucleobases), as described herein.

Each primer set 52A and 52A' or 52B and 52B' or 52C and 52C' or 52D and 52D' is attached to a respective functionalized layer 20A, 20B over the substrate. In some examples, the functionalized layer 20A, 20B have the same surface chemistry, and any of the techniques set forth herein may be used to graft one set of primers 54, 56 or 54', 56' on the functionalized layer 20A, and another set of primers 58, 60 or 58', 60' on the functionalized layer 20B. In other examples, the functionalized layers 20A, 20B include different surface chemistries (e.g., functional groups) that can selectively react with the respective primers 54, 56 or 54', 56' or 58, 60 or 58', 60'. In these other examples, the functionalized layer 20A has a first functional group, and the functionalized layer 20B has a second functional group that is different than the first functional group.

As mentioned, FIG. 8A through FIG. 8D depict different configurations of the primer sets 52A, 52A', 52B, 52B', 52C, 52C', and 52D, 52D' attached to the functionalized layers 20A, 20B. More specifically, FIG. 8A through FIG. 8D depict different configurations of the primers 54, 56 or 54', 56' and 58, 60 or 58', 60' that may be used.

In the example shown in FIG. 8A, the primers 54, 56 and 58, 60 of the primer sets 52A and 52A' are directly attached to the functionalized layers 20A, 20B, for example, without a linker 66, 66'. The functionalized layer 20A may have surface functional groups that can immobilize the terminal groups at the 5' end of the primers 54, 56. Similarly, the functionalized layer 20B may have surface functional groups that can immobilize the terminal groups at the 5' end of the primers 58, 60. In one example, the immobilization chemistry between the functionalized layer 20A and the primers 54, 56 and the immobilization chemistry between the functionalized layer 20B and the primers 58, 60 may be different so that the primers 54, 56 or 58, 60 selectively attach to the desirable layer 20A or 20B. In another example, the immobilization chemistry may be the same for the layers 20A or 20B and the respective primers 54, 56 or 58, 60, and a patterning technique may be used to graft one primer set 52A, 52A' at a time. In still another example, the materials applied to form the functionalized layers 20A, 20B may have the respective primers 54, 56 or 58, 60 pre-grafted thereto, and thus the immobilization chemistries may be the same or different.

In this example, immobilization may be by single point covalent attachment to the respective functionalized layer 20A, 20B at the 5' end of the respective primers 54 and 56 or 58 and 60. Any suitable covalent attachment means known in the art may be used, examples of which are set forth herein for the primers 32, 34.

Also in the example shown in FIG. 8A, the cleavage site 62, 62' of each of the cleavable primers 56, 58 is incorporated into the sequence of the primer. In this example, the same type of cleavage site 62, 62' is used in the cleavable primers 56, 58 of the respective primer sets 52A, 52A'. As an example, the cleavage sites 62, 62' are uracil bases, and the cleavable primers 56, 58 are P5U and P7U. In this example, the un-cleavable primer 54 of the oligo pair 54, 56 may be P7, and the un-cleavable primer 60 of the oligo pair 58, 60 may be P5. Thus, in this example, the first primer set 52A includes P7, P5U and the second primer set 52A' includes P5, P7U. The primer sets 52A, 52A' have opposite linearization chemistries, which, after amplification, cluster generation, and linearization, allows forward template strands to be formed on one functionalized layer 20A or 20B and reverse strands to be formed on the other functionalized layer 20B or 20A.

In the example shown in FIG. 8B, the primers 54', 56' and 58', 60' of the primer sets 52B and 52B' are attached to the functionalized layers 20A, 20B, for example, through linkers 66, 66'. The functionalized layer 20A may have surface functional groups that can immobilize the linker 66 at the 5' end of the primers 54', 56'. Similarly, the functionalized layer 20B may have surface functional groups that can immobilize the linker 66' at the 5' end of the primers 58', 60'. In one example, the immobilization chemistry for the functionalized layer 20A and the linkers 66 and the immobilization chemistry for the region 16 and the linkers 66' may be different so that the primers 18', 20' or 19', 21' selectively graft to the desirable functionalized layer 20A or 20B. In another example, the immobilization chemistry may be the same for the functionalized layers 20A, 20B and the linkers 66, 66', and any suitable technique disclosed herein may be used to graft one primer set 52B, 52B' at a time. In still another example, the materials applied to form the functionalized layers 20A, 20B may have the respective primers 54', 56' and 58', 60' pre-grafted thereto, and thus the immobilization chemistries may be the same or different. Examples of suitable linkers 66, 66' may include nucleic acid linkers (e.g., 10 nucleotides or less) or non-nucleic acid linkers, such as a polyethylene glycol chain, an alkyl group or a carbon chain, an aliphatic linker with vicinal diols, a peptide linker, etc. An example of a nucleic acid linker is a polyT spacer, although other nucleotides can also be used. In one example, the spacer is a 6T to 10T spacer. The following are some examples of nucleotides including non-nucleic acid linkers (where B is the nucleobase and "oligo" is the primer):

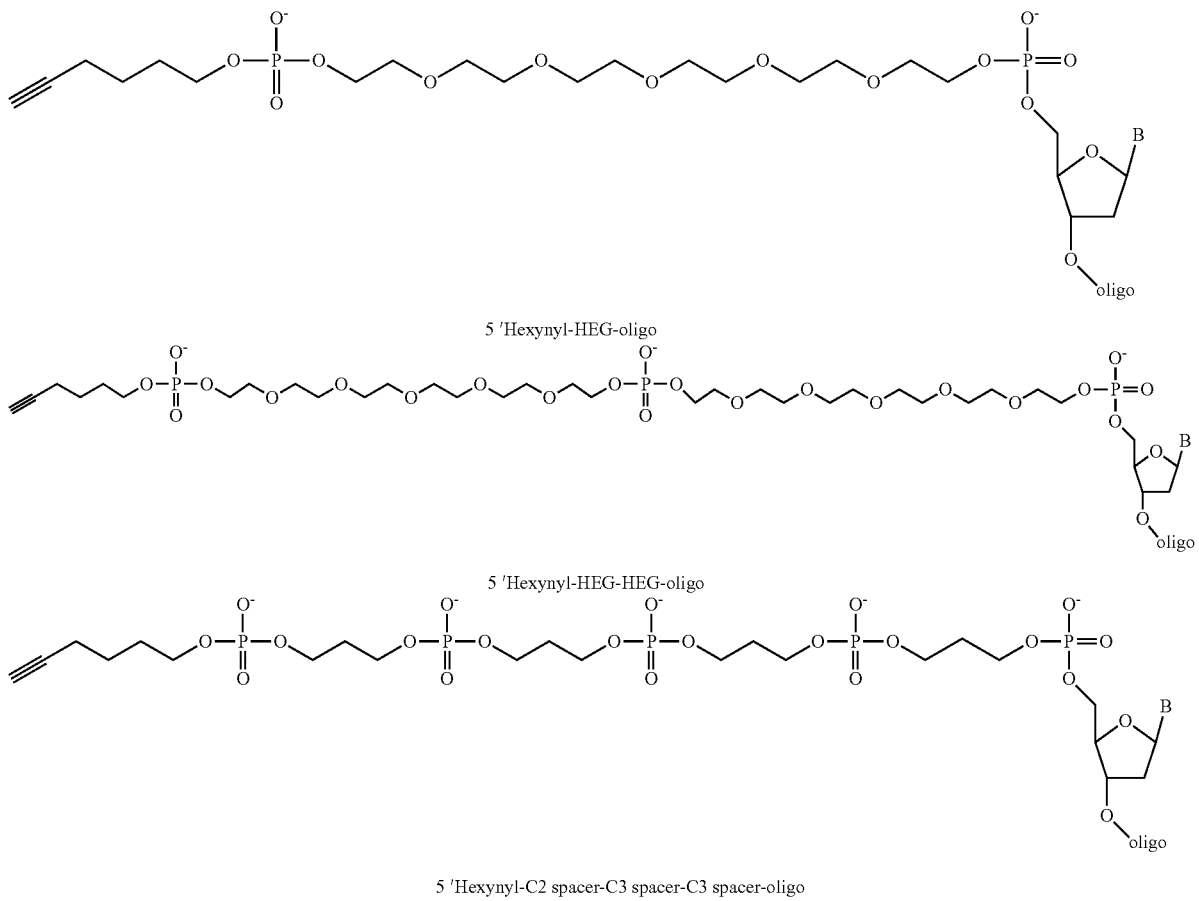

In the example shown in FIG. 8B, the primers 54', 58' have the same sequence (e.g., P5) and the same or different linker 66, 66'. The primer 54' is un-cleavable, whereas the primer 58' includes the cleavage site 62' incorporated into the linker 66'. Also in this example, the primers 56', 60' have the same sequence (e.g., P7) and the same or different linker 66, 66'. The primer 60' is un-cleavable, and the primer 56' includes the cleavage site 62 incorporated into the linker 66. The same type of cleavage site 62, 62' is used in the linker 66, 66' of each of the cleavable primers 56', 58'. As an example, the cleavage sites 62, 62' may be uracil bases that are incorporated into nucleic acid linkers 66, 66'. The primer sets 52B, 52B' have opposite linearization chemistries, which, after amplification, cluster generation, and linearization, allows forward template strands to be formed on one functionalized layer 20A or 20B and reverse strands to be formed on the other functionalized layer 20B or 20A.

The example shown in FIG. 8C is similar to the example shown in FIG. 8A, except that different types of cleavage sites 62, 64 are used in the cleavable primers 56, 58 of the respective primer sets 52C, 52C'. As examples, two different enzymatic cleavage sites may be used, two different chemical cleavage sites may be used, or one enzymatic cleavage site and one chemical cleavage site may be used. Examples of different cleavage sites 62, 64 that may be used in the respective cleavable primers 56, 58 include any combination of a vicinal diol, a uracil, an allyl ether, a disulfide, a restriction enzyme site, and 8-oxoguanine.

The example shown in FIG. 8D is similar to the example shown in FIG. 8B, except that different types of cleavage sites 62, 64 are used in the linkers 66, 66' attached to the cleavable primers 56', 58' of the respective primer sets 52D, 52D'. Examples of different cleavage sites 62, 64 that may be used in the respective in the linkers 66, 66' attached to the cleavable primers 56', 58' include any combination of a vicinal diol, a uracil, an allyl ether, a disulfide, a restriction enzyme site, and 8-oxoguanine.

In any of the examples shown in FIG. 8A through FIG. 8D, the attachment of the primers 54, 56 and 58, 60 or 54', 56' and 58', 60' to the functionalized layers 20A, 20B leaves a template-specific portion of the primers 54, 56 and 58, 60 or 54', 56' and 58', 60' free to anneal to its cognate template and the 3' hydroxyl group free for primer extension.

The functionalized layers 20A, 20B represent different areas of the substrate that have different primer sets 52A, 52A', or 52B, 52B', or 52C, 52C', or 52D, 52D' attached thereto. The functionalized layers 20A, 20B may include materials with different functional groups. In some instances the different functional groups are surface functional groups of the substrate or functional groups that have been introduced to a surface of the substrate, or may be functional groups of another component (e.g., a polymer layer, a bead, etc.) that is deposited over the substrate.

In some examples, the functionalized layers 20A, 20B are chemically the same, and any technique disclosed herein may be used to sequentially attach the primers 54, 56 and 58, 60 or 54', 56' and 58', 60' of the respective sets 52A and 52A', or 52B and 52B', or 52C and 52C', or 52D and 52D' to the functionalized layers 20A, 20B.

In still another example, the materials applied to form the functionalized layers 20A, 20B may have the respective primers 54, 56 or 58, 60 pre-grafted thereto, and thus the immobilization chemistries may be the same or different.

The configuration of the various components of the flow cell may vary, depending in part upon the method used to generate the flow cell. Several example methods will now be described.

The example of the method shown in FIG. 9A through FIG. 9F may use a single layer substrate 68 (without base support 22), or a multi-layer substrate including the base support 22 with a resin layer 18 thereon. In these figures, the base support 22 is shown in phantom because this support 22 is not present when the single layer substrate 68 is used.

A depression 12 is defined in the single layer substrate 68 or in the resin layer 18. While a single depression 12 is shown, it is to be understood that a flow cell 10H (FIG. 9F) may include a plurality of depressions 12, similar to that shown in FIG. 2B.

The depression 12 may be formed in the single layer substrate 68 using any suitable technique, such as photolithography, nanoimprint lithography (NIL), stamping techniques, laser-assisted direct imprinting (LADI) embossing techniques, molding techniques, microetching techniques, etc. The technique used will depend, in part, upon the type of material used. For example, the depression 12 may be microetched into a glass single layer substrate.

The depression 12 may be formed in the resin layer 18 of the multi-layer substrate using any suitable technique, such as nanoimprint lithography (NIL) or photolithography, etc. The technique used will depend, in part, upon the type of material used.

One example of forming the depression 12 in the resin layer 18 is depicted in FIG. 10. In this example, the working stamp 24 is pressed into the resin layer 18 while it is soft, which creates an imprint of the working stamp features in the resin layer 18. The resin layer 18 may then be cured with the working stamp 24 in place. Curing may be accomplished by exposure to actinic radiation or heat as described herein. After curing, the working stamp 24 is released. This creates the depression 12 in the resin layer 18.

Another example of forming the depression 12 in the resin layer 18 utilizes a photoresist 50. In this example the photoresist 50 is applied over the resin layer 18 and is developed (through light exposure and a developer solution as described herein) to define a depression pattern where (developer) soluble photoresist is removed and an interstitial pattern where (developer) insoluble photoresist regions 50' remain over the resin layer 18. FIG. 11 depicts the depression pattern 70 and the interstitial pattern 72. From a top view, the depression pattern 70 has the same shape as the final depression(s) 12, and the interstitial pattern 72 has the same shape as the interstitial region(s) 26.

The resin layer 18 is then etched (indicated by the arrow in FIG. 11) at the depression pattern 70. The insoluble photoresist regions 50' act as an etch mask. The resin layer 18 may be etched as described herein. Etching may be performed so that a portion of the resin layer 18 remains in the bottom of the depression 12, as depicted in FIG. 11. The insoluble photoresist regions 50' may then be removed, e.g., by a lift-off technique. Referring back to FIG. 9A, removal of the insoluble photoresist regions 50' exposes the interstitial regions 26.

Depending upon the single layer substrate 68 or resin layer 18 that is used, activation of the exposed surfaces using silanization or plasma ashing may be performed to generate surface groups that can react with the functionalized layers 20A, 20B subsequently deposited over the single layer substrate 68 or resin layer 18 (see, e.g., FIG. 9E).

With the depression 12 formed in the single layer substrate 68 or resin layer 18, this example method continues with the application of a sacrificial layer 48 over a portion of the depression 12. This is depicted in FIG. 9B. Any example of the sacrificial layer 48 disclosed herein may be used.

The applied sacrificial layer 48 defines a pattern for one of the functionalized layers 20B that is to be subsequently applied to the covered portion of the depression 12. As such, the sacrificial layer 48 may be applied so that it covers a portion of the depression 12, including some of the sidewalls and some of the bottom, while leaving another portion 74 of the depression 12 exposed. The sacrificial layer 48 may also be applied over the interstitial region(s) 26 that is/are adjacent to the sidewall(s) being coated. Coating the interstitial regions 26 may be desirable to ensure that the top most portion of the depression sidewall will be available for subsequent deposition of the functionalized layer 20B.

In some examples, the sacrificial layer 48 may be fabricated using photolithography process combines with either a lift-off technique or an etching technique. In other examples, selective deposition techniques, such as chemical vapor deposition (CVD) and variations thereof (e.g., low-pressure CVD or LPCVD), atomic layer deposition (ALD), and masking techniques, may be used to deposit the sacrificial layer 48 in the desirable areas. Alternatively, the sacrificial layer 48 may be applied across the single layer substrate 68 or the resin layer 18 (including over all of the depression 12), and then selectively removed (e.g., via masking and etching) from the portion 74 to define the pattern for one of the functionalized layers 20B.

As shown in FIG. 9C, the functionalized layer 20A may then be applied using any of the deposition techniques set forth herein. In this example, the functionalized layer 20A is deposited over the exposed surfaces of the single layer substrate 68 or the exposed surfaces of the resin layer 18 (including over the portion 74 of the depression 12) and over the sacrificial layer 48.

The sacrificial layer 48 is then removed to expose the portion 76 of the depression 12 that had been covered by the sacrificial layer 48. This is shown in FIG. 9D. Any suitable etching technique may be used for the sacrificial layer 48. It is to be understood that the functionalized layer 20A is covalently attached to the single layer substrate 68 or the resin layer 18 and thus is not removed from the single layer substrate 68 or the resin layer 18 during sacrificial layer etching. However, the functionalized layer 20A over the sacrificial layer 48 will be removed. The single layer substrate 68 or the resin layer 18 may function as an etch stop to sacrificial layer etching, e.g., when the single layer substrate 68 or the resin layer 18 has a different etch rate than the sacrificial layer 48.

As shown in FIG. 9E, the functionalized layer 20B may then be applied using any of the deposition techniques disclosed herein. In this example, the functionalized layer 20B is deposited over the exposed portions of the single layer substrate 68 or the exposed portions of the resin layer 18 (including over the portion 76 of the depression 12). In this example, when deposition of the functionalized layer 20B is performed under high ionic strength (e.g., in the presence of 10×PBS, NaCl, KCl, etc.), the second functionalized layer 20B does not deposit on or adhere to the first functionalized layer 20A. As such, the functionalized layer 20B does not contaminate the functionalized layer 20A.

In FIG. 9F, the functionalized layers 20A, 20B over the interstitial regions 26 are removed. This removal involves polishing the functionalized layers 20A, 20B from the interstitial regions 26 or another suitable technique that will not remove the functionalized layers 20A, 20B from the depression 12.

The polishing process may be performed with a chemical slurry (including, e.g., an abrasive, a buffer, a chelating agent, a surfactant, and/or a dispersant) which can remove the functionalized layers 20A, 20B from the interstitial regions 26 without deleteriously affecting the underlying substrate 68 or resin layer 18 at those regions 26. Alternatively, polishing may be performed with a solution that does not include the abrasive particles.

The chemical slurry may be used in a chemical mechanical polishing system to polish the surface of the interstitial regions 26. The polishing head(s)/pad(s) or other polishing tool(s) is/are capable of polishing functionalized layers 20A, 20B that may be present over the interstitial regions 26 while leaving the functionalized layers 20A, 20B in the depression(s) 12 at least substantially intact. As an example, the polishing head may be a Strasbaugh ViPRR II polishing head.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

In some examples, the primers 54, 56 or 54', 56' (not shown in FIG. 9A through FIG. 9F) may be pre-grafted to the functionalized layer 20A. Similarly, the primers 58, 60 or 58', 60' (not shown in FIG. 9A through FIG. 9F) may be pre-grafted to the second functionalized layer 20B. In these examples, additional primer grafting is not performed.

In other examples, the primers 54, 56 or 54', 56' are not pre-grafted to the functionalized layer 20A. In these examples, the primers 54, 56 or 54', 56' may be grafted after the functionalized layer 20A is applied (e.g., at FIG. 9C). In these examples, the primers 58, 60 or 58', 60' may be pre-grafted to the second functionalized layer 20B. Alternatively, in these examples, the primers 58, 60 or 58', 60' may not be pre-grafted to the second functionalized layer 20B. Rather, the primers 58, 60 or 58', 60' may be grafted after the second functionalized layer 20B is applied (e.g., at FIG. 28E), as long as i) the functionalized layer 20B has different functional groups (than functionalized layer 20A) for attaching the primers 58, 60 or 58', 60' or ii) any unreacted functional groups of the functionalized layer 20A have been quenched, e.g., using the Staudinger reduction to amines or additional click reaction with a passive molecule such as hexynoic acid.

When grafting is performed during the method, grafting may be accomplished using any suitable grafting techniques, such as those disclosed herein. With any of the grafting methods, the primers 54, 56 or 54', 56' react with reactive groups of the functionalized layer 20A or the primers 58, 60 or 58', 60' react with reactive groups of the functionalized layer 20B, and have no affinity for the single layer substrate 68 or the resin layer 18.

While FIG. 9A through FIG. 9F illustrate the formation of a single depression 12 with functionalized layers 20A, 20B a therein, it is to be understood that an array of depressions 12 with functionalized layers 20A, 20B therein may be formed, e.g., where each depression 12 is isolated from each other depression by interstitial regions 26 of the single layer substrate 68 or the resin layer 18 (similar to the example shown in FIG. 2B).

The processes of the method shown in FIG. 9B through FIG. 9E may also be performed in conjunction with the example methods shown in FIG. 1A through 10 or in FIG. 3A and FIG. 3B to introduce two functionalized layers 20A and 20B to the depression 12 instead of the one functionalized layer 20. For example, the processes described in reference to FIG. 9B through 9E could be performed after the processes described in reference to FIG. 1B (and instead of the processes described in reference to FIG. 10). For another example, the processes described in reference to FIG. 9B through 9E could be performed after the processes described in reference to FIG. 3A (and instead of the processes described in reference to FIG. 3B). It is to be understood that the two functionalized layers 20A and 20B will not adhere to the hydrophobic layer 16 of FIG. 1B and FIG. 3A, and thus polishing would not be performed.

FIG. 12A through FIG. 12H, FIG. 13A through FIG. 13H, and FIG. 14A through FIG. 14J depict different examples of the method that result in different examples of the flow cell 10I, 10J, 10K, each of which includes functionalized layers 20A and 20B. Each of these methods utilizes a different multi-layer stack 14 over the base support 22.

Generally, each of these methods includes imprinting a resin layer 18 or 38 to form a concave region 40 including a deep portion 78 and a shallow portion 80 defined by a step portion 82, wherein the resin layer 18 or 38 is positioned over a multi-layer stack 14 including at least two layers (e.g., 42 and 48, or 48 and 38, or 42, 48, and 38) having differential etching rates, which is positioned over a base support 22; selectively etching the resin layer 18 or 38 and the at least two layers to form a depression 12 adjacent to the deep portion 78; applying a first functionalized layer 20A to the depression 12; selectively etching the resin layer 18 or 38, the at least two layers, or combinations thereof to expose a region underlying the step portion 82; and applying a second functionalized layer 20B to the exposed region. Each of the methods will now be described in reference to the respective set of figures.

In FIG. 12A through FIG. 12H, the multi-layer stack 14 includes a sacrificial layer 48 over the base support 22, a poly(methyl methacrylate) lift-off layer 42 over the sacrificial layer 48, and the resin layer 18 over the poly(methyl methacrylate) lift-off layer 42.

The surface of the base substrate 22 under the sacrificial layer 48 may function like an ashed support, and thus additional activation may not be performed.

The sacrificial layer 48 may be applied to the base support 22 using any suitable technique disclosed herein. Examples of suitable materials for the sacrificial layer 48 include any of those set forth herein, such as silicon, aluminum, negative or positive photoresists, copper, etc.

The poly(methyl methacrylate) lift-off layer 42 may then be deposited over the sacrificial layer 48 using any suitable technique, and cured using heat.

The resin layer 18 may then be applied to the poly(methyl methacrylate) lift-off layer 42. The resin layer 18 may be any example set forth herein, and may be deposited using any suitable deposition technique.

The resin layer 18 is then imprinted to form a concave region 40, which in this example includes a deep portion 78 and the shallow portion 80 which is defined, in part, by a step portion 82 of the resin layer 18. As shown in FIG. 12A, the working stamp 24 is pressed into the resin layer 18 while it is soft, which creates an imprint of the working stamp features in the resin layer 18. The resin layer 18 may then be cured with the working stamp 24 in place. Curing may be accomplished by exposure to actinic radiation or heat as described herein.

After curing, the working stamp 24 is released. This creates the various topographic features in the resin layer 18. In this example method, the working stamp 24 does not extend through the entire depth (or thickness) of the resin layer 18 at the deep portion 78, and thus a portion 18" of the resin layer 18 forms the bottom of the concave region 40 at the deep portion 78, as shown in FIG. 12A.

A depression 12 (shown in FIG. 12C) is then formed by etching a first portion 18" of the resin layer 18 underlying the deep portion 78; etching a portion of the poly(methyl methacrylate) lift-off layer 42 underlying the deep portion 78; and etching a portion of the sacrificial layer 48 underlying the deep portion 78, thereby forming the depression 12 in the sacrificial layer 48.

Referring to FIG. 12B, the deep portion 78 of the concave region 40 is extended down to a surface of the sacrificial layer 48 by selectively etching the resin layer portion 18" and a portion of the poly(methyl methacrylate) lift-off layer 42 (that underlies the resin layer portion 18"). Each of these layers 18 and 42 is selected to have a different etching rate, and thus the poly(methyl methacrylate) lift-off layer 42 acts as an etch stop when etching the resin layer 18.

For the resin layer 18, etching may be performed with an anisotropic oxygen plasma. Any exposed areas of the resin layer 18 may be etched during this process, as indicated by the downward arrows in FIG. 12B. As mentioned, the poly(methyl methacrylate) lift-off layer 42 acts as an etch stop in the concave region 40 when the resin layer portion 18" is removed. This first etching process can be stopped when the poly(methyl methacrylate) lift-off layer 42 is exposed in the deep portion 78 of the concave region 40, and thus the entire resin layer 18 is not etched away (as depicted in FIG. 12B). Moreover, the depth (or thickness) of the step portion 82 can also be selected prior to imprinting so that the portion of the poly(methyl methacrylate) lift-off layer 42 underlying the step portion 82 is not exposed during this first etching process. As such, the depth (or thickness) of the step portion 82 may be thicker than the depth (or thickness) of the resin layer portion 18".

For the portion of the poly(methyl methacrylate) lift-off layer 42 that underlies the resin layer portion 18", reactive ion etching (e.g., in $O_2$ or $O_2/CHF_3$) or $CF_4/O_2$ plasma etching or 100% $O_2$ plasma etching may be used. Any areas of the poly(methyl methacrylate) lift-off layer 42 that are exposed in the concave region 40 may be etched during this process. The sacrificial layer 48 acts as an etch stop in the deep portion 78 of the concave region 40 when the portion of the poly(methyl methacrylate) lift-off layer 42 is removed. As depicted in FIG. 12B, any covered portions of the poly(methyl methacrylate) lift-off layer 42 remain intact after this etching process is performed.

The deep portion 78 is then further extended down to a surface of the base support 22, which forms a depression 12 in the sacrificial layer 48 adjacent to the deep portion 78. This may involve selectively etching the exposed portions of the sacrificial layer 48 (which are adjacent to the deep portion 78). In this example, the base support 22 acts as an etch stop for the sacrificial layer etching process.

This example method then involves extending the shallow portion 80 of the concave region 40 down to a surface of the sacrificial layer 48 by selectively etching the step portion 82 and another portion of the poly(methyl methacrylate) lift-off layer 42 (that underlies the step portion 82).

For the resin layer 18, etching may again be performed with an anisotropic oxygen plasma. Any exposed areas of the resin layer 18 may be etched during this process, as indicated by the downward arrows in FIG. 12D. The poly(methyl methacrylate) lift-off layer 42 again acts as an etch stop in the concave region 40 when the step portion 82 is removed. This etching process can be stopped when the poly(methyl methacrylate) lift-off layer 42 is exposed in the shallow portion 80 of the concave region 40, and thus the entire resin layer 18 is not etched away (as depicted in FIG. 12D).

For the portion of the poly(methyl methacrylate) lift-off layer 42 that underlies the step portion 82, reactive ion etching (e.g., in $O_2$ or $O_2/CHF_3$) or $CF_4/O_2$ plasma etching or 100% $O_2$ plasma etching may be used. Any areas of the poly(methyl methacrylate) lift-off layer 42 that are exposed in the concave region 40 may be etched during this process. The sacrificial layer 48 acts as an etch stop in the shallow portion 80 of the concave region 40 when the portion of the poly(methyl methacrylate) lift-off layer 42 is removed. As depicted in FIG. 12D, any covered portions of the poly(methyl methacrylate) lift-off layer 42 remain intact after this etching process is performed.

As shown in FIG. 12E, the functionalized layer 20A may then be applied using any suitable deposition technique. In this example, the functionalized layer 20A is deposited over the base support 22 in the depression 12, over any exposed portion of the sacrificial layer 48 and over any exposed portions of the resin layer 18.

The sacrificial layer 48 adjacent to the shallow portion 80 is then removed to expose another portion of the base support 22 that is adjacent to the functionalized layer 20A over the base support 22. This is depicted in FIG. 12F. Any suitable etching technique may be used for the sacrificial layer 48. It is to be understood that the functionalized layer 20A is covalently attached to the base support 22 and thus is not removed during sacrificial layer etching. Moreover, because the resin layer 18 is not susceptible to the sacrificial layer etching, the functionalized layer 20A over the resin layer 18 also is not removed during sacrificial layer etching. However, the functionalized layer 20A over the sacrificial layer 48 will be removed. The single base support 22 may function as an etch stop to sacrificial layer etching, e.g., when the base support 22 has a different etch rate than the sacrificial layer 48.

As shown in FIG. 12G, the functionalized layer 20B may then be applied using any suitable deposition technique. In this example, the functionalized layer 20B is deposited over the exposed portions of the base substrate 22. In this example, when deposition of the functionalized layer 20B is performed under high ionic strength (e.g., in the presence of 10×PBS, NaCl, KCl, etc.), the second functionalized layer 20B does not deposit on or adhere to the first functionalized layer 20A. As such, the functionalized layer 20B does not contaminate the functionalized layer 20A.

Lift-off of the remaining poly(methyl methacrylate) lift-off layer 42 may then be performed. As shown in FIG. 12G, the lift-off process removes the poly(methyl methacrylate) lift-off layer 42 and the resin layer 18 and functionalized layer 20A that overlies the remaining poly(methyl methacrylate) lift-off layer 42. This lift-off process may be performed in dimethylsulfoxide (DMSO) using sonication, or in acetone, or with an NMP (N-methyl-2-pyrrolidone) based stripper. The removal of the poly(methyl methacrylate) lift-off layer 42 exposes any remaining portions of the sacrificial layer 48.

As depicted by the downward arrows in FIG. 12H, remaining portions of the sacrificial layer 48 are then removed using an etching process suitable for the particular sacrificial layer 48. The functionalized layers 20A, 20B remain intact over the base support 22, in part because the functionalized layers 20A, 20B are covalently attached to the base support 22.

In some examples, the primers 54, 56 or 54', 56' (not shown in FIG. 12A through FIG. 12H) may be pre-grafted to the functionalized layer 20A. Similarly, the primers 58, 60 or 58', 60' (not shown in FIG. 12A through FIG. 12H) may be pre-grafted to the second functionalized layer 20B. In these examples, additional primer grafting is not performed.

In other examples, the primers 54, 56 or 54', 56' are not pre-grafted to the functionalized layer 20A. In these examples, the primers 54, 56 or 54', 56' may be grafted after the functionalized layer 20A is applied (e.g., at FIG. 12E). In these examples, the primers 58, 60 or 58', 60' may be pre-grafted to the second functionalized layer 20B. Alternatively, in these examples, the primers 58, 60 or 58', 60' may not be pre-grafted to the second functionalized layer 20B. Rather, the primers 58, 60 or 58', 60' may be grafted after the second functionalized layer 20B is applied (e.g., at FIG. 12G), as long as i) the functionalized layer 20B has different functional groups (than functionalized layer 20A) for attaching the primers 58, 60 or 58', 60' or ii) any unreacted functional groups of the functionalized layer 20A have been quenched, e.g., using the Staudinger reduction to amines or additional click reaction with a passive molecule such as hexynoic acid.

When grafting is performed during the method, grafting may be accomplished using any suitable grafting techniques, such as those disclosed herein. With any of the grafting methods, the primers 54, 56 or 54', 56' react with reactive groups of the functionalized layer 20A or the primers 58, 60 or 58', 60' react with reactive groups of the functionalized layer 20B, and have no affinity for the base support 22.

In this example of the flow cell 10l, the functionalized layers 20A, 20B are not confined within a depression 12 (like in flow cell 10H). Rather, the functionalized layers 20A, 20B form respective patches or pads 46A, 46B that are isolated by adjacent interstitial regions 26 of the base support 22.

While FIG. 12A through FIG. 12H illustrate the formation of a single set of functionalized layers 20A, 46A and 20B, 46B, it is to be understood that an array of patches or pads 46A, 46B may be formed, e.g., where each set of patches or pads 46A, 46B is isolated from each other set of patches or pads 46A, 46B by interstitial regions 26 of the base support 22.

In FIG. 13A through FIG. 13H, the multi-layer stack 14 includes the resin layer 18 over a sacrificial layer 48, which is over an additional resin layer 38, which is over the base support 22.

Prior to forming the multi-layer stack 14 over the base support 22, the base support 22 may be activated using silanization. The surface of the resin layer 38 underlying the sacrificial layer 48 functions like an ashed surface and thus activation of this resin layer 38 is not performed.

The additional resin layer 38 may be deposited over the base support 22 using any suitable deposition technique, including the examples disclosed herein, and cured using conditions suitable for the resin.

The sacrificial layer 48 may be applied to the additional resin layer 38 using any suitable technique disclosed herein.

Examples of suitable materials for the sacrificial layer 48 include silicon, aluminum, negative or positive photoresists, copper, etc.

Figures 13A, 13B, 13C, 13D, 13E, 13F, 13G, 13H:
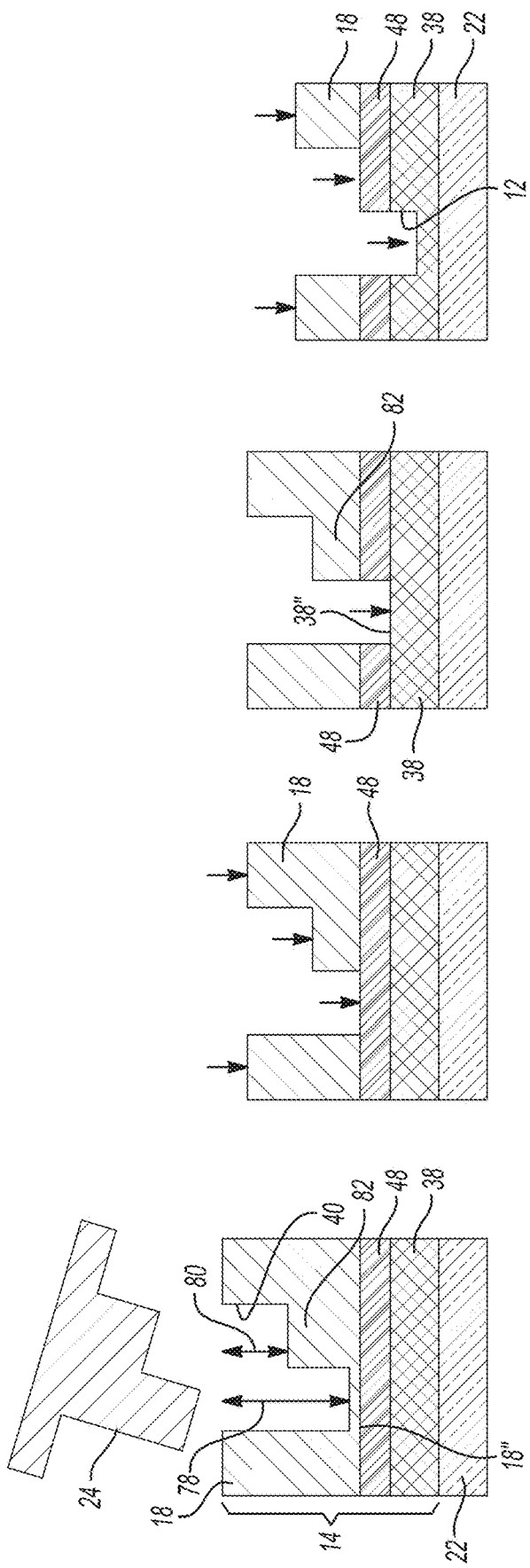
FIG. 13A through FIG. 13H are schematic views that together illustrate still another example of the method disclosed herein.

The resin layer 18 may be deposited over the sacrificial layer 48 using any suitable deposition technique, including the examples disclosed herein. The resin layer 18 is then imprinted to form a concave region 40, which in this example includes the deep portion 78 and the shallow portion 80 which is defined, in part, by a step portion 82 of the resin layer 18. As shown in FIG. 13A, the working stamp 24 is pressed into the resin layer 18 while it is soft, which creates an imprint of the working stamp features in the resin layer 18. The resin layer 18 may then be cured with the working stamp 24 in place. Curing may be accomplished by exposure to actinic radiation or heat as described herein.

After curing, the working stamp 24 is released. This creates the various topographic features in the resin layer 18. In this example method, the working stamp 24 does not extend through the entire depth (or thickness) of the resin layer 18 at the deep portion 78, and thus a portion 18" of the resin layer 18 forms the bottom of the concave region 40 at the deep portion 78.

A depression 12 (shown in FIG. 13D) is then formed by etching a first portion 18" of the resin layer 18 underlying the deep portion 78; etching a portion of the sacrificial layer 48 underlying the deep portion 78, thereby exposing a portion of the additional resin layer 38; and simultaneously etching a second portion (e.g., step portion 82) of the resin layer 18 to expose another portion of the sacrificial layer 48 and ii) the exposed portion 38" of the additional resin layer 38.

Referring to FIG. 13B, the deep portion 78 of the concave region 40 is extended down to a surface of the sacrificial layer 48 by selectively etching the resin layer portion 18". Etching may be performed with an anisotropic oxygen plasma. Any exposed areas of the resin layer 18 may be etched during this process, as indicated by the downward arrows in FIG. 13B. The sacrificial layer 48 acts as an etch stop in the concave region 40 when the resin layer portion 18" is removed. This first etching process can be stopped when the sacrificial layer 48 is exposed in the deep portion 78 of the concave region 40, and thus the entire resin layer 18 is not etched away (as depicted in FIG. 13B). Moreover, the depth (or thickness) of the step portion 82 can also be selected prior to imprinting so that the portion of the sacrificial layer 48 underlying the step portion 82 is not exposed during this first etching process. As such, the depth (or thickness) of the step portion 82 may be thicker than the depth (or thickness) of the resin layer portion 18".

The deep portion 78 is then further extended down to a surface of the additional resin layer 38, as shown in FIG. 13C. This may involve selectively etching the exposed portions of the sacrificial layer 48 (which are adjacent to the deep portion 78). In this example, the additional resin layer 38 acts as an etch stop for the sacrificial layer etching process.

This example method then involves simultaneously etching the resin layer 18, and the portion 38" of the additional resin layer 38 that is exposed in the concave region 40. As such, the portion 38" of the additional resin layer 38 and the resin layer 18 may be the same material or different materials that have the same etch rate. The layers 18, 38 may be etched until the portion of the sacrificial layer 48 underlying the step portion 82 is exposed, as shown in FIG. 3D. The thickness of the step portion 82 remaining after the first etching process (FIG. 13B) is generally thinner than the thickness of the additional resin layer 38. As such, the simultaneously etching process removes the step portion 82 to expose the sacrificial layer 48, but does not extend through the depth (or thickness) of the additional resin layer 38. As shown in FIG. 13D, a portion of the additional resin layer 38 will be removed, which forms the depression 12 in the additional resin layer 38.

In an alternate method, the additional resin layer 38 and the resin layer 18 may have different etch rates. In one example, the step portion 82 of the resin layer 18 may be etched to expose the underlying sacrificial layer 48 and then the additional resin layer 38 (adjacent the deep portion 78) may be removed to form the depression 12. In another example, the additional resin layer 38 (adjacent the deep portion 78) may be removed to form the depression 12, and then the step portion 82 of the resin layer 18 may be etched to expose the underlying sacrificial layer 48.

As shown in FIG. 13E, the functionalized layer 20A may then be applied using any suitable deposition technique. In this example, the functionalized layer 20A is deposited over the additional resin layer 38 in the depression 12, over any exposed portion of the sacrificial layer 48 and over any exposed portions of the resin layer 18.

The sacrificial layer 48 adjacent to the shallow portion 80 is then removed to expose another portion 38''' of the additional resin layer 38 (see FIG. 13F). Any suitable etching technique may be used for the sacrificial layer 48. It is to be understood that the functionalized layer 20A is covalently attached to the additional resin layer 38 and thus is not removed during sacrificial layer etching. Moreover, because the resin layer 18 is not susceptible to the sacrificial layer etching, the functionalized layer 20A over the resin layer 18 also is not removed during sacrificial layer etching. However, the functionalized layer 20A over the sacrificial layer 48 will be removed. The additional resin layer 38 may function as an etch stop to sacrificial layer etching, e.g., when the additional resin layer 38 has a different etch rate than the sacrificial layer 48. The exposed portion 38''' of additional resin layer 38 has not been etched as described in reference to FIG. 13D, and thus is elevated compared to the bottom of the depression 12. This is depicted in FIG. 13F.

As shown in FIG. 13G, the functionalized layer 20B may then be applied using any suitable deposition technique. In this example, the functionalized layer 20B is deposited over the exposed portion 38''' of additional resin layer 38. In this example, when deposition of the functionalized layer 20B is performed under high ionic strength (e.g., in the presence of 10×PBS, NaCl, KCl, etc.), the second functionalized layer 20B does not deposit on or adhere to the first functionalized layer 20A. As such, the functionalized layer 20B does not contaminate the functionalized layer 20A.

The remaining resin layer 18 and sacrificial layer 48 may then be etched, one at a time, using a suitable etchant for the resin layer 18 and then for the sacrificial layer 48. The removal of the remaining resin layer 18 (and any functionalized layer 20A thereon) and sacrificial layer 48 exposes any remaining portions of the additional resin layer 38; which, in this example, are interstitial regions 26. The functionalized layers 20A, 20B remain intact over the additional resin layer 38, in part because the functionalized layers 20A, 20B are covalently attached to the additional resin layer 38.

In some examples, the primers 54, 56 or 54', 56' (not shown in FIG. 13A through FIG. 13H) may be pre-grafted to the functionalized layer 20A. Similarly, the primers 58, 60 or 58', 60' (not shown in FIG. 13A through FIG. 13H) may be pre-grafted to the second functionalized layer 20B. In these examples, additional primer grafting is not performed.

In other examples, the primers 54, 56 or 54', 56' are not pre-grafted to the functionalized layer 20A. In these examples, the primers 54, 56 or 54', 56' may be grafted after the functionalized layer 20A is applied (e.g., at FIG. 13E). In these examples, the primers 58, 60 or 58', 60' may be pre-grafted to the second functionalized layer 20B. Alternatively, in these examples, the primers 58, 60 or 58', 60' may not be pre-grafted to the second functionalized layer 20B. Rather, the primers 58, 60 or 58', 60' may be grafted after the second functionalized layer 20B is applied (e.g., at FIG. 13G), as long as i) the functionalized layer 20B has different functional groups (than functionalized layer 20A) for attaching the primers 58, 60 or 58', 60' or ii) any unreacted functional groups of the functionalized layer 20A have been quenched, e.g., using the Staudinger reduction to amines or additional click reaction with a passive molecule such as hexynoic acid.

When grafting is performed during the method, grafting may be accomplished using any suitable grafting techniques, such as those disclosed herein. With any of the grafting methods, the primers 54, 56 or 54', 56' react with reactive groups of the functionalized layer 20A or the primers 58, 60 or 58', 60' react with reactive groups of the functionalized layer 20B, and have no affinity for the base support 22.

In this example of the flow cell 10J, one of the functionalized layers 20A is confined within the depression 12 and the other of the functionalized layers 20B is defined over a portion of the interstitial region 26 adjacent to the depression 12.

While FIG. 13A through FIG. 13H illustrate the formation of a single set of functionalized layers 20A and 20B, it is to be understood that an array of similar functionalized layers 20A and 20B may be formed, e.g., where each set is isolated from each other set by interstitial regions 26.

In FIG. 14A through FIG. 14J, the multi-layer stack 14 includes the resin layer 18 over a poly(methyl methacrylate) lift-off layer 42, which is over a sacrificial layer 48, which is over an additional resin layer 38, which is over the base support 22.

Prior to forming the multi-layer stack 14 over the base support 22, the base support 22 may be activated using silanization. The surface of the resin layer 38 underlying the sacrificial layer 48 functions like an ashed surface and thus activation of this resin layer 38 is not performed.

The additional resin layer 38 may be deposited over the base support 22 using any suitable deposition technique, including the examples disclosed herein, and cured using conditions suitable for the resin.

The sacrificial layer 48 may be applied to the additional resin layer 38 using any suitable techniques, such as those disclosed herein. Examples of suitable materials for the sacrificial layer 48 include any of those set forth herein, such as silicon, aluminum, negative or positive photoresists, copper, etc.

The poly(methyl methacrylate) lift-off layer 42 may then be deposited over the sacrificial layer 48 using any suitable technique, and cured using heat.

The resin layer 18 may then be applied to the poly(methyl methacrylate) lift-off layer 42. The resin layer 18 may be any example set forth herein, and may be deposited using any suitable deposition technique.

Figures 14A, 14B, 14C:
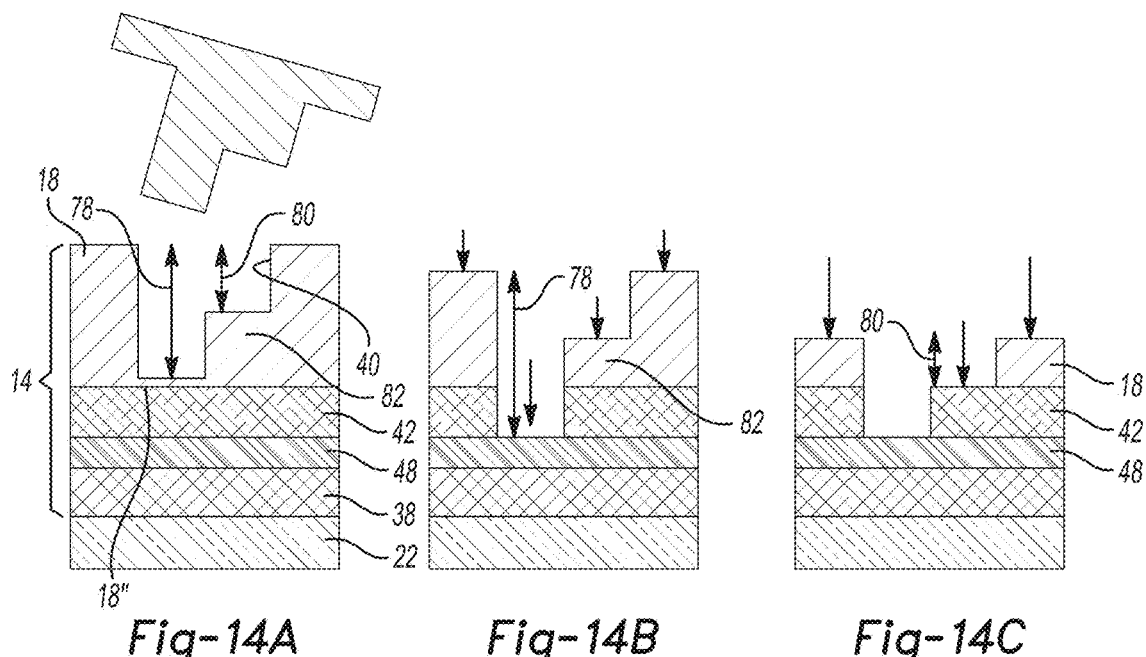
FIG. 14A through FIG. 14J are schematic views that together illustrate a further example of the method disclosed herein.

The resin layer 18 is then imprinted to form a concave region 40, which in this example includes a deep portion 78 and the shallow portion 80 which is defined, in part, by a step portion 82 of the resin layer 18. As shown in FIG. 14A, the working stamp 24 is pressed into the resin layer 18 while it is soft, which creates an imprint of the working stamp features in the resin layer 18. The resin layer 18 may then be cured with the working stamp 24 in place. Curing may be accomplished by exposure to actinic radiation or heat as described herein.

After curing, the working stamp 24 is released. This creates the various topographic features in the resin layer 18. In this example method, the working stamp 24 does not extend through the entire depth of the resin layer 18 at the deep portion 78, and thus a portion 18" of the resin layer 18 forms the bottom of the concave region 40 at the deep portion 78.

Figures 14D, 14E, 14F:
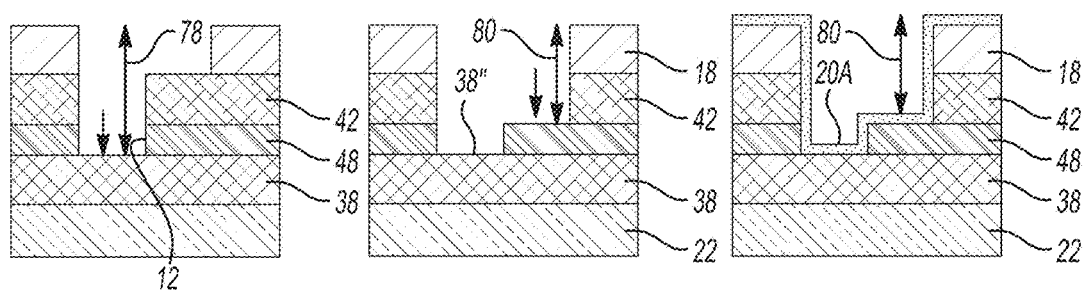

A depression 12 (shown in FIG. 14D) is then formed by etching a first portion 18" of the resin layer 18 underlying the deep portion 78 (FIG. 14B); etching a portion of the poly (methyl methacrylate) lift-off layer 42 underlying the deep portion 78 (FIG. 14B); and etching a portion of the sacrificial layer 48 underlying the deep portion 78 (FIG. 14D).

Referring now to FIG. 14B, the deep portion 78 of the concave region 40 is extended down to a surface of the sacrificial layer 48 by selectively etching the resin layer portion 18" and a portion of the poly(methyl methacrylate) lift-off layer 42 (that underlies the resin layer portion 18"). Each of these layers 18 and 42 is selected to have a different etching rate, and thus the poly(methyl methacrylate) lift-off layer 42 acts as an etch stop when etching the resin layer 18.

For the resin layer 18, etching may be performed with an anisotropic oxygen plasma. Any exposed areas of the resin layer 18 may be etched during this process, as indicated by the downward arrows in FIG. 14B. As mentioned, the poly(methyl methacrylate) lift-off layer 42 acts as an etch stop in the concave region 40 when the resin layer portion 18" is removed. This first etching process can be stopped when the poly(methyl methacrylate) lift-off layer 42 is exposed in the deep portion 78 of the concave region 40, and thus the entire resin layer 18 is not etched away (as depicted in FIG. 12B). Moreover, the depth of the step portion 82 can also be selected prior to imprinting so that the portion of the poly(methyl methacrylate) lift-off layer 42 underlying the step portion 82 is not exposed during this first etching process. As such, the depth of the step portion 82 may be thicker than the depth of the resin layer portion 18".

For the portion of the poly(methyl methacrylate) lift-off layer 42 that underlies the resin layer portion 18", reactive ion etching (e.g., in $O_2$ or $O_2/CHF_3$) or $CF_4/O_2$ plasma etching or 100% $O_2$ plasma etching may be used. Any areas of the poly(methyl methacrylate) lift-off layer 42 that are exposed in the concave region 40 may be etched during this process. The sacrificial layer 48 acts as an etch stop in the deep portion 78 of the concave region 40 when the portion of the poly(methyl methacrylate) lift-off layer 42 is removed. As depicted in FIG. 14B, any covered portions of the poly(methyl methacrylate) lift-off layer 42 remain intact after this etching process is performed.

Prior to etching the sacrificial layer 48 in the deep portion 78, this example method may further include etching the resin layer 18 to remove the step portion 82 and expose a second portion of the poly(methyl methacrylate) lift-off layer 42. This is depicted in FIG. 14C. Etching of the resin layer 18 may be performed as described herein, and the poly(methyl methacrylate) lift-off layer 42 beneath the step portion 82 will act as an etch stop. As the exposed sacrificial layer 48 has a different etch rate than the resin layer 18, it will not be etched during this process (as shown in FIG. 14C).

The deep portion 78 is then further extended down to a surface of the additional resin layer 38, which forms a depression 12 in the additional resin layer 38 adjacent to the deep portion 78. This is shown in FIG. 14D. This process may involve selectively etching the exposed portions of the sacrificial layer 48 (which are adjacent to the deep portion 78). In this example, the additional resin layer 38 acts as an etch stop for the sacrificial layer etching process.

This example method may further include etching the poly(methyl methacrylate) lift-off layer 42 in the shallow portion 80. This is depicted in FIG. 14E. Etching of the exposed portion of the poly(methyl methacrylate) lift-off layer 42 (in the shallow portion 80) may be performed as described herein, and the underlying sacrificial layer 48 will act as an etch stop. As the exposed portion 38" of the additional resin layer 38 has a different etch rate than the poly(methyl methacrylate) lift-off layer 42, it will not be etched during this process (as shown in FIG. 14E).

As shown in FIG. 14F, the functionalized layer 20A may then be applied using any suitable deposition technique. In this example, the functionalized layer 20A is deposited over the exposed portion 38" of the additional resin layer 38 in the depression 12, over any exposed portion of the sacrificial layer 48 and over any exposed portions of the resin layer 18.

Figures 14G, 14H, 14I:
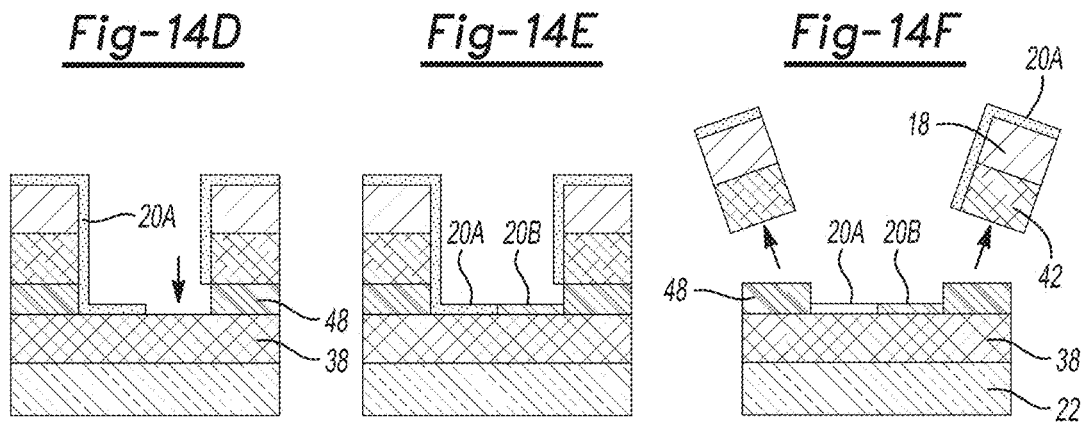

The sacrificial layer 48 adjacent to the shallow portion 80 is then removed to expose another portion of the additional resin layer 38 that is adjacent to the functionalized layer 20A over the additional resin layer 38. This is depicted in FIG. 14G. Any suitable etching technique may be used for the sacrificial layer 48. It is to be understood that the functionalized layer 20A is covalently attached to the additional resin layer 38 and thus is not removed during sacrificial layer etching. Moreover, because the resin layer 18 is not susceptible to the sacrificial layer etching, the functionalized layer 20A over the resin layer 18 also is not removed during sacrificial layer etching. However, the functionalized layer 20A over the sacrificial layer 48 will be removed. The additional resin layer 38 may function as an etch stop to sacrificial layer etching, e.g., when the additional resin layer 38 has a different etch rate than the sacrificial layer 48.

As shown in FIG. 14H, the functionalized layer 20B may then be applied using any suitable deposition technique. In this example, the functionalized layer 20B is deposited over the exposed portions of the additional resin layer 38. In this example, when deposition of the functionalized layer 20B is performed under high ionic strength (e.g., in the presence of 10×PBS, NaCl, KCl, etc.), the second functionalized layer 20B does not deposit on or adhere to the first functionalized layer 20A. As such, the functionalized layer 20B does not contaminate the functionalized layer 20A.

Lift-off of the remaining poly(methyl methacrylate) lift-off layer 42 may then be performed. As shown in FIG. 14I, the lift-off process removes the poly(methyl methacrylate) lift-off layer 42 and the resin layer 18 and functionalized layer 20A that overlies the remaining poly(methyl methacrylate) lift-off layer 42. This lift-off process may be performed in dimethylsulfoxide (DMSO) using sonication, or in acetone, or with an NMP (N-methyl-2-pyrrolidone) based stripper. The removal of the poly(methyl methacrylate) lift-off layer 42 exposes any remaining portions of the sacrificial layer 48.

Figure 14J:
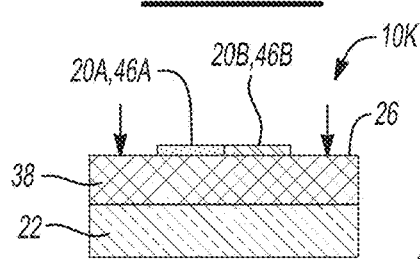

As depicted by the downward arrows in FIG. 14J, any remaining portions of the sacrificial layer 48 are then removed using an etching process suitable for the particular sacrificial layer 48. The functionalized layers 20A, 20B remain intact over the additional resin layer 38, in part because the functionalized layers 20A, 20B are covalently attached to the additional resin layer 38. ***

In some examples, the primers 54, 56 or 54', 56' (not shown in FIG. 14A through FIG. 14J) may be pre-grafted to the functionalized layer 20A. Similarly, the primers 58, 60 or 58', 60' (not shown in FIG. 14A through FIG. 14J) may be pre-grafted to the second functionalized layer 20B. In these examples, additional primer grafting is not performed.

In other examples, the primers 54, 56 or 54', 56' are not pre-grafted to the functionalized layer 20A. In these examples, the primers 54, 56 or 54', 56' may be grafted after the functionalized layer 20A is applied (e.g., at FIG. 14F). In these examples, the primers 58, 60 or 58', 60' may be pre-grafted to the second functionalized layer 20B. Alternatively, in these examples, the primers 58, 60 or 58', 60' may not be pre-grafted to the second functionalized layer 20B. Rather, the primers 58, 60 or 58', 60' may be grafted after the second functionalized layer 20B is applied (e.g., at FIG. 14H), as long as i) the functionalized layer 20B has different functional groups (than functionalized layer 20A) for attaching the primers 58, 60 or 58', 60' or ii) any unreacted functional groups of the functionalized layer 20A have been quenched, e.g., using the Staudinger reduction to amines or additional click reaction with a passive molecule such as hexynoic acid.

When grafting is performed during the method, grafting may be accomplished using any suitable grafting techniques, such as those disclosed herein. With any of the grafting methods, the primers 54, 56 or 54', 56' react with reactive groups of the functionalized layer 20A or the primers 58, 60 or 58', 60' react with reactive groups of the functionalized layer 20B, and have no affinity for the additional resin layer 38.

In this example of the flow cell 10K, the functionalized layers 20A, 20B are not confined within a depression 12 (like in flow cell 10H). Rather, the functionalized layers 20A, 20B form respective patches or pads 46A, 46B that are isolated by adjacent interstitial regions 26 of the additional resin layer 38.

While FIG. 14A through FIG. 14J illustrate the formation of a single set of functionalized layers 20A, 46A and 20B, 46B, it is to be understood that an array of patches or pads 46A, 46B may be formed, e.g., where each set of patches or pads 46A, 46B is isolated from each other set of patches or pads 46A, 46B by interstitial regions 26 of the additional resin layer 38.

Still other example methods for making other examples of the flow cell 10L, 10M are shown in FIG. 15A through FIG. 15K. One method is shown in FIG. 15A through FIG. 15H, and the other method is shown in FIG. 15A through FIG. 15D and FIG. 15I through FIG. 15K. These figures depict the depression 12A defined in a single layer substrate 68. It is to be understood that this method may be used with a multi-layer substrate, including for example, a base support 22 and a resin layer 18 thereon.

As shown at FIG. 15A, the depression 12A defined in the single layer substrate 68 includes a deep portion 78 and a shallow portion 80 which is defined, in part, by a step portion 82. The depression 12A may be defined via imprinting, etching, etc. depending upon the type of substrate 68 that is used. After forming the depression 12A, the single layer substrate 68 may be activated using silanization or plasma ashing to generate surface groups that can react with the functionalized layer 20A subsequently deposited thereon.

As shown in FIG. 15B, a first functionalized layer 20A is applied over the depression 12A. The first functionalized layer 20A may be any of the examples disclosed herein and may be deposited using any of the techniques described herein.

In FIG. 15C through FIG. 15E, the first functionalized layer 20A is then patterned to form a first functionalized region (region 84, shown in FIG. 15E) covered by a photoresist 50. Any photoresist may be used. In other examples, a lift-off resist is used instead of a photoresist.

As shown in FIG. 15C, the photoresist 50 is first applied to the first functionalized layer 20A. The entire photoresist 50 may be developed to form an insoluble portion, so that it can be exposed to an etching process.

A timed dry etching process may then be used to remove portions of the photoresist 50 and the functionalized layer 20A from the single layer substrate 68, including from the surfaces, the shallow portion 80, and from a portion of the deep portion 78. As shown in FIG. 15D, the timed dry etching is stopped so that the first functionalized layer 20A and the photoresist 50 remain in the portion of the deep portion 78 that is next to the step portion 82. In one example, the timed dry etch may involve a reactive ion etch (e.g., with $CF_4$) where the photoresist 50 is etched at a rate of about 17 nm/min. In another example, the timed dry etch may involve a 100% $O_2$ plasma etch where the photoresist 50 is etched at a rate of about 98 nm/min.

During the etching of the photoresist 50, the functionalized layer 20A may also be removed. A combustion reaction may be taking place, where the functionalized layer 20A is converted to carbon dioxide and water and is evacuated from the etching chamber.

As depicted by the downward arrow in FIG. 15E, the single layer substrate 68 may then be etched i) to create interstitial regions 26 that are at least substantially co-planar with the surface of the first functionalized layer 20A and the photoresist region 50 remaining in the portion of the deep portion 78, and ii) to create a second depression 12B next to the first functionalized layer 20A and the photoresist region 50 remaining in the portion of the deep portion 78. This is a dry etching process that is selected based on the material of the single layer substrate 68. This etching process is also timed. In one example, this timed dry etch may involve or with a 90% $CF_4$ and 10% $O_2$ where the single layer substrate 68 is etched at a rate of about 42 nm/min. In another example, the timed dry etch may involve a reactive ion etch (e.g., with $O_2$) where the in single layer substrate 68 is etched at a rate of about 4 nm/min. This process can also remove the first functionalized layer 20A that is not covered by the photoresist 50.

As shown in FIG. 15F, the functionalized layer 20B may then be applied using any suitable deposition technique. In this example, the functionalized layer 20B is deposited over the interstitial regions 26 and the photoresist 50. In this example, any suitable deposition technique may be used, in part because the first functionalized layer 20A is covered.

Removal of the photoresist 50 may then be performed. As shown in FIG. 15G, this process removes the photoresist 50 and the functionalized layer 20B that overlies the remaining photoresist 50. This removal process may be performed in dimethylsulfoxide (DMSO) using sonication, or in acetone, or with an NMP (N-methyl-2-pyrrolidone) based stripper, or another suitable remover for the particular photoresist. This exposes the functionalized layer 20A, and thus the functionalized region 84.

In FIG. 15H, the functionalized layer 20B over the interstitial regions 26 is removed. This removal involves polishing the functionalized layer 20B from the interstitial regions 26 as described herein. This leaves a functionalized region 86 next to the functionalized region 84. FIG. 15H depicts the flow cell 10L.

Referring back to FIG. 15D, the timed dry etching of the photoresist is stopped so that the first functionalized layer 20A and the photoresist 50 remain in the portion of the deep portion 78 that is next to the step portion 82. Unlike the example shown in FIG. 15E, this example method does not include etching away the step portion 82.

Rather, this example method then continues at FIG. 15I, where the functionalized layer 20B may then be applied using any suitable deposition technique. In this example, the functionalized layer 20B is deposited over the interstitial regions 26, the step portion 82, and the photoresist 50. In this example, any suitable deposition technique may be used, in part because the first functionalized layer 20A is covered.

Removal of the photoresist 50 may then be performed. As shown in FIG. 15J, this process removes the photoresist 50 and the functionalized layer 20B that overlies the remaining photoresist 50. This removal process may be performed in dimethylsulfoxide (DMSO) using sonication, or in acetone, or with an NMP (N-methyl-2-pyrrolidone) based stripper, or any other suitable remover for the photoresist 50.

In FIG. 15K, the functionalized layer 20B over the interstitial regions 26 is removed. This removal involves polishing the functionalized layer 20B from the interstitial regions 26 as described herein. Polishing may or may not remove the functionalized layer 20B from the sidewalls of the depression 12A. This leaves a functionalized region 86 next to the functionalized region 84. FIG. 15K depicts the flow cell 10M.

In some examples, the primers 54, 56 or 54', 56' (not shown in FIG. 15A through FIG. 15K) may be pre-grafted to the functionalized layer 20A. Similarly, the primers 58, 60 or 58', 60' (not shown in FIG. 15A through FIG. 15K) may be pre-grafted to the second functionalized layer 20B. In these examples, additional primer grafting is not performed.

In other examples, the primers 54, 56 or 54', 56' are not pre-grafted to the functionalized layer 20A. In these examples, the primers 54, 56 or 54', 56' may be grafted after the functionalized layer 20A is applied (e.g., at FIG. 15B). In these examples, the primers 58, 60 or 58', 60' may be pre-grafted to the second functionalized layer 20B. Alternatively, in these examples, the primers 58, 60 or 58', 60' may not be pre-grafted to the second functionalized layer 20B. Rather, the primers 58, 60 or 58', 60' may be grafted after the second functionalized layer 20B is applied (e.g., at FIG. 15F, 15G, or 15H or at FIG. 15I, FIG. 15J, or FIG. 15K), as long as i) the functionalized layer 20B has different functional groups (than functionalized layer 20A) for attaching the primers 58, 60 or 58', 60' or ii) any unreacted functional groups of the functionalized layer 20A have been quenched, e.g., using the Staudinger reduction to amines or additional click reaction with a passive molecule such as hexynoic acid.

When grafting is performed during the method, grafting may be accomplished using any suitable grafting techniques, such as those disclosed herein. With any of the grafting methods, the primers 54, 56 or 54', 56' react with reactive groups of the functionalized layer 20A or the primers 58, 60 or 58', 60' react with reactive groups of the functionalized layer 20B, and have no affinity for the single layer substrate 68.

In these examples of the flow cell 10L, 10M, the functionalized regions 84, 86 are confined within a depression. In FIG. 15H, the depression includes a portion of 12A and 12B (like in flow cell 10H). In FIG. 15K, the depression is the depression 12A. In an array, respective regions 84, 86 within a depression may be isolated from respective regions 84, 86 within another depression by adjacent interstitial regions 26.

Still another example method for making another example of the flow cell 10N is shown in FIG. 16A through FIG. 16I. These figures depict the depression 12A defined in a resin layer 18 of a multi-layer substrate, including for example, a base support 22 and the resin layer 18 thereon.

At the outset of the method shown in FIG. 16A to FIG. 16I, the base support 22 may be activated using silanization or plasma ashing to generate surface groups that can react with the functionalized layers 20A, 20B.

As shown at FIG. 16A, the depression 12A defined in the resin layer 18 includes a deep portion 78 and a shallow portion 80 which is defined, in part, by a step portion 82. The depression 12A may be defined via imprinting, etching, etc. depending upon the type of resin layer 18 that is used.

Referring to FIG. 16B, the deep portion 78 of the depression 12A is extended down to a surface of the base support 22 by selectively etching the resin layer 18 (e.g., portion 18" shown in FIG. 16A). Each of these layers 18 and 22 is selected to have a different etching rate, and thus the base support 22 acts as an etch stop when etching the resin layer 18.

For the resin layer 18, etching may be performed with an anisotropic oxygen plasma. Any exposed areas of the resin layer 18 may be etched during this process, as indicated by the downward arrows in FIG. 16B. As mentioned, the base support 22 acts as an etch stop in the depression 12A when the resin layer portion 18" is removed. This etching process can be stopped when the base support 22 is exposed in the deep portion 78 of the depression 12A, and thus the entire resin layer 18 is not etched away (as depicted in FIG. 16B). Moreover, the depth (or thickness) of the step portion 82 can also be selected prior to imprinting so that the portion of the base support 22 underlying the step portion 82 is not exposed during this etching process. As such, the depth (or thickness) of the step portion 82 may be thicker than the depth (or thickness) of the resin layer portion 18" (FIG. 16A).

As shown in FIG. 16C, a first functionalized layer 20A is applied over the depression 12A, and thus on the exposed portion of the base support 22. The first functionalized layer 20A may be any of the examples disclosed herein and may be deposited using any of the techniques described herein.

The first functionalized layer 20A is then patterned to form a first functionalized region (region 84) covered by a photoresist 50. Any photoresist may be used. In other examples, a lift-off resist is used instead of a photoresist.

As shown in FIG. 16D, the photoresist 50 is first applied to the first functionalized layer 20A. The entire photoresist 50 may be developed to form an insoluble portion, so that it can be exposed to an etching process.

A timed dry etching process may then be used to remove portions of the photoresist 50 and the functionalized layer 20A from the resin layer 18, including from the shallow portion 80 and from a portion of the deep portion 78. As shown in FIG. 16E, the timed dry etching is stopped so that the first functionalized layer 20A and the photoresist 50 remain in the portion of the deep portion 78 that is next to the step portion 82. In one example, the timed dry etch may involve a reactive ion etch (e.g., with $CF_4$) where the photoresist 50 is etched at a rate of about 17 nm/min. In another example, the timed dry etch may involve a 100% $O_2$ plasma etch where the photoresist 50 is etched at a rate of about 98 nm/min.

During the etching of the photoresist 50, the functionalized layer 20A may also be removed. A combustion reaction may be taking place, where the functionalized layer 20A is converted to carbon dioxide and water and is evacuated from the etching chamber.

As depicted by the downward arrow in FIG. 16F, the resin layer 18 may then be etched again i) to create interstitial regions 26 that are at least substantially co-planar with the surface of the first functionalized layer 20A and the photoresist region 50 remaining in the portion of the deep portion 78, and ii) to create a second depression 12B next to the first functionalized layer 20A and the photoresist region 50 remaining in the portion of the deep portion 78. This is a dry etching process that is selected based on the material of the resin layer 18. This etching process is also timed. In one example, this timed dry etch may involve or with a 90% $CF_4$ and 10% $O_2$ where the resin layer 18 is etched at a rate of about 42 nm/min. In another example, the timed dry etch may involve a reactive ion etch (e.g., with $O_2$) where the in resin layer 18 is etched at a rate of about 4 nm/min. This process can also remove the first functionalized layer 20A that is not covered by the photoresist 50.

As shown in FIG. 16G, the functionalized layer 20B may then be applied using any suitable deposition technique. In this example, the functionalized layer 20B is deposited over the interstitial regions 26 and the photoresist 50. In this example, any suitable deposition technique may be used, in part because the first functionalized layer 20A is covered.

Removal of the photoresist 50 may then be performed. As shown in FIG. 16H, this process removes the photoresist 50 and the functionalized layer 20B that overlies the remaining photoresist 50. This removal process may be performed in dimethylsulfoxide (DMSO) using sonication, or in acetone, or with an NMP (N-methyl-2-pyrrolidone) based stripper, or any other suitable remover for the photoresist 50. This process also exposes the functionalized layer 20A, and thus the functionalized region 84.

In FIG. 16I, the functionalized layer 20B over the interstitial regions 26 is removed. This removal involves polishing the functionalized layer 20B from the interstitial regions 26 as described herein. This leaves a functionalized region 86 next to the functionalized region 84. FIG. 16I depicts the flow cell 10N.

In some examples, the primers 54, 56 or 54', 56' (not shown in FIG. 16A through FIG. 16I) may be pre-grafted to the functionalized layer 20A. Similarly, the primers 58, 60 or 58', 60' (not shown in FIG. 16A through FIG. 16I) may be pre-grafted to the second functionalized layer 20B. In these examples, additional primer grafting is not performed.

In other examples, the primers 54, 56 or 54', 56' are not pre-grafted to the functionalized layer 20A. In these examples, the primers 54, 56 or 54', 56' may be grafted after the functionalized layer 20A is applied (e.g., at FIG. 16C). In these examples, the primers 58, 60 or 58', 60' may be pre-grafted to the second functionalized layer 20B. Alternatively, in these examples, the primers 58, 60 or 58', 60' may not be pre-grafted to the second functionalized layer 20B. Rather, the primers 58, 60 or 58', 60' may be grafted after the second functionalized layer 20B is applied (e.g., at FIG. 16G, 16H, or 16I), as long as i) the functionalized layer 20B has different functional groups (than functionalized layer 20A) for attaching the primers 58, 60 or 58', 60' or ii) any unreacted functional groups of the functionalized layer 20A have been quenched, e.g., using the Staudinger reduction to amines or additional click reaction with a passive molecule such as hexynoic acid.

When grafting is performed during the method, grafting may be accomplished using any suitable grafting techniques, such as those disclosed herein. With any of the grafting methods, the primers 54, 56 or 54', 56' react with reactive groups of the functionalized layer 20A or the primers 58, 60 or 58', 60' react with reactive groups of the functionalized layer 20B, and have no affinity for the single layer substrate 68.

In this example of the flow cell 10N, the functionalized regions 84, 86 are confined within a depression including portions of 12A and 12B (like in flow cell 10H). In an array, respective regions 84, 86 within a depression may be isolated from respective regions 84, 86 within another depression by adjacent interstitial regions 26.

To further illustrate the present disclosure, an example is given herein. It is to be understood that this example is provided for illustrative purposes and is not to be construed as limiting the scope of the present disclosure.

Non-Limiting Working Example

An example of the method described in reference to FIG. 12A through FIG. 12H was used to deposit PAZAM grafted with P5 primers and PAZAM grafted with P7 primers to form isolated pairs of patches/pads (where each pair was similar to the patches/pad 46A, 46B shown in FIG. 12H).

In this example, glass was used as the base support, and a multi-layer stack positioned over the glass. The multi-layer stack included a first layer of a nanoimprint lithography resin, an aluminum sacrificial layer, a poly(methyl methacrylate) lift-off layer, and a second layer of the nanoimprint lithography resin.

A working stamp was used to pattern the second layer of the nanoimprint lithography resin similarly to that shown in FIG. 12A. The respective layers were selectively removed (in a manner similar to that shown in FIG. 12B through 12D) using an anisotropic oxygen plasma (for the first and second layers of the nanoimprint lithography resin), $CF_4/O_2$ plasma etching (for the poly(methyl methacrylate) lift-off layer), and a diluted KOH based photoresist developer (for the aluminum sacrificial layer). These processes formed several isolated depressions, each of which was similar to depression 12 shown in FIG. 12D.

PAZAM was then deposited. All of the depressions were coated, along with any exposed portions of layers of the multi-layer stack. P5 primers were then grafted to the PAZAM. Any unreacted azides were quenched by grafting hexynoic acid.

Selective etching (with KOH) was performed to remove the aluminum sacrificial layer at areas adjacent to the PAZAM (grafted with P5 primers) in the depressions. This exposed an area of the glass directly adjacent to the PAZAM (grafted with P5 primers) patches/pads.

PAZAM was then deposited under high ionic strength (e.g., in the presence of 10×PBS). This formed patches/pads of PAZAM adjacent to the PAZAM grafted with P5 primers in the depressions. P7 primers were then grafted to the newly PAZAM. The quenched azides on the PAZAM grafted with P5 primers kept the P7 primers from grafting thereto.

The remaining poly(methyl methacrylate) lift-off layer was then lifted off using acetone. The removal of the poly(methyl methacrylate) lift-off layer also removed the PAZAM (grafted with P5 primers) positioned thereon, and exposed any remaining portions of the aluminum sacrificial layer that was adjacent to the patches/pads. The remaining aluminum sacrificial layer was removed using the KOH etching process.

Oligonucleotides complementary to each of P5 and P7 were then introduced into to the glass substrate with the pads/patches formed thereon. The complementary P5 oligos (P5') had Alexa Fluor™ 488 dyes (from Thermo Fisher Scientific) attached thereto and the complementary P7 oligos (P7') had Alexa Fluor™ 647 dyes (from Thermo Fisher Scientific) attached thereto. The respective oligos were hybridized to the respective primers. The surface was exposed to a 488 nm laser and a micrograph image was taken. This image is shown in black and white in FIG. 17A. The surface was then exposed to 647 nm laser and a micrograph image was taken. This image is shown in black and white in FIG. 17B.

Figure 17A:
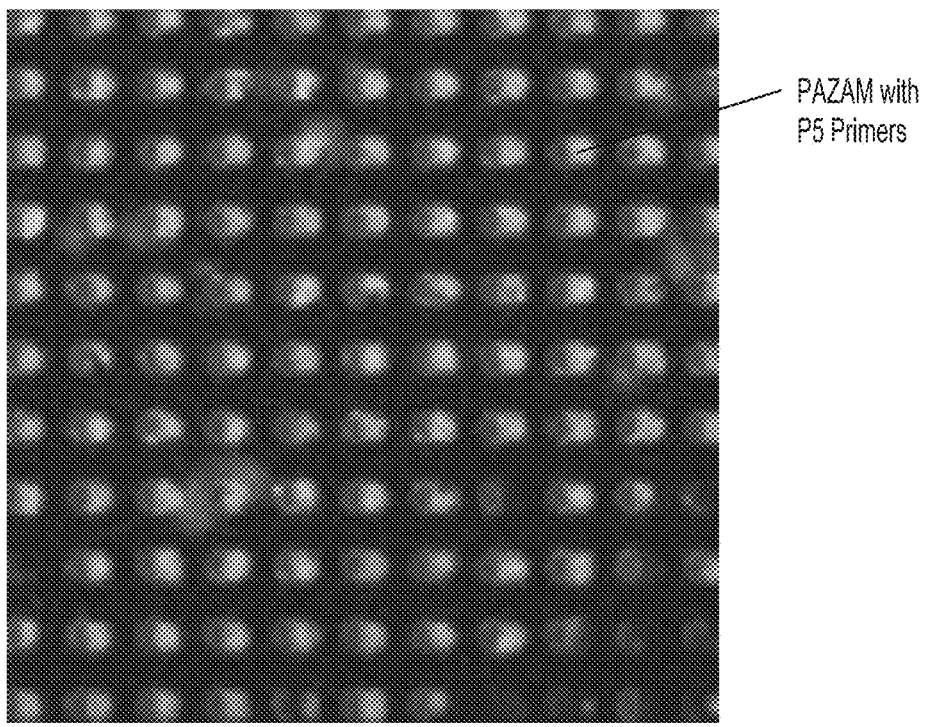
FIG. 17A and FIG. 17B are black and white reproductions of originally colored photographs depicting examples of polymeric hydrogels deposited in accordance with an example disclosed herein to form adjacent patches/pads.
Figure 17B:
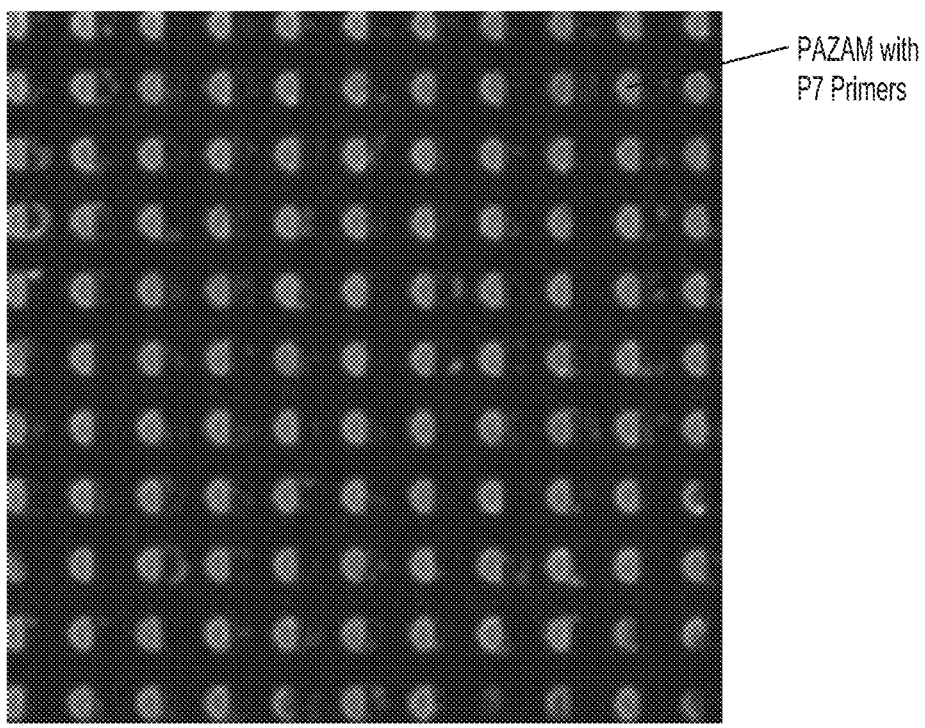

The grey areas in each of FIG. 17A and FIG. 17B represent the respective hydrogel patches/pads. In FIG. 17A, the Alexa Fluor™ 488 dyes (from Thermo Fisher Scientific) were excited. The grey areas in FIG. 17A (which were green in the original image) correspond with patches/pads of the PAZAM grafted with P5 primers (having the Alexa Fluor™ 488 dye-labeled oligos hybridized thereto). In FIG. 17B, the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

While several examples have been described in detail, it is to be understood that the disclosed examples may be modified. Therefore, the foregoing description is to be considered non-limiting.

SEQUENCE LISTING

```
<160> NUMBER OF SEQ ID NOS: 2

<210> SEQ ID NO 1
<211> LENGTH: 20
<212> TYPE: DNA
<213> ORGANISM: Artificial Sequence
<220> FEATURE:
<223> OTHER INFORMATION: synthesized

<400> SEQUENCE: 1
aatgatacgg cgaccaccga                                           20

<210> SEQ ID NO 2
<211> LENGTH: 21
<212> TYPE: DNA
<213> ORGANISM: Artificial Sequence
<220> FEATURE:
<223> OTHER INFORMATION: synthesized

<400> SEQUENCE: 2
caagcagaag acggcatacg a                                         21
```

Alexa Fluor™ 647 dyes (from Thermo Fisher Scientific) were excited. The grey areas in FIG. 17B (which were purple in the original image) correspond with patches/pads of the PAZAM grafted with P7 primers (having the Alexa Fluor™ 647 dye-labeled oligos hybridized thereto).

The images in FIG. 17A and FIG. 17B show that the method resulted in the formation of isolated patches/pads, where within each patch/pad, the PAZAM grafted with P5 primers was positioned on the right side and the PAZAM grafted with P7 primers was positioned on the left side. These methods can be used to selectively position different primer sets, which may be particularly suitable for simultaneous paired-end sequencing.

ADDITIONAL NOTES

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the

What is claimed is:

1. A method, comprising:
   defining a depression in a multi-layer stack including a hydrophobic layer over a resin layer by: imprinting through a depth of the hydrophobic layer and through a portion of a depth of the resin layer using a working stamp;
   applying a sacrificial layer over a first portion of the depression, whereby a second portion of the depression is exposed;
   applying a functionalized layer over the sacrificial layer and over the second portion of the depression;
   removing the sacrificial layer to expose the first portion of the depression; and
   applying a second functionalized layer over the first portion of the depression.

2. The method as defined in claim 1, wherein the resin layer includes a resin selected from the group consisting of a polyhedral oligomeric silsesquioxane-based resin, an epoxy resin, a poly(ethylene glycol) resin, a polyether resin, an acrylic resin, an acrylate resin, a methacrylate resin, and combinations thereof.

3. The method as defined in claim 1, wherein the hydrophobic layer includes a fluorinated polymer, a perfluorinated polymer, a silicon polymer, or a mixture thereof.

4. A method, comprising:
defining a depression in a resin layer of a substrate by:
applying a photoresist to the resin layer;
developing the photoresist to define a depression pattern where soluble photoresist is removed and an interstitial pattern where insoluble photoresist remains over the resin layer;
etching the resin layer at the depression pattern; and
removing the insoluble photoresist;
applying a sacrificial layer over a first portion of the depression, whereby a second portion of the depression remains exposed;
applying a first functionalized layer over the sacrificial layer and over the second portion of the depression;
removing the sacrificial layer and the first functionalized layer applied thereon, thereby exposing the first portion of the depression;
applying a second functionalized layer over the second portion of the depression; and
attaching respective primers sets to the first and second functionalized layers.

5. The method as defined in claim 4, wherein:
the substrate includes the resin layer over a base support; and
the depression is defined through a portion of the resin layer.

6. A method, comprising:
imprinting a resin layer to form a concave region including a deep portion, and a shallow portion defined by a step portion, wherein the resin layer is positioned over a multi-layer stack including at least two layers having differential etching rates, which is positioned over a base support;
selectively etching the resin layer and the at least two layers to form a depression adjacent to the deep portion;
applying a first functionalized layer to the depression;
selectively etching the resin layer, the at least two layers, or combinations thereof to expose a region underlying the step portion; and
applying a second functionalized layer to the exposed region.

7. The method as defined in claim 6, wherein the at least two layers include a sacrificial layer that is positioned over an additional resin layer.

8. The method as defined in claim 7, wherein the selectively etching to form the depression involves:
etching a first portion of the resin layer underlying the deep portion;
etching a portion of the sacrificial layer underlying the deep portion, thereby exposing a portion of the additional resin layer; and
etching i) a second portion of the resin layer to expose an other portion of the sacrificial layer and ii) the exposed portion of the additional resin layer.

9. The method as defined in claim 8, wherein the selectively etching to expose a region underlying the step portion involves etching a second portion of the sacrificial layer to expose a second portion of the additional resin layer.

10. The method as defined in claim 9, wherein the second functionalized layer is applied to the second portion of the additional resin layer and the method further comprising etching a remaining portion of the sacrificial layer.

11. The method as defined in claim 6, wherein the at least two layers include a poly(methyl methacrylate) lift-off layer that is positioned over a sacrificial layer.

12. The method as defined in claim 11, wherein the selectively etching to form the depression involves:
etching a first portion of the resin layer underlying the deep portion;
etching a portion of the poly(methyl methacrylate) lift-off layer underlying the deep portion; and
etching a portion of the sacrificial layer underlying the deep portion, thereby forming the depression in the sacrificial layer.

13. The method as defined in claim 12, wherein the region underlying the step portion is a portion of the base support, and wherein selectively etching to expose the region underlying the step portion involves:
etching the step portion of the resin layer;
etching a second portion of the poly(methyl methacrylate) lift-off layer underlying the step portion; and
etching a second portion of the sacrificial layer underlying the step portion.

14. The method as defined in claim 13, wherein the second functionalized layer is applied to the portion of the base support, and wherein the method further comprises:
lifting off a remaining portion of the poly(methyl methacrylate) lift-off layer; and
etching a remaining portion of the sacrificial layer.

15. The method as defined in claim 6, wherein the at least two layers include a poly(methyl methacrylate) lift-off layer that is positioned over a sacrificial layer that is positioned over an additional resin layer.

16. The method as defined in claim 15, wherein the selectively etching to form the depression involves:
etching a first portion of the resin layer underlying the deep portion;
etching a portion of the poly(methyl methacrylate) lift-off layer underlying the deep portion; and
etching a portion of the sacrificial layer underlying the deep portion, thereby forming the depression in the sacrificial layer.

17. The method as defined in claim 16, wherein prior to etching the portion of the sacrificial layer underlying the deep portion, the method further comprises etching the resin layer to remove the step portion and expose a second portion of the poly(methyl methacrylate) lift-off layer.

18. The method as defined in claim 17, wherein the region underlying the step portion is a portion of the additional resin layer, and wherein selectively etching to expose the region underlying the step portion involves:
etching the second portion of the poly(methyl methacrylate) lift-off layer; and
etching a second portion of the sacrificial layer underlying the second portion of the poly(methyl methacrylate) lift-off layer.

19. The method as defined in claim 18, wherein the second functionalized layer is applied to the portion of the additional resin layer, and wherein the method further comprises:
lifting off a remaining portion of the poly(methyl methacrylate) lift-off layer; and
etching a remaining portion of the sacrificial layer.

20. A method, comprising:
applying a first functionalized layer over a substrate including a concave region having a deep portion, and a shallow portion defined by a step portion;

patterning the first functionalized layer, thereby forming a first functionalized region covered by a photoresist in the deep portion adjacent to the step portion;

dry etching the substrate to remove the step portion and form a depression adjacent to the functionalized region; and applying a second functionalized layer over the substrate and the photoresist.

21. The method as defined in claim 20, wherein after the second functionalized layer is applied, the method further comprises:

lifting off the photoresist and the second functionalized layer thereon; and removing a portion of the second functionalized layer, thereby forming a second functionalized region adjacent to the first functionalized region.

22. The method as defined in claim 20, wherein patterning the first functionalized layer involves:

applying the photoresist over the first functionalized layer; and dry etching the photoresist and the first functionalized layer until the step portion is exposed.

23. The method as defined in claim 22, wherein the dry etching of the substrate or the dry etching of the photoresist involves reactive ion etching.

24. The method as defined in claim 22, wherein the dry etching of the photoresist and the first functionalized layer involves a reactive ion etch with $CF_4$ where the photoresist is etched at a rate of about 17 nm/min.

25. The method as defined in claim 22, wherein the dry etching of the photoresist and the first functionalized layer involves a 100% plasma etch where the photoresist is etched at a rate of about 98 nm/min.

26. The method as defined in claim 20, wherein:

the substrate is a multi-layer stack including a resin layer over a base support;

prior to applying the first functionalized layer, the method further comprises:

imprinting the resin layer to form the concave region; and selectively etching the resin layer to expose the base support at the deep portion;

drying etching of the substrate involves dry etching the resin layer; and the base support functions as an etch step during the dry etching.

27. The method as defined in claim 26, wherein after the second functionalized layer is applied, the method further comprises:

lifting off the photoresist and the second functionalized layer thereon; and removing a portion of the second functionalized layer, thereby forming a second functionalized region adjacent to the first functionalized region.

28. The method as defined in claim 26, wherein patterning the first functionalized layer involves:

applying the photoresist over the first functionalized layer; and dry etching the photoresist and the first functionalized layer until the step portion is exposed.

29. The method as defined in claim 20, further comprising:

lifting off the photoresist and the second functionalized layer thereon; and removing a portion of the second functionalized layer, thereby forming a second functionalized region on the step portion.

30. A method, comprising:

imprinting an additional resin layer to form a concave region therein, wherein the additional resin layer is positioned over a poly(methyl methacrylate) lift-off layer that is positioned over a first resin layer;

exposing a portion of the first resin layer underlying the concave region by etching a first portion of the additional resin layer and a first portion of the poly(methyl methacrylate) lift-off layer;

etching i) the additional resin layer to expose a second portion of the poly(methyl methacrylate) lift-off layer and ii) the exposed portion of the first resin layer to form a depression in the first resin layer;

applying a functionalized layer over the depression and the second portion of the poly(methyl methacrylate) lift-off layer; and removing the second portion of the poly(methyl methacrylate) lift-off layer and the functionalized layer thereon.

31. A method, comprising:

imprinting a resin layer to form a convex region, wherein the resin layer is positioned over a multi-layer stack including a lift-off resist over a functionalized layer over a substrate;

selectively etching portions of the resin layer, the lift-off resist, and the functionalized layer to expose portions of the substrate, whereby other portions of the lift-off resist and the functionalized layer that are adjacent to the convex region remain intact; and lifting off the other portion of the lift-off resist.

32. The method as defined in claim 31, wherein the substrate includes a base support and an additional resin layer over the base support.

33. A method, comprising:

imprinting a resin to form a convex region, wherein the resin is positioned over a multi-layer stack including a sacrificial layer over a substrate;

selectively etching portions of the resin and the sacrificial layer around the convex region to expose a portion of the substrate;

patterning a photoresist to cover the exposed portion of the substrate;

exposing a second portion of the substrate underlying the sacrificial layer;

applying a functionalized layer over the exposed second portion of the substrate; and lifting off the photoresist.

34. The method as defined in claim 33, wherein the substrate includes an additional resin layer over a base support.

35. The method as defined in claim 34, wherein the selectively etching further involves selectively etching through a portion of a depth of the additional resin layer to form a protrusion in the additional resin layer having a shape of the convex region.

36. The method as defined in claim 34, wherein the selectively etching exposes a surface of the additional resin layer.

\* \* \* \* \*